(12) United States Patent
Nakafuji et al.

(10) Patent No.: US 10,053,539 B2
(45) Date of Patent: Aug. 21, 2018

(54) COMPOSITION FOR FILM FORMATION, FILM, PRODUCTION METHOD OF PATTERNED SUBSTRATE, AND COMPOUND

(71) Applicant: JSR Corporation, Minato-ku (JP)

(72) Inventors: Shin-ya Nakafuji, Tokyo (JP); Goji Wakamatsu, Tokyo (JP); Tsubasa Abe, Tokyo (JP); Kazunori Sakai, Tokyo (JP)

(73) Assignee: JSR Corporation, Minato-ku (JP)

( * ) Notice: Subject to any disclaimer, the term of this patent is extended or adjusted under 35 U.S.C. 154(b) by 22 days.

(21) Appl. No.: 14/955,473

(22) Filed: Dec. 1, 2015

(65) Prior Publication Data

US 2017/0154782 A1 Jun. 1, 2017
US 2018/0114698 A2 Apr. 26, 2018

(51) Int. Cl.
*H01L 21/308* (2006.01)
*H01L 21/027* (2006.01)
*H01L 21/306* (2006.01)
*C08G 65/40* (2006.01)

(52) U.S. Cl.
CPC ......... *C08G 65/4043* (2013.01); *C08G 65/40* (2013.01); *C08G 65/4031* (2013.01); *H01L 21/0271* (2013.01)

(58) Field of Classification Search
None
See application file for complete search history.

(56) References Cited

U.S. PATENT DOCUMENTS

| | | | | |
|---|---|---|---|---|
| 2002/0177743 A1* | 11/2002 | Dahl | | C07C 7/12 585/16 |
| 2006/0019195 A1* | 1/2006 | Hatakeyama | | G03F 7/091 430/271.1 |
| 2012/0329939 A1* | 12/2012 | Peters | | C08G 65/48 524/505 |
| 2014/0242505 A1* | 8/2014 | Yamaguchi | | G03F 7/038 430/18 |
| 2016/0314984 A1* | 10/2016 | Matsumura | | G03F 7/11 |

FOREIGN PATENT DOCUMENTS

| | | |
|---|---|---|
| JP | 5-238990 | 9/1993 |
| JP | H09-090624 A | 4/1997 |
| JP | H09-090625 A | 4/1997 |
| JP | 2005-128509 A | 5/2005 |
| JP | 2006-058427 A | 3/2006 |
| JP | 2006-063236 A | 3/2006 |
| JP | 2012-214720 | 11/2012 |
| WO | WO 2010/055852 A1 | 5/2010 |
| WO | WO 2011/021555 A1 | 2/2011 |
| WO | WO 2012/077640 A1 | 6/2012 |

OTHER PUBLICATIONS

Qun-Sheng Guo, et al., "A facile synthesis of 3 or 3,3'-substituted binaphthols and their applications in the asymmetric addition of diethylzinc to aldehydes", Journal of Organometallic Chemistry, 2006, vol. 691,#6, pp. 1282-1287.

Yasmeen Badar, et al., "Optical Activity in the 1,1'-Binaphthyl Series. Optically Actiove 8,8'-Dimethyl-1,1'-binaphthyl", Journal of the Chemical Society, 1965, pp. 1412-1418.

Jen-Chieh Hsieh, et al., "O-Dihaloarenes as aryne precursors for nickel-catalyzed [2 + 2 + 2] cycloaddition with alkynes and nitrites", Chemical Communications, The Royal Society of Chemistry, 2008,#26 pp. 2992-2994.

R.G.R, Bacon, et al., "Cyclisations with Hydrazine. Part III.[1] Syntheses of Pentaphene and Dinaphtho[2,1-*d* : 1',2'-*f* ][1,2] diazocine", Journal of the Chemical Society,1963, pp. 839-845.

Katsuhisa Mizoguchi, et al., Negative-Working Photosensitive Poly(phenylene ether) Based on Poly(2,6-dimethyl-1,4-phenylene ether), a Cross-Linker, and a Photoacid Generator, Macromolecules 2010, vol. 43, pp. 2832-2839.

Katsuhisa Mizoguchi, et al., "Direct Patterning of Poly(ether ether sulfone) Using a Cross-linker and a Photoacid Generator", Polymer Journal, The Society of Polymer Science, 2008.

Katsuhisa Mizoguchi, et al. "Negative-Type Photosensitive Poly(phenylene ether) Based on Poly(2,6-dimethyl-1,4-phenylene ether), a Crosslinker, and a Photoacid Generator", Journal of Polymer Science: Part A, Polymer Chemistry, 2008, vol. 46, pp. 4949-4958.

(Continued)

*Primary Examiner* — Angel Roman
(74) *Attorney, Agent, or Firm* — Oblon, McClelland, Maier & Neustadt, L.L.P.

(57) ABSTRACT

A composition comprises a compound comprising a partial structure represented by formula (1) and comprising an intermolecular bond-forming group; and a solvent. $X^1$ and $X^2$ each independently represent a substituted or unsubstituted ring structure having 4 to 10 ring atoms constituted taken together with a spiro carbon atom and carbon atoms of an aromatic ring. $R^1$ and $R^2$ each independently represent a halogen atom, a hydroxy group, a nitro group or a monovalent organic group. a1 and a2 are each independently an integer of 0 to 8. n1 and n2 are each independently an integer of 0 to 2; k1 and k2 are each independently an integer of 0 to 8. A sum of k1 and k2 is no less than 1, and a sum of a1 and k1. A sum of a2 and k2 are no greater than 8.

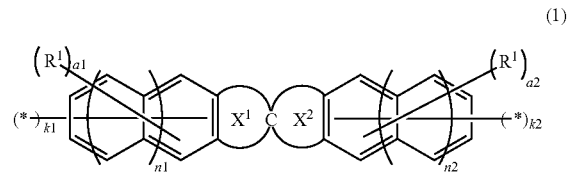

(1)

14 Claims, No Drawings

(56) References Cited

OTHER PUBLICATIONS

Office Action dated Sep. 26, 2017 in Japanese Patent Application No. 2014-170881 (w/ Computer-generated English translation).

* cited by examiner

COMPOSITION FOR FILM FORMATION, FILM, PRODUCTION METHOD OF PATTERNED SUBSTRATE, AND COMPOUND

BACKGROUND OF THE INVENTION

Field of Invention

The present invention relates to a composition for film formation, a film, a production method of a patterned substrate, and a compound.

Description of the Related Art

In manufacturing semiconductor devices, multilayer resist processes have been employed for attaining a high degree of integration. In these processes, a composition for forming a resist underlayer film is first coated on a substrate to provide a resist underlayer film, and then a resist composition is coated on the resist underlayer film to provide a resist film. Then, a resist film is exposed through a mask pattern or the like, and developed with an appropriate developer solution to form a resist pattern. Subsequently, the resist underlayer film is dry-etched using the resist pattern as a mask, and the substrate is further dry-etched using the resultant resist underlayer film pattern as a mask, thereby enabling a desired pattern to be formed on the substrate. The resist underlayer film for use in such a multilayer resist process requires to have optical characteristics such as a favorable refractive index and extinction coefficient, and general characteristics such as etching resistance.

The multilayer resist processes involving a procedure of forming a hard mask as an intermediate layer on the resist underlayer film has been studied recently. Specifically, since an inorganic hard mask is formed on a resist underlayer film using CVD techniques according to this procedure, particularly in a case where a nitride inorganic hard mask is formed, the temperature is elevated to be as high as at least 300° C. and typically no less than 400° C., and thus, the resist underlayer film is required to have superior heat resistance. When the heat resistance is insufficient, a component in the resist underlayer film may be sublimated and the sublimated component may adhere to the substrate again, resulting in a disadvantage of a decrease in yields of the production of semiconductor devices.

Still further, patterns are more frequently formed recently on a substrate having a plurality of types of trenches, particularly trenches having aspect ratios that differ from each other, the resist underlayer film formed is desired to have these trenches sufficiently embedded thereinto, and also have superior flatness.

To meet these demands, structures of compounds, etc., to be contained in a composition have been extensively studied (see, Japanese Unexamined Patent Application, Publication No. 2012-214720, and PCT International Publication Nos. 2012/077640, 2011/021555 and 2010/055852). However, it has been still impossible to sufficiently meet the demands described above, according to the conventional compositions described above.

PRIOR ART DOCUMENTS

Patent Documents

Patent Document 1: Japanese Unexamined Patent Application, Publication No. 2012-214720
Patent Document 2: PCT International Publication No. 2012/077640
Patent Document 3: PCT International Publication No. 2011/021555
Patent Document 4: PCT International Publication No. 2010/055852

SUMMARY OF THE INVENTION

Problems to be Solved by the Invention

The present invention was made in view of the foregoing circumstances, and it is an object of the present invention to provide a composition for film formation capable of forming a film having superior solubility in a solvent such as PGMEA, and having superior heat resistance and flatness while general characteristics such as etching resistance are satisfactory.

Means for Solving the Problems

An invention made for solving the aforementioned problems is a composition for film formation containing:

a compound (hereinafter, may be also referred to as "(A) compound" or "compound (A)") having a partial structure represented by the following formula (1) (hereinafter, may be also referred to as "partial structure (I)") and having an intermolecular bond-forming group (hereinafter, may be also referred to as "intermolecular bond-forming group (a)"); and a solvent (hereinafter, may be also referred to as "(B) solvent" or "solvent (B)"),

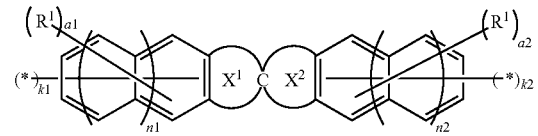

(1)

wherein, in the formula (1), $X^1$ and $X^2$ each independently represent a substituted or unsubstituted cyclic structure having 4 to 10 ring atoms constituted taken together with a spiro carbon atom and carbon atoms of an aromatic ring; $R^1$ and $R^2$ each independently represent a halogen atom, a hydroxy group, a nitro group or a monovalent organic group; a1 and a2 are each independently an integer of 0 to 8, wherein in a case where $R^1$ and $R^2$ are each present in a plurality of number, a plurality of $R^1$s may be each identical or different, and a plurality of $R^2$s may be each identical or different; n1 and n2 are each independently an integer of 0 to 2; k1 and k2 are each independently an integer of 0 to 8, wherein the sum of k1 and k2 is no less than 1, and the sum of a1 and k1, and the sum of a2 and k2 are no greater than 8; and * denotes a binding site to a moiety other than the partial structure.

Another invention made for solving the aforementioned problems is a film formed from the composition for film formation.

Still another invention made for solving the aforementioned problems is a method for producing a patterned substrate including: the step of forming a resist underlayer film on the upper face side of a substrate (hereinafter, may be also referred to as "resist underlayer film-forming step"); the step of forming a resist pattern directly or indirectly on the resist underlayer film (hereinafter, may be also referred to as "resist pattern-forming step"), and the step of etching at least the resist underlayer film and the substrate using the resist pattern as a mask such that the substrate has a pattern (hereinafter, may be also referred to as "substrate pattern-forming step"), wherein the resist underlayer film is formed from the composition for film formation described above.

Yet another invention made for solving the aforementioned problems is a compound having the partial structure (I), and the intermolecular bond-forming group (a).

As referred to herein, the term "hydrocarbon group" may include a chain hydrocarbon group, an alicyclic hydrocarbon group and an aromatic hydrocarbon group. The "hydrocarbon group" may be either a saturated hydrocarbon group, or an unsaturated hydrocarbon group. The "chain hydrocarbon group" as referred to means a hydrocarbon group not including a ring structure but constructed with only a chain structure. The "chain hydrocarbon group" may involve both a straight chain hydrocarbon group and a branched hydrocarbon group. The "alicyclic hydrocarbon group" as referred to means a hydrocarbon group which includes not an aromatic ring structure but only an alicyclic structure as the ring structure, and both a monocyclic alicyclic hydrocarbon group and a polycyclic alicyclic hydrocarbon group may be involved. However, it is not necessary to be constructed with only an alicyclic structure, and a chain structure may be included as a part thereof. The term "aromatic hydrocarbon group" as referred to means a hydrocarbon group which includes an aromatic ring structure as the ring structure. However, it is not necessary to be constructed with only an aromatic ring structure, and a chain structure and/or an alicyclic structure may be included as a part thereof.

Moreover, the term "organic group" as referred to means a group which includes at least one carbon atom.

Effects of the Invention

The composition for film formation according to the present invention is capable of forming a film having superior solubility in a solvent such as PGMEA, and having superior heat resistance and flatness while general characteristics such as etching resistance are satisfactory since the composition contains a compound having a given partial structure and a given intermolecular bond-forming group. The film is superior in heat resistance and flatness. The method for producing a patterned substrate enables a resist underlayer film that is superior in heat resistance and flatness to be readily formed, and enables a favorable pattern to be formed on a substrate using the resist underlayer film having such superior characteristics. The compound can be suitably used as a component of the composition for film formation. Therefore, these can be suitably used for manufacture of semiconductor devices and the like in which further progress of miniaturization is expected in the future.

DESCRIPTION OF EMBODIMENTS

Composition for Film Formation

The composition for film formation contains (A) a compound and (B) a solvent. The composition for film formation may contain as a favorable component, (C) an acid generating agent and (D) a crosslinking agent, and may also contain other optional component within a range not leading to impairment of the effects of the present invention. Hereinafter, each component will be described.

(A) Compound

The compound (A) has the partial structure (I), and also has the intermolecular bond-forming group (a). Since the composition for film formation contains the compound (A), formation of a film that is superior in heat resistance and flatness is enabled while general characteristics such as etching resistance are maintained. Although the reason for achieving the aforementioned effects owing to the composition for film formation having the aforementioned constitution is not necessarily clear, for example, the reason may be inferred as follows. The compound (A) has the partial structure (I) and the intermolecular bond-forming group (a), and this partial structure (I) has a specific structure as represented by the above formula (1), in which the ring structures $X^1$ and $X^2$ sharing a spiro carbon atom are each fused with the aromatic ring. The film formed from the composition for film formation is believed to achieve the superior heat resistance resulting from having the aforementioned specific structure and a molecular binding structure formed from the aforementioned intermolecular bond-forming group (a). Moreover, in addition to the compound (A) having the aforementioned specific structure, the film is formed from the composition for film formation through the molecular binding structure formed by means of the intermolecular bond-forming group (a); therefore, it is considered that trenches can be sufficiently embedded, formation of a film that is superior in flatness is enabled.

Partial Structure (I)

The partial structure (I) is represented by the following formula (1).

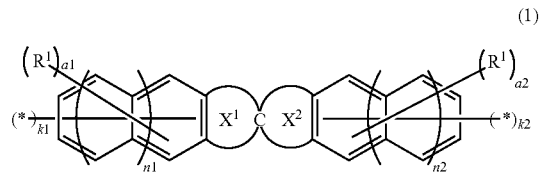

(1)

In the above formula (1), $X^1$ and $X^2$ each independently represent a substituted or unsubstituted ring structure having 4 to 10 ring atoms constituted taken together with a Spiro carbon atom and carbon atoms of an aromatic ring; $R^1$ and $R^2$ each independently represent a halogen atom, a hydroxy group, a nitro group or a monovalent organic group; a1 and a2 are each independently an integer of 0 to 8, wherein in a case where $R^1$ and $R^2$ are each present in a plurality of number, a plurality of $R^1$s may be each identical or different, and a plurality of $R^2$s may be each identical or different; n1 and n2 are each independently an integer of 0 to 2; k1 and k2 are each independently an integer of 0 to 8, wherein the sum of k1 and k2 is no less than 1, and the sum of a1 and k1, and the sum of a2 and k2 are no greater than 8; and * denotes a binding site to a moiety other than the partial structure.

The ring structures represented by $X^1$ and $X^2$ are not particularly limited as long as they have the structure described above, and may be: an alicyclic structure; a ring structure having a double bond between ring-constructing carbon atoms; or a ring structure containing a part of an aromatic ring other than the aromatic ring represented in the above formula (1), and these may include a hetero atom other than the carbon atom as a ring-constructing atom, or may have a substituent binding to the ring-constructing atom. Also, the ring structures represented by $X^1$ and $X^2$ may be the same or different, and in light of further enhancement of the heat resistance of the film, and also in light of ease in synthesis of the compound that provides the partial structure (I), the ring structures represented by $X^1$ and $X^2$ are preferably the same.

The number of ring atoms of the ring structure is, in light of further enhancement of the heat resistance of the formed film, preferably no less than 4 and no greater than 8, more preferably 5 and 6, and still more preferably 5.

Examples of the substituent that the ring structure may have include monovalent substituents e.g.,:

hydrocarbon groups including chain hydrocarbon groups exemplified by alkyl groups such as a methyl group, an ethyl group, a propyl group and a butyl group, alkenyl groups such as an ethenyl group and a propenyl group, and alkynyl groups such as an ethynyl group and a propynyl group;

alicyclic hydrocarbon groups exemplified by cycloalkyl groups such as a cyclopropyl group, a cyclobutyl group, a cyclopentyl group, a cyclohexyl group, a norbornyl group and an adamantyl group, and cycloalkenyl groups such as a cyclopentenyl group, a cyclohexenyl group and a norbornenyl group; and aromatic hydrocarbon groups exemplified by aryl groups such as a phenyl group, a tolyl group, a xylyl group, a naphthyl group and an anthryl group, aralkyl groups such as a benzyl group, a phenethyl group and a naphthylmethyl group;

oxyhydrocarbon groups such as a methoxy group, an ethoxy group, a propoxy group, a phenoxy group and a naphthyloxy group;

carbonyloxy hydrocarbon groups such as a methoxycarbonyl group and a phenoxycarbonyl group;

acyl groups such as a formyl group, an acetyl group, a propionyl group and a benzoyl group;

acyloxy groups such as an acetyloxy group, a propionyloxy group and a benzoyloxy group;

halogen atoms such as a fluorine atom, a chlorine atom, a bromine atom and an iodine atom;

a cyano group, a nitro group and a formyl group, and the like, divalent substituents e.g.,:

hydrocarbon groups including chain hydrocarbon groups such as a methylidene group, an ethylidene group and a propylidene group;

alicyclic hydrocarbon groups such as a cyclopropylidene group, a cyclobutylidene group, a cyclopentylidene group, a cyclohexylidene group and a norbornylidene group; and aromatic hydrocarbon groups such as a benzylidene group, a phenethylidene group, a naphthylmethylidene group and a fluorenylidene group;

a keto group (=O), and the like.

Among these substituents, the monovalent substituent is preferably a hydrocarbon group, more preferably a chain hydrocarbon group and an aromatic hydrocarbon group, still more preferably an alkyl group and an aryl group, particularly preferably a methyl group, an ethyl group and a phenyl group, and further particularly preferably a methyl group.

The divalent substituent is preferably a hydrocarbon group and a keto group, more preferably an aromatic hydrocarbon group and a keto group, and still more preferably a fluorenylidene group and a keto group.

Examples of the hetero atom which may be included in the ring structure include an oxygen atom, a nitrogen atom, a sulfur atom, and the like. Of these, in light of further enhancement of the heat resistance of the film, an oxygen atom is preferred. The number of the hetero atom which may be included in the ring structure is preferably 1 and 2, and more preferably 1.

The ring structure represented by $X^1$ and $X^2$ is exemplified by ring structures represented by the following formulae (1-1) to (1-3), and the like.

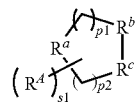

(1-1)

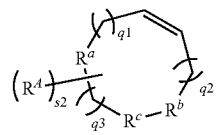

(1-2)

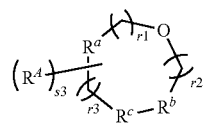

(1-3)

In the above formulae (1-1) to (1-3), $R^a$ represents a Spiro carbon atom shared by both the ring structures of $X^1$ and $X^2$; $R^b$ and $R^c$ represent two carbon atoms shared by the aromatic ring and the ring structures of $X^1$ or $X^2$; $R^A$ represents a monovalent group that substitutes for a hydrogen atom binding to the carbon atom constructing the ring structure, or $R^A$s taken together represent a divalent group together with the carbon atom to which $R^A$s bond, wherein in a case where $R^A$ is present in a plurality of number, a plurality of $R^A$s may be the same or different.

In the above formula (1-1), p1 and p2 are each independently an integer of 0 to 4, wherein the sum of p1 and p2 is no less than 1 and no greater than 7; and s1 is an integer of 0 to 14.

In the above formula (1-2), q1, q2 and q3 are each independently, an integer of 0 to 4, wherein the sum of q1, q2 and q3 is no less than 0 and no greater than 5; and s2 is an integer of 0 to 14.

In the above formula (1-3), r1, r2 and r3 are each independently an integer of 0 to 4, wherein the sum of r1, r2 and r3 is no less than 0 and no greater than 6; and s3 is an integer of 0 to 14.

In the above formula (1-1), p1 is preferably an integer of 0 to 2, more preferably 0 and 1, and still more preferably 0, and p2 is preferably an integer of 0 to 3, more preferably 1 and 2, and still more preferably 2. The sum of p1 and p2 is preferably no less than 1 and no greater than 4, more preferably 2 and 3, and still more preferably 2. In the above formula (1-1), s1 is preferably an integer of 0 to 4, more preferably an integer of 0 to 2, and still more preferably 2.

In the above formula (1-2), q1 is preferably an integer of 0 to 2, more preferably 0 and 1, and still more preferably 0, q2 is preferably an integer of 0 to 2, more preferably 0 and 1, and still more preferably 0, and q3 is preferably an integer of 0 to 2, more preferably 0 and 1, and still more preferably 0. The sum of q1, q2 and q3 is preferably no less than 0 and no greater than 2, more preferably 0 and 1, and still more preferably 0. In the above formula (1-2), s2 is preferably an integer of 0 to 4, more preferably an integer of 0 to 2, and still more preferably 1.

In the above formula (1-3), r1 is preferably an integer of 0 to 2, more preferably 0 and 1, and still more preferably 0, r2 is preferably an integer of 0 to 2, more preferably 0 and 1, and still more preferably 0, and r3 is preferably an integer of 0 to 3, more preferably 1 and 2, and still more preferably 2. The sum of r1, r2 and r3 is preferably no less than 0 and no greater than 4, more preferably 1 and 2, and still more preferably 2. In the above formula (1-3), s3 is preferably an integer of 0 to 4, more preferably an integer of 0 to 2, and still more preferably 2.

The monovalent or the divalent group which may be represented by $R^4$ is exemplified by groups similar to the monovalent or divalent groups presented as examples of the substituent which the ring structure represented by $X^1$ and $X^2$ may have, and the like.

Examples of the monovalent organic group which may be represented by $R^1$ and $R^2$ in the above formula (1) include monovalent hydrocarbon groups, oxyhydrocarbon groups, acyl groups, acyloxy groups, carbonyloxy hydrocarbon groups, and the like. Of these, each group is exemplified by groups similar to the monovalent groups that the ring structure represented by $X^1$ and $X^2$ may have, and the like.

In the above formula (1), a1 and a2 are preferably an integer of 0 to 2, more preferably 0 and 1, and still more preferably 0.

In the above formula (1), n1 and n2 are preferably 0 and 1, and more preferably 0.

In the above formula (1), each of k1 and k2 is preferably an integer of 1 to 8, more preferably an integer of 1 to 4, still more preferably an integer of 1 to 3, and particularly preferably 1 and 2.

The sum of k1 and k2 is preferably an integer of 2 to 16, more preferably an integer of 2 to 8, still more preferably an integer of 2 to 4, and particularly preferably 2 and 4.

The partial structure (I) is exemplified by structures represented by the following formulae (1-1-1) to (1-3-3) (hereinafter, may be also referred to as "partial structures (I-1-1) to (I-3-3)"), and the like.

(1-1-1)
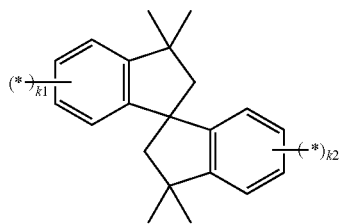

(1-1-2)
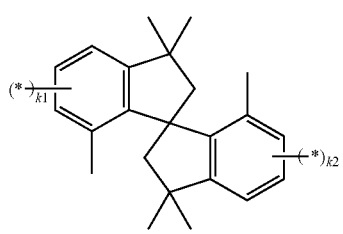

(1-1-3)
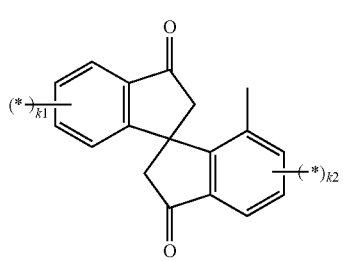

(1-1-4)
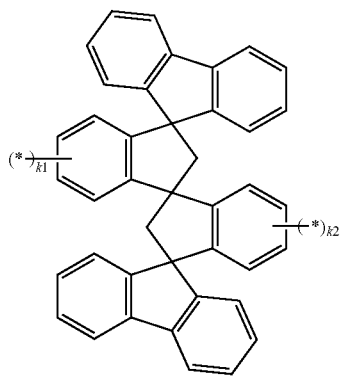

(1-1-5)
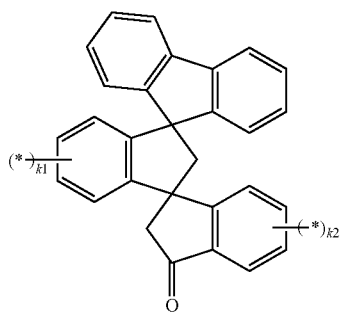

(1-1-6)
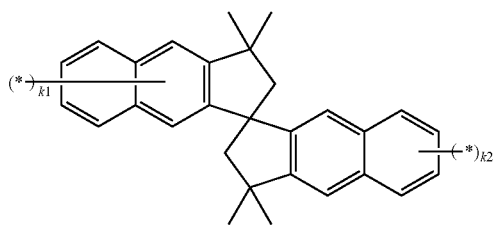

(1-1-7)
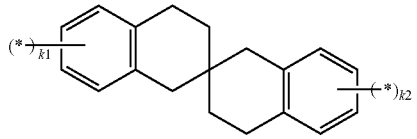

(1-1-8)
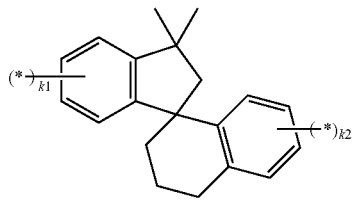

(1-1-9)
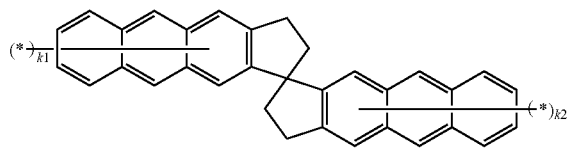

-continued

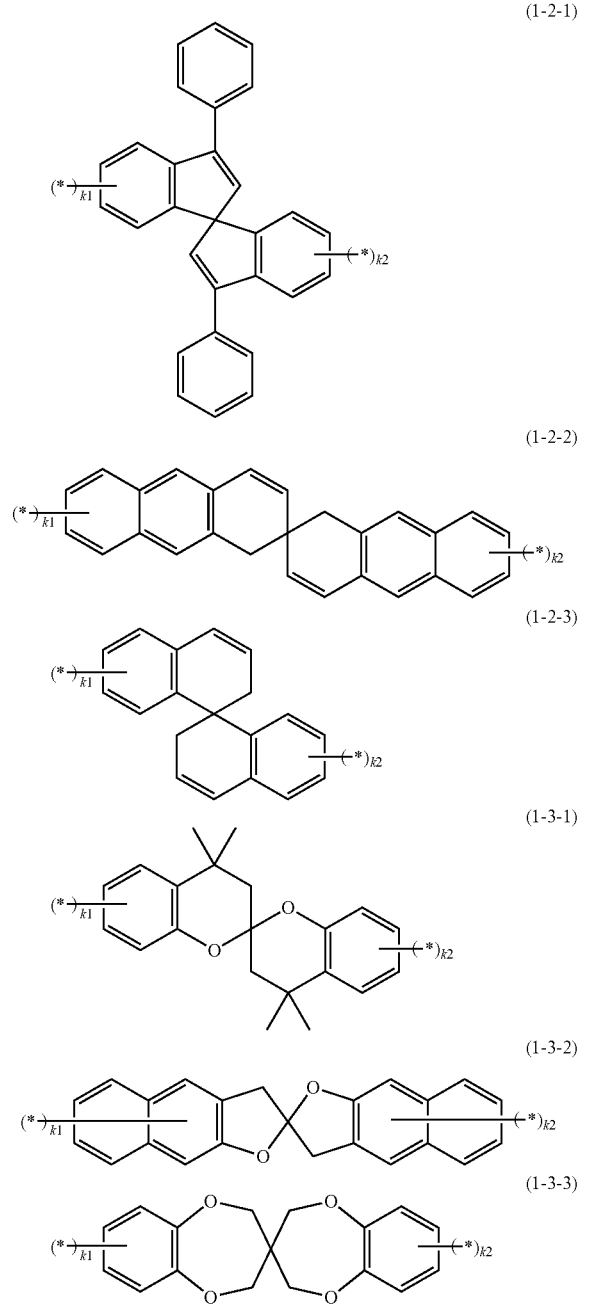

In the above formulae (1-1-1) to (1-3-3), k1, k2 and * are each as defined in the above formula (1).

Of these, the partial structure (I) is preferably the partial structures (I-1-1) to (I-1-5), the partial structure (I-2-1) and the partial structure (I-3-1), and more preferably the partial structure (I-1-1).

Intermolecular Bond-Forming Group (a)

The intermolecular bond-forming group (a) is capable of forming a covalent bond between molecules by, for example, an addition reaction, a condensation reaction or the like. Since the compound (A) has the intermolecular bond-forming group (a), the strength of the film can be increased by linkage of molecules of the compound (A). The compound (A) may have the intermolecular bond-forming group (a) in the partial structure (I), or in a moiety other than the partial structure (I), but in light of further enhancement of the heat resistance of the film, the compound (A) has the intermolecular bond-forming group (a) preferably in the moiety other than the partial structure (I).

The intermolecular bond-forming group (a) is exemplified by a carbon-carbon triple bond-containing group, a carbon-carbon double bond-containing group, a hydroxy chain hydrocarbon group, an acyl group, an acyloxy group, an epoxy group, an alkoxymethyl group, a dialkylaminomethyl group, a dimethylolaminomethyl group, and the like. Of these, a carbon-carbon triple bond-containing group, a carbon-carbon double bond-containing group, a hydroxy chain hydrocarbon group, an acyl group and a carbonyloxy hydrocarbon are preferred. The intermolecular bond-forming group (a) is more preferably a carbon-carbon triple bond-containing group and a carbon-carbon double bond-containing group. In this instance, the addition reaction of carbon-carbon multiple bonds enables the intermolecular bond to be formed, and as a result, hardening can be executed without the necessity of elimination of a group; therefore, the film can be formed while preventing film from contraction, and consequently, formation of a film that is more superior in the flatness is enabled.

Examples of the carbon-carbon triple bond-containing group include a substituted or unsubstituted ethynyl group, a substituted or unsubstituted propargyl group, a group represented by the following formula (3-1) (hereinafter, may be also referred to as "group (3-1)"), and the like.

Examples of the carbon-carbon double bond-containing group include a (meth)acryloyl group, an allyl group, an allyloxy group, a phenylallyloxy group, a cyclohexenyl-methoxy group, a styrylmethoxy group, a group represented by the following formula (3-2) (hereinafter, may be also referred to as "group (3-2)"), a group represented by the following formula (3-3) (hereinafter, may be also referred to as "group (3-3)"), and the like.

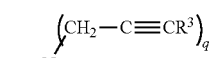  (3-1)

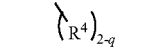  (3-2)

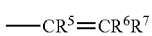  (3-3)

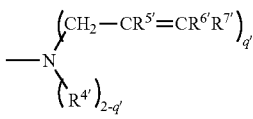

In the above formula (3-1), $R^3$ and $R^4$ each independently represent a hydrogen atom or a monovalent hydrocarbon group having 1 to 20 carbon atoms; and q is 1 or 2, wherein in a case where q is 2, a plurality of $R^3$s may be each identical or different.

In the above formula (3-2), $R^5$, $R^6$ and $R^7$ each independently represent a hydrogen atom or a monovalent hydrocarbon group having 1 to 20 carbon atoms.

In the above formula (3-3), $R^{4'}$, $R^{5'}$, $R^{6'}$ and $R^{7'}$ each independently represent a hydrogen atom or a monovalent hydrocarbon group having 1 to 20 carbon atoms; and q' is 1 or 2, wherein in a case where q' is 2, a plurality of $R^{5'}$s, $R^{6'}$s and $R^{7'}$s may be each identical or different with each other.

The monovalent hydrocarbon group having 1 to 20 carbon atoms which may be represented by $R^3$ to $R^7$, and $R^{4'}$ to $R^{7'}$ is exemplified by groups similar to the monovalent hydrocarbon groups exemplified for $R^1$ and $R^2$ in the above formula (1), and the like.

$R^3$ and $R^4$ represent, in light of an improvement of the hardening property of the composition for film formation, preferably a hydrogen atom and an alkyl group, and more preferably a hydrogen atom.

In the above formulae, q and q' are preferably 2 in light of the improvement of the hardening property of the composition for film formation.

In light of the improvement of the hardening property of the composition for film formation, $R^5$, $R^6$ and $R^7$ represent preferably a hydrogen atom and an alkyl group, and more preferably a hydrogen atom.

In light of the improvement of the hardening property of the composition for film formation, $R^{4'}$ to $R^{7'}$ represent preferably a hydrogen atom and an alkyl group, and more preferably a hydrogen atom.

Examples of the hydroxy chain hydrocarbon group include: monovalent groups such as a hydroxymethyl group, a 1-hydroxyethyl group, a 1-hydroxypropyl group and a 2-hydroxy-2-propyl group; divalent groups such as a hydroxymethanediyl group, a 1-hydroxy-1,1-ethanediyl group and a 1-hydroxy-1,1-propanediyl group; and the like. Of these, a 1-hydroxyethyl group, a 2-hydroxy-2-propyl group, a hydroxymethanediyl group and a 1-hydroxy-1,1-ethanediyl group are preferred.

Examples of the acyl group include a formyl group, an acetyl group, a propionyl group, a butyryl group, and the like. Of these, a formyl group and an acetyl group are preferred.

Examples of the carbonyloxy hydrocarbon group include a methoxycarbonyl group, an ethoxycarbonyl group, a propoxycarbonyl group, a phenoxycarbonyl group, a naphthoxycarbonyl group, and the like. Of these, a methoxycarbonyl group is preferred.

The number of the intermolecular bond-forming group (a) that the compound (A) has may be either one, or two or more, and is preferably two or more in light of further enhancement of the heat resistance of the film.

Modes of the compound (A) are exemplified by a compound having one partial structure (I) (hereinafter, may be also referred to as "(A1) compound" or "compound (A1)"), a polymer having at least two partial structures (I) in which the partial structure (I) serves as a repeating unit (hereinafter, may be also referred to as "(A2) polymer" or "polymer (A2)"), and the like. The compound (A1), and the polymer (A2) are explained below in this order.

(A1) Compound

The compound (A1) has one partial structure (I). When the composition for film formation contains the compound (A1) as the compound (A), embedding properties toward the trench can be further improved, and as a result, a film having more superior flatness can be formed.

Although the compound (A1) is not particularly limited as long as one partial structure (I) is included, for example, a compound represented by the following formula (2), and the like may be exemplified. The compound represented by the following formula (2) can further enhance the heat resistance of the film due to the construction from an aromatic ether bond.

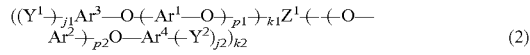
(2)

In the above formula (2), $Z^1$ is the partial structure represented by the above formula (1); k1 and k2 are each as defined in the above formula (1); $Ar^1$ and $Ar^2$ each independently represent a substituted or unsubstituted arenediyl group having 6 to 20 carbon atoms; p1 and p2 are each independently an integer of 0 to 3; $Ar^3$ represents a group obtained by removing (j1+1) hydrogen atoms from an aromatic ring of a substituted or unsubstituted arene having 6 to 20 carbon atoms; $Ar^4$ represents a group obtained by removing (j2+1) hydrogen atoms from an aromatic ring of a substituted or unsubstituted arene having 6 to 20 carbon atoms; j1 and j2 are each independently an integer of 1 to 9; $Y^1$ and $Y^2$ each independently represent a monovalent intermolecular bond-forming group having 1 to 20 carbon atoms, wherein in a case in which $Ar^1$ to $Ar^4$, $Y^1$, $Y^2$, p1, p2, j1 and j2 are present in a plurality of number, a plurality of $Ar^1$s may be identical or different, a plurality of $Ar^2$s may be identical or different, a plurality of $Ar^3$s may be identical or different, $Ar^4$s may be identical or different, a plurality of $Y^1$s may be identical or different, a plurality of $Y^2$s may be identical or different, a plurality of p1s may be identical or different, a plurality of p2s may be identical or different, a plurality of j1s may be identical or different, and a plurality of j2s may be identical or different.

Examples of the arenediyl group having 6 to 20 carbon atoms represented by $Ar^1$ and $Ar^2$ include a benzenediyl group, a toluenediyl group, a xylenediyl group, a naphthalenediyl group, an anthracenediyl group, and the like. Of these, in light of a further enhancement of the flatness of the film, a benzenediyl group and a naphthalenediyl group are preferred, and a benzenediyl group is more preferred.

Examples of the substituent of the arenediyl group represented by $Ar^1$ and $Ar^2$ include halogen atoms such as a fluorine atom, a chlorine atom, a bromine atom and an iodine atom, a hydroxy group, an amino group, a nitro group, a monovalent organic group having 1 to 20 carbon atoms, and the like. Of these, in light of further enhancement of the heat resistance of the film, and also in light of ease in synthesis of the compound (A), a nitro group and a monovalent organic group having 1 to 20 carbon atoms are preferred, a nitro group and a cyano group are more preferred, and a cyano group is still more preferred.

In the above formula (2), p1 and p2 are, in light of further enhancement of the heat resistance and the flatness of the film, preferably an integer of 0 to 2, more preferably 1 and 2, and still more preferably 1.

Examples of the arene having 6 to 20 carbon atoms that gives the group represented by $Ar^3$ and $Ar^4$ include benzene, toluene, xylene, biphenyl, naphthalene, methylnaphthalene, anthracene, and the like.

The substituent of the group represented by $Ar^3$ and $Ar^4$ is exemplified by groups similar to candidate substituents of the arenediyl group represented by $A^1$ and $Ar^2$, and the like.

The monovalent intermolecular bond-forming group having 1 to 20 carbon atoms represented by $Y^1$ and $Y^2$ is exemplified by groups similar to the monovalent groups among those presented as examples of the intermolecular bond-forming group (a), and the like, as long as the group has 1 to 20 carbon atoms.

Of these, the monovalent intermolecular bond-forming group having 1 to 20 carbon atoms represented by $Y^1$ and $Y^2$ is preferably a carbon-carbon double bond-containing group and a carbon-carbon triple bond-containing group, and more preferably the group (3-1), the group (3-2) and the group (3-3), as long as the group has no greater than 20 carbon atoms.

In the above formula (2), each of j1 and j2 is preferably an integer of 1 to 4, more preferably an integer of 1 to 3, and still more preferably 1 and 2.

The sum of j1 and j2 is preferably an integer of 2 to 8, more preferably an integer of 2 to 6, still more preferably an integer of 2 to 4, and particularly preferably 2 and 4.

In the above formula (2), each of k1 and k2 is preferably an integer of 1 to 4, more preferably an integer of 1 to 3, and still more preferably 1 and 2.

The sum of k1 and k2 is preferably an integer of 2 to 8, more preferably an integer of 2 to 6, still more preferably an integer of 3 to 6, particularly preferably an integer of 4 to 6, and further particularly preferably 4 and 6.

The compound (A1) is exemplified by compounds represented the following formulae (2-1) to (2-36) (hereinafter, may be also referred to as "compounds (2-1) to (2-36)"), and the like.

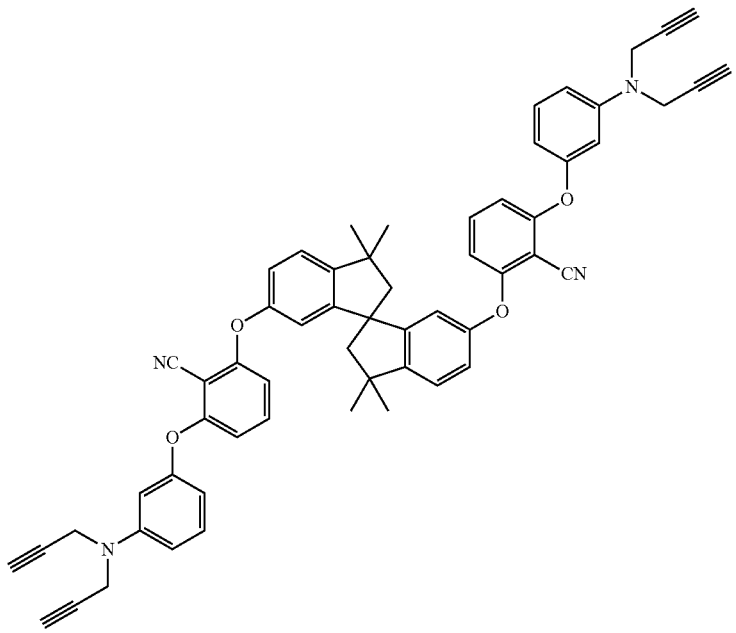

(2-1)

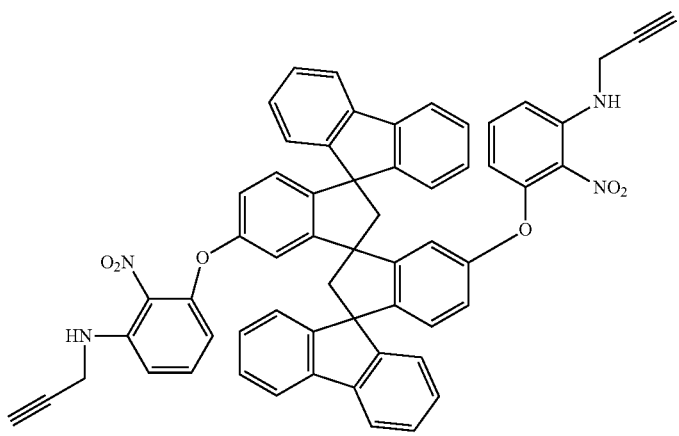

(2-2)

-continued
(2-3)
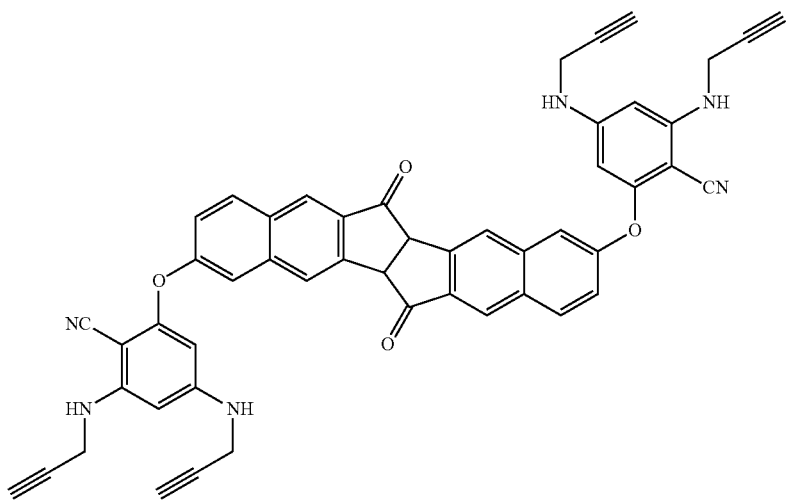
(2-4)
(2-5)
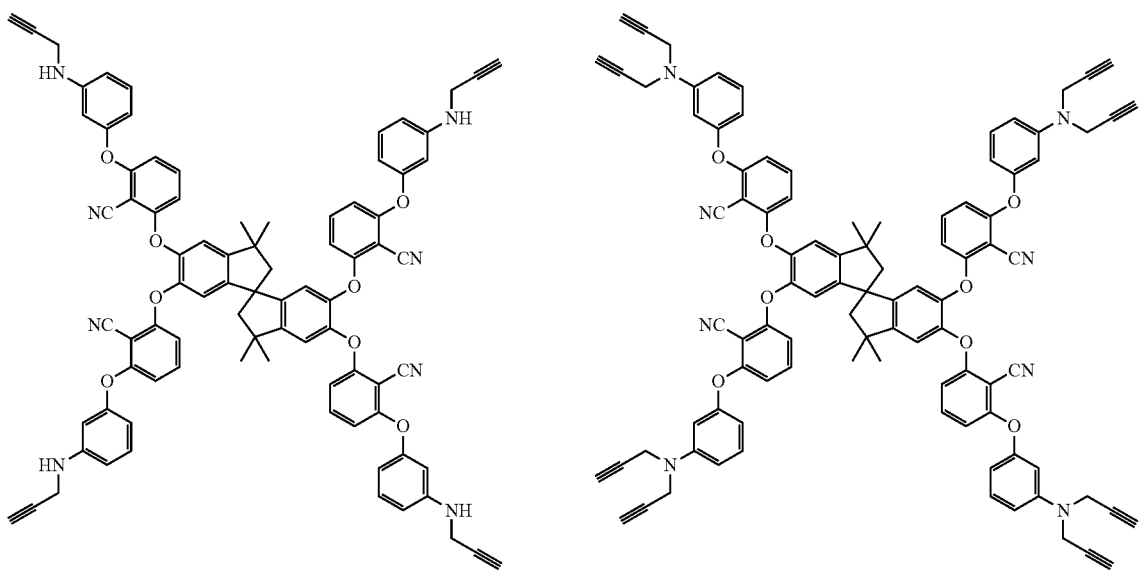

-continued
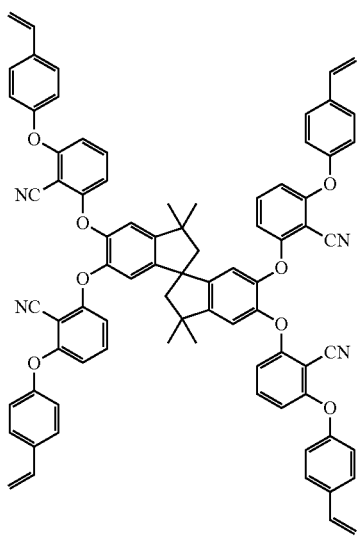
(2-6)
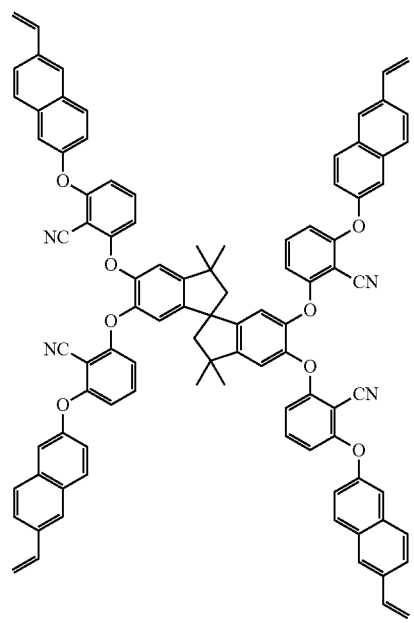
(2-7)
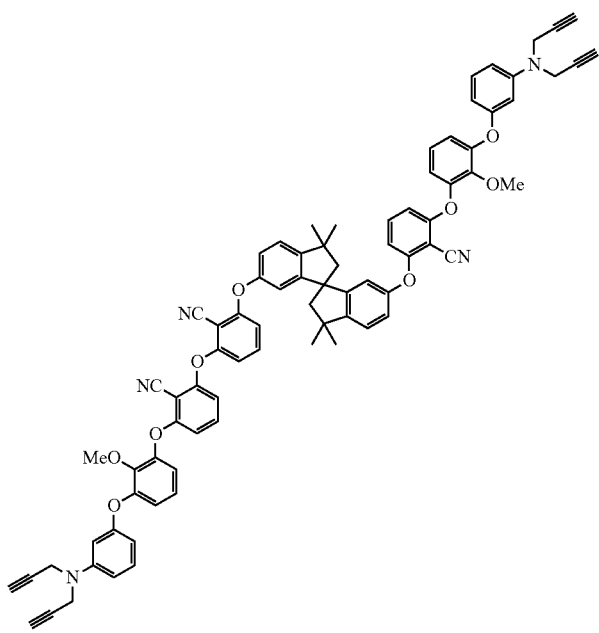
(2-8)

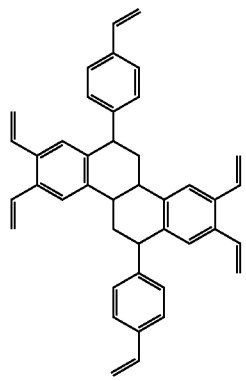
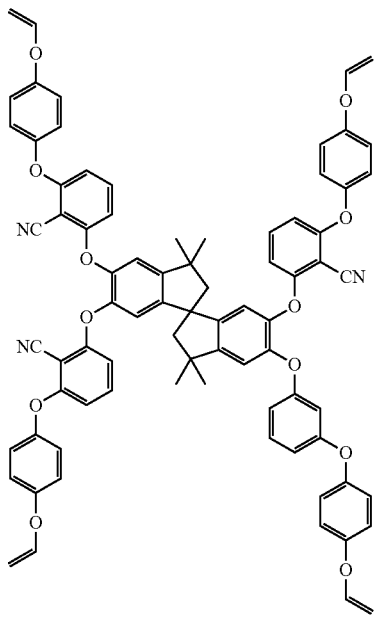
(2-9)
(2-10)
-continued
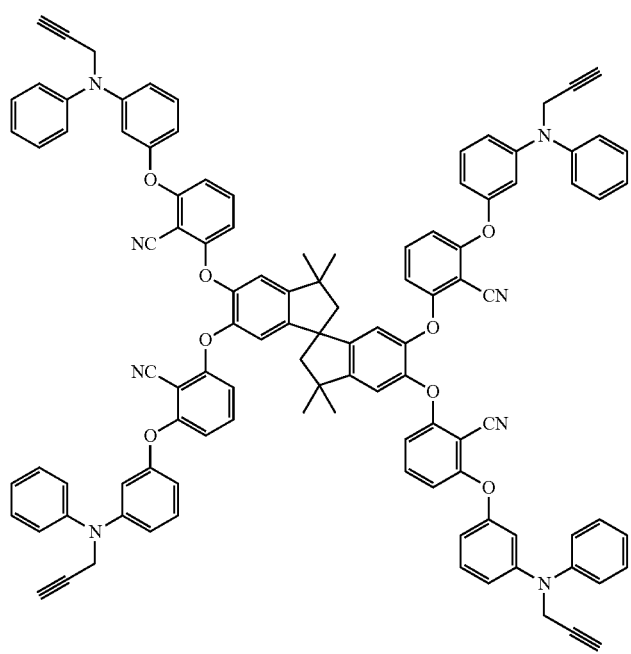
(2-11)

-continued
(2-12)
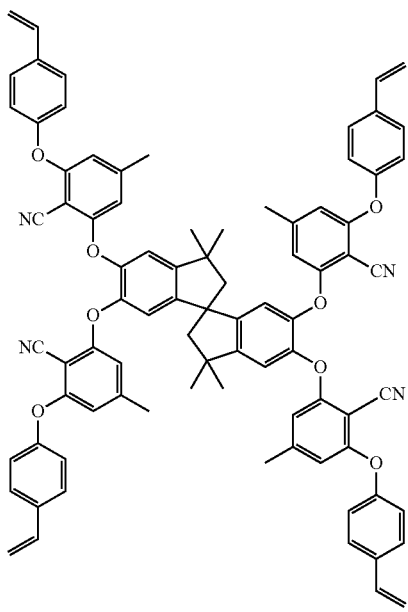
(2-13)
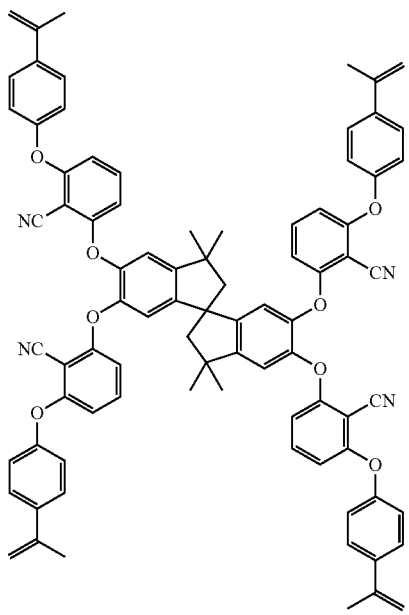
(2-14)
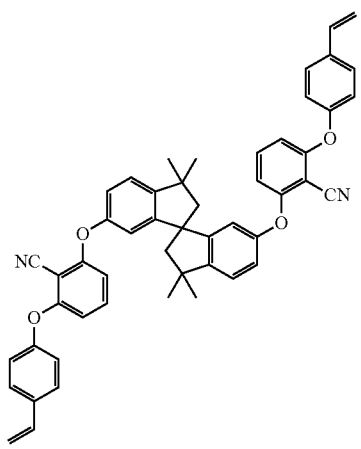
(2-15)
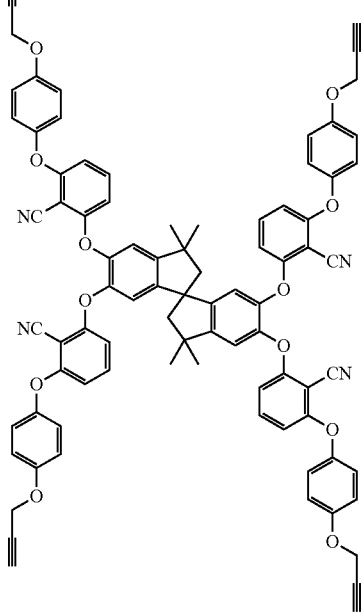

-continued
(2-16)
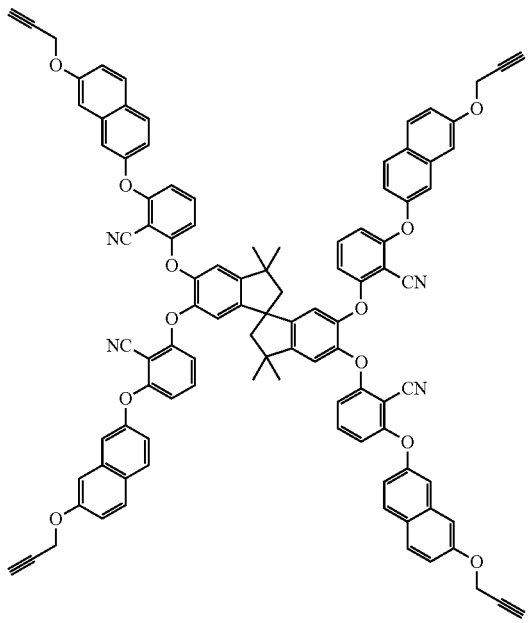
(2-17)
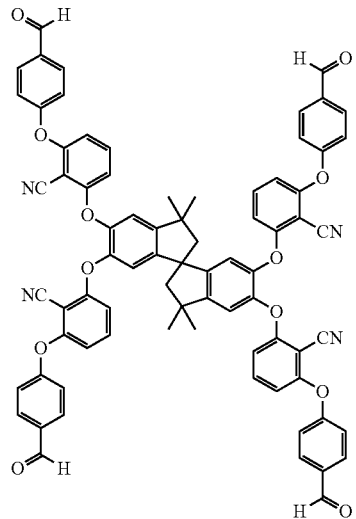
(2-18)
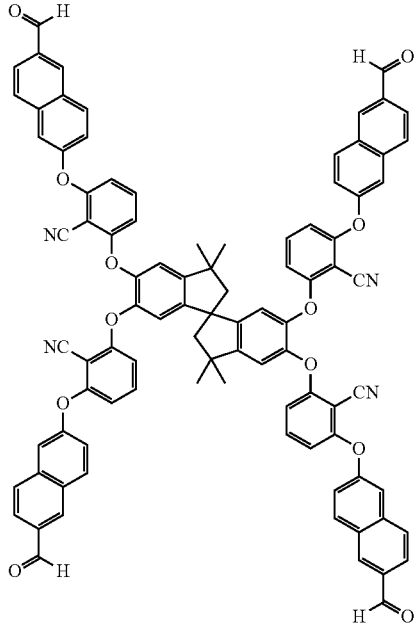
(2-19)
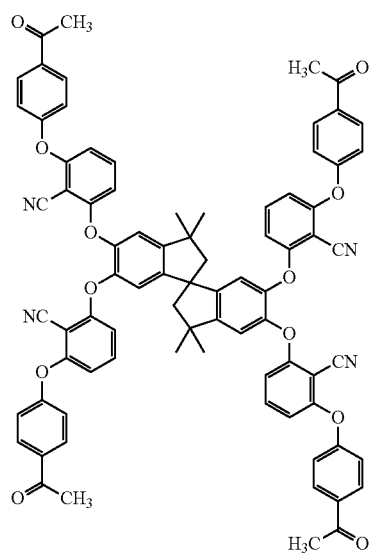

-continued
(2-20)
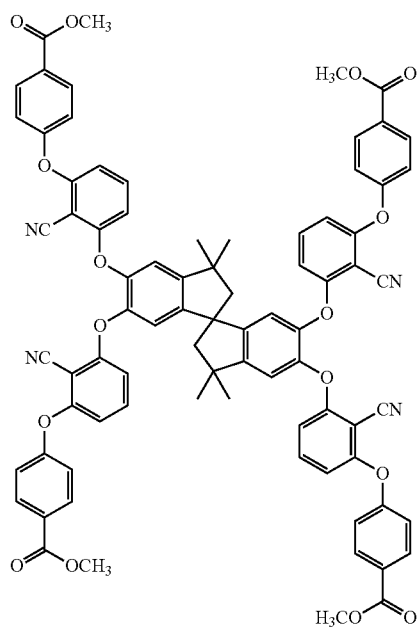
(2-21)
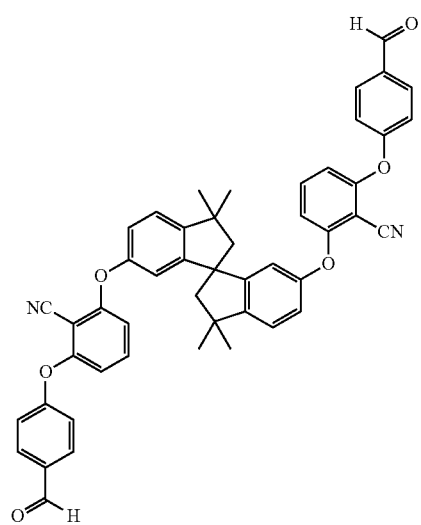
(2-22)
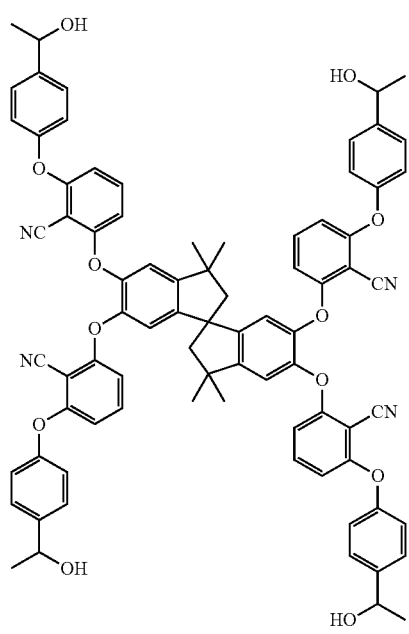
(2-23)
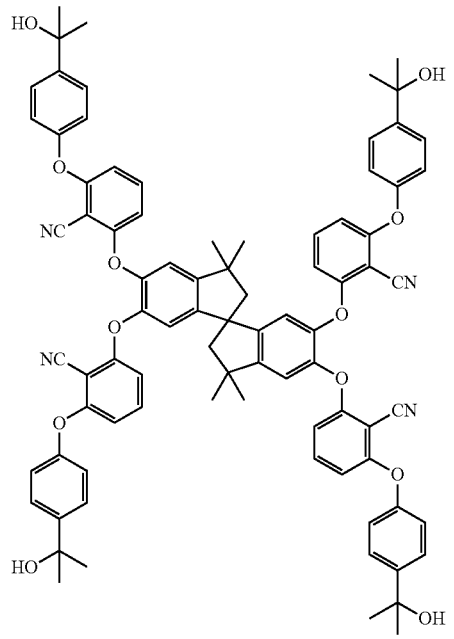

(2-24)
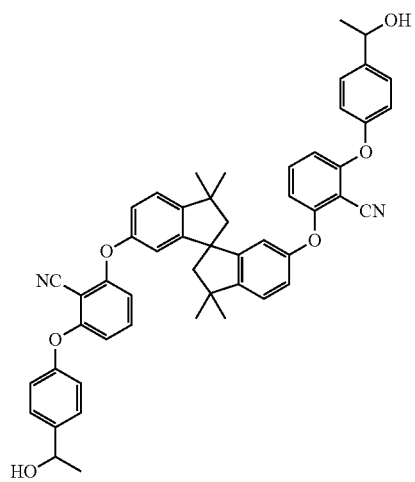
(2-25)
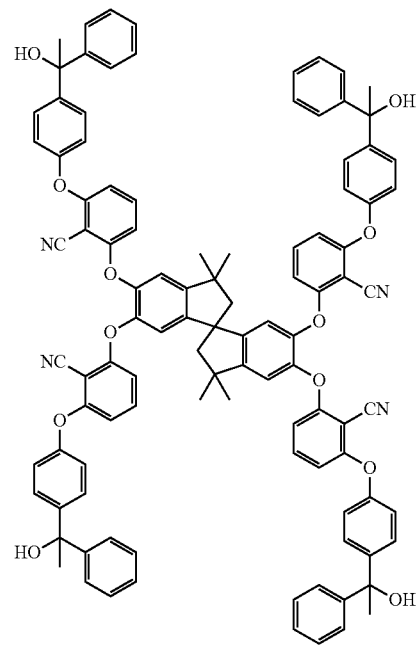
(2-26)
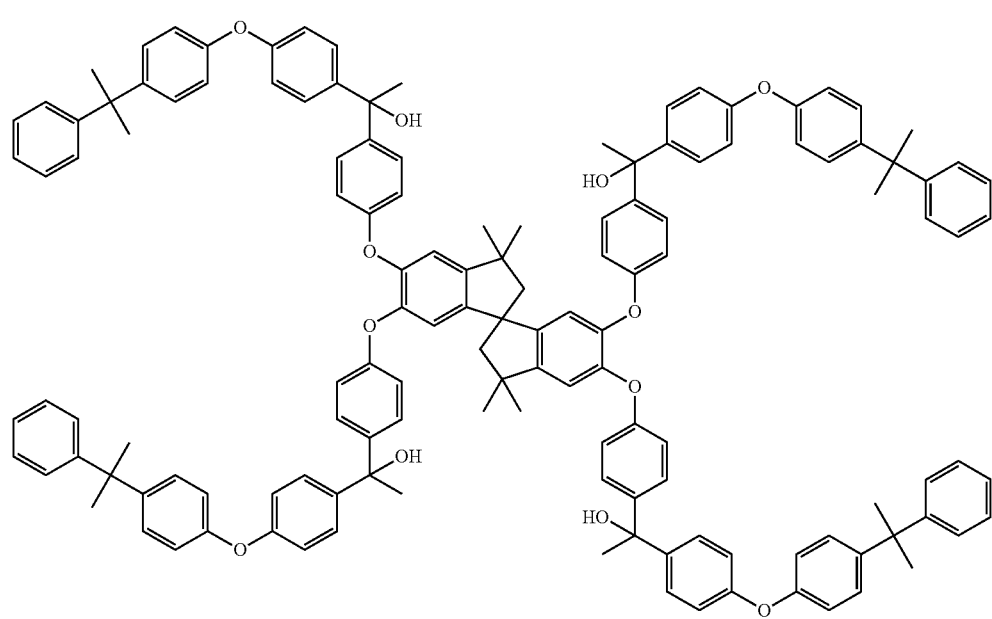

(2-27)
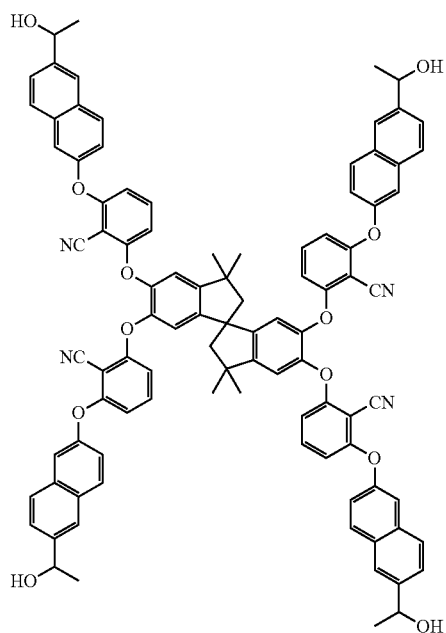
(2-28)
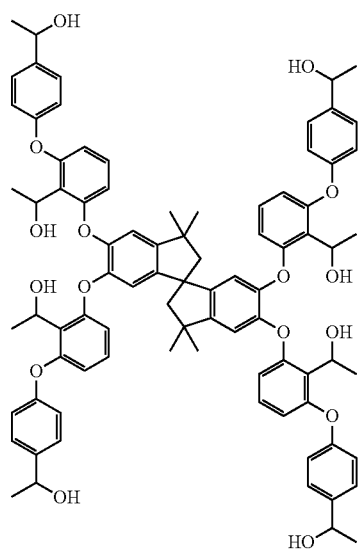
(2-29)
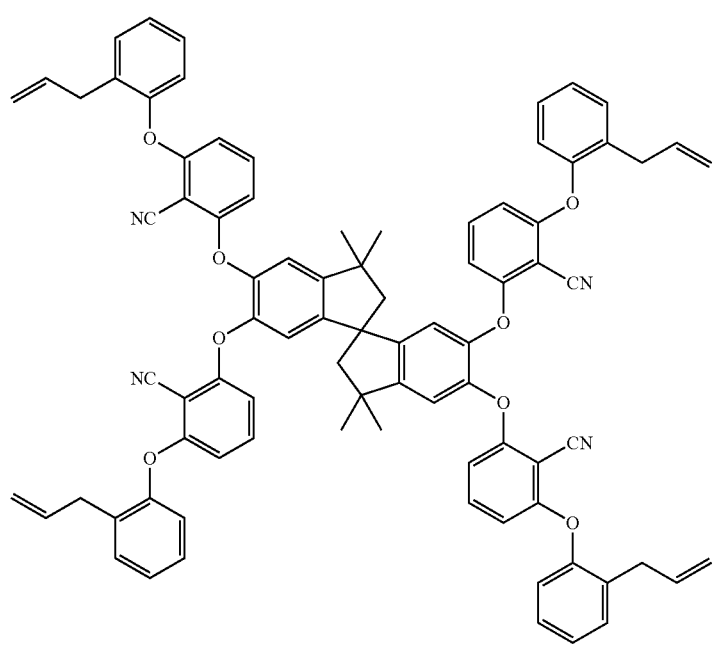

-continued
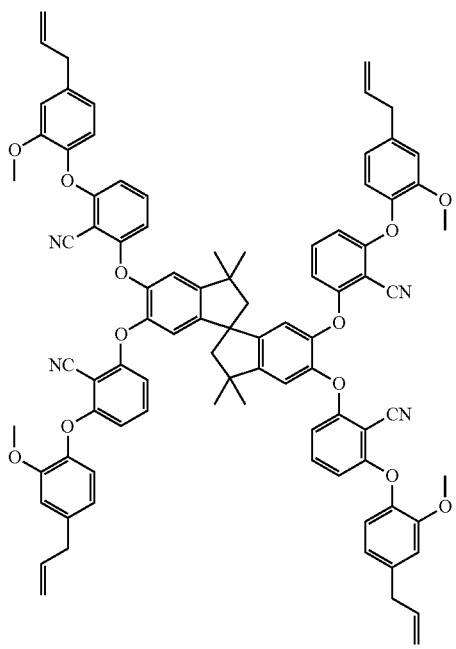
(2-30)
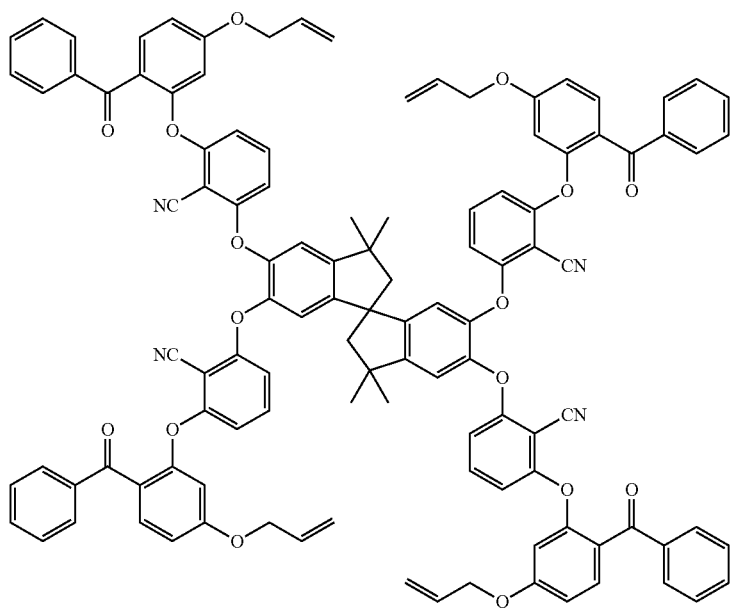
(2-31)

(2-32)
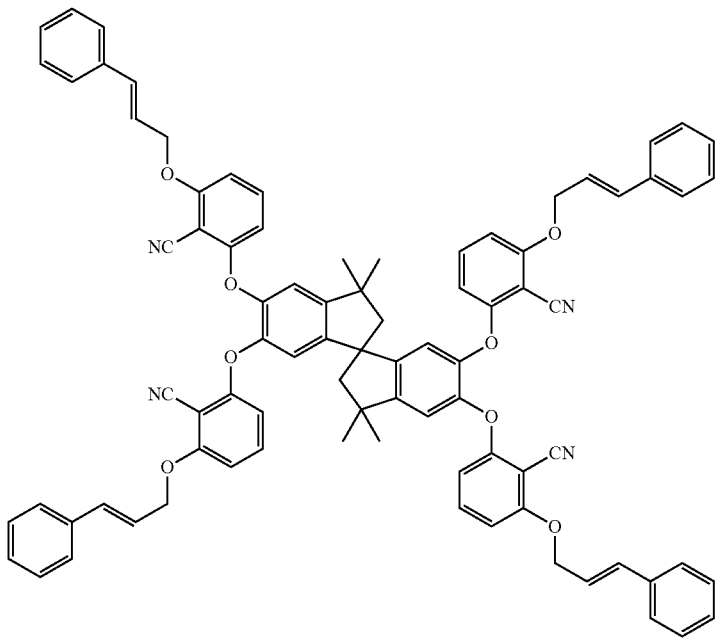
(2-33)
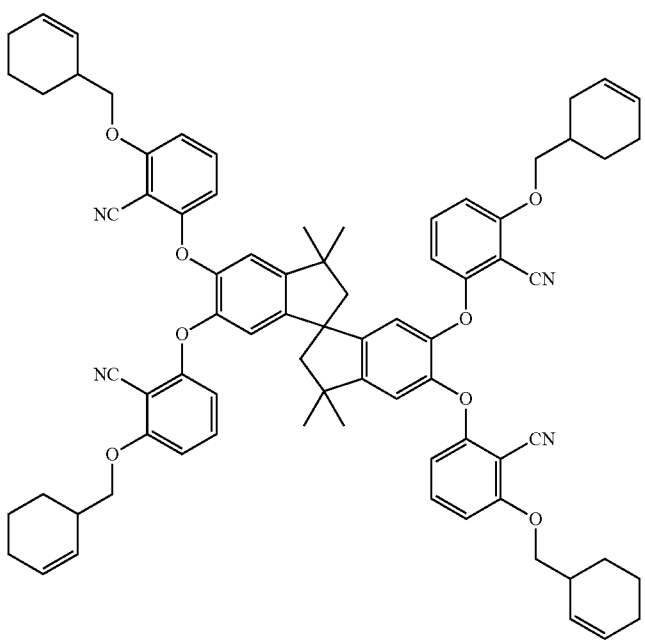

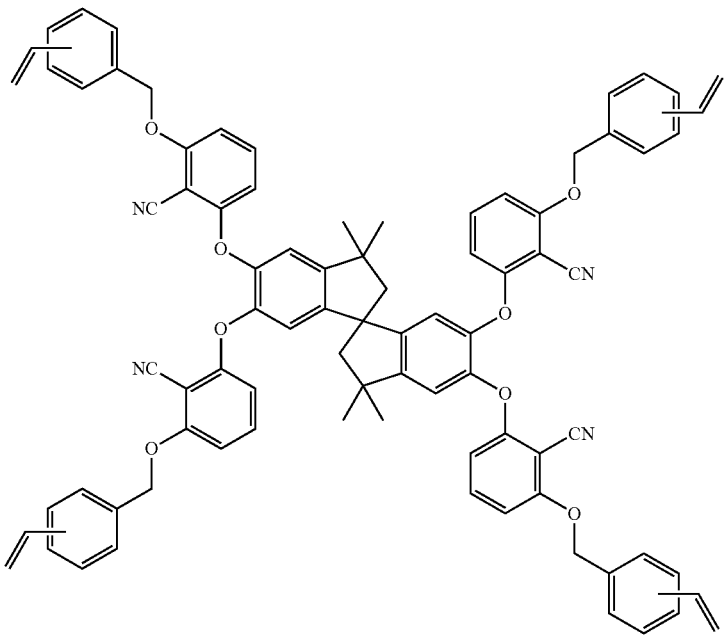

(2-34)

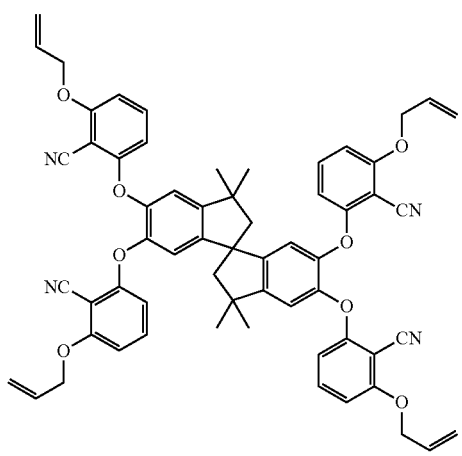

(2-35)

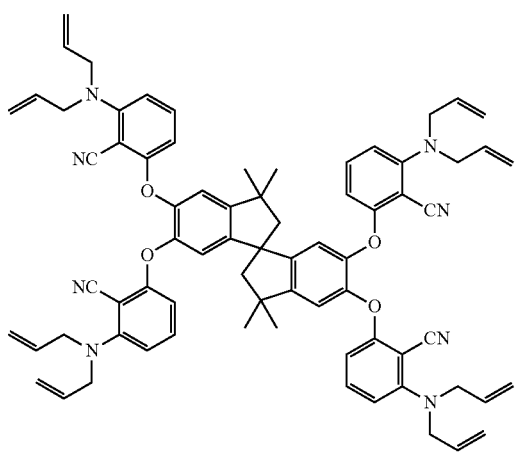

(2-36)

Of these, the compounds (2-1), (2-4) to (2-7), (2-11) to (2-28) and (2-29) to (2-36) are preferred, and the compounds (2-1), (2-4) to (2-7), (2-11) to (2-16) and (2-29) to (2-36) are particularly preferred.

The amount of the compound (A1) contained with respect to the total solid content of the composition for film formation is preferably no less than 70% by mass, more preferably no less than 80% by mass, and still more preferably no less than 85% by mass.

Synthesis Method of Compound (A1)

The compound (A1) can be synthesized by allowing, for example, a polyol component (A') that includes a polyol compound represented by the following formula (2-m) (hereinafter, may be also referred to as "polyol (2-m)") to react with a monohalo component (B') that includes an aromatic monohalide having the intermolecular bond-forming group (a) in an organic solvent, in the presence of an alkali metal or an alkali metal compound. The compound (A1) may be obtained not only by the reaction process described above but also by allowing the polyol component (A') to react with an alkali metal or an alkali metal compound in an organic solvent to obtain an alkali metal salt of the polyol component (A') and thereafter allowing the resulting metal salt to react with the monohalo component (B'). The monohalo component (B') may be obtained by, for example, allowing an aromatic dihalo compound having a halogen atom, a hydroxy group, a nitro group or a monovalent organic group to react with an aromatic mono-ol compound having the intermolecular bond-forming group (a) in the presence of a basic compound. Alternatively, a component that includes an aromatic monohalide having a group that can be converted into the intermolecular bond-forming group (a) (e.g., amino group, etc.) may be used in place of the monohalo component (B'), and the group that can be converted into the intermolecular bond-forming group (a) may be converted into the intermolecular bond-forming group (a) (e.g., a group represented by the above formula (3-1), etc.) after the reaction with the polyol component (A'). Examples of the aromatic mono-ol compound having the intermolecular bond-forming group (a) include vinylphenol, vinylnaphthol, formylphenol, formylnaphthol, acetylphenol, acetylnaphthol, vinyloxyphenol, vinyloxynaphthol, propargyloxyphenol, propargyloxynaphthol, methoxycarbonylphenol, methoxycarbonylnaphthol, propenylphenol, propenylnaphthol, and the like.

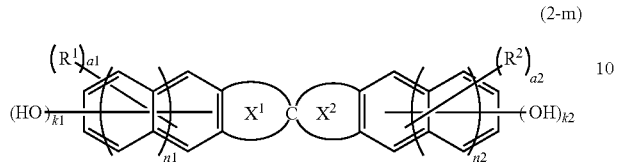

(2-m)

In the above formula (2-m), $X^1$, $X^2$, $R^1$, $R^2$, a1, a2, n1, n2, k1 and k2 are each as defined in the above formula (1).

The basic compound and the organic solvent for use in the reaction are exemplified by compounds, etc., similar to those used in the synthesis of the aforementioned polymer (A2), and the like. The amount of the basic compound is, with respect to the —OH group included in the polyol component (A'), preferably 1-fold equivalents to 3-fold equivalents, more preferably 1-fold equivalents to 2-fold equivalents, and still more preferably 1-fold equivalents to 1.5-fold equivalents.

The amount of the monohalo component (B') used is, with respect to the —OH group included in the polyol component (A'), preferably 1-fold equivalent to 3-fold equivalents, more preferably 1-fold equivalents to 2-fold equivalents, and still more preferably 1-fold equivalents to 1.5-fold equivalents.

The reaction temperature is preferably 60° C. to 250° C., and more preferably 80° C. to 200° C. The reaction time period is preferably 15 min to 100 hrs, and more preferably 1 hour to 24 hrs.

The compound synthesized may be recovered from the reaction mixture by a reprecipitation technique or the like and then purified. The solvent employed in the reprecipitation is exemplified by alcohol solvents and the like, and of these, methanol is preferred.

The lower limit of the molecular weight of the compound (A1) is preferably 300, more preferably 600, and still more preferably 800. The upper limit of the molecular weight is preferably 3,000, more preferably 2,000, and still more preferably 1,500. When the molecular weight of the compound (A1) is between the lower limit and the upper limit, the flatness of the film obtained can be further improved.

(A2) Polymer

The polymer (A2) has the repeating unit represented by the following formula (4) (hereinafter, may be also referred to as "repeating unit (I)"). When the composition for film formation contains the polymer (A2) as the compound (A), the heat resistance of the film can be further increased. The "polymer" as referred to has at least two repeating units, and may generally involve both oligomers and polymers as classified.

(4)

In the above formula (4), $Z^2$ is the partial structure represented by the above formula (1); and k1 is as defined in the above formula (1).

The polymer (A2) may have a repeating unit (III) and/or a repeating unit (II) having a molecular bond-forming group as described later in addition to the repeating unit (I), and may further have other repeating unit in addition to these repeating units. Each repeating unit will be explained below.

Repeating Unit (I)

The repeating unit (I) is represented by the above formula (4). Examples of the repeating unit (I) include repeating units represented by the following formulae (1P-1-1) to (1P-3-3) (hereinafter, may be also referred to as "repeating units (1P-1-1) to (1P-3-3)"), and the like.

(IP-1-1)

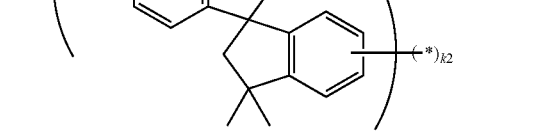

(IP-1-2)

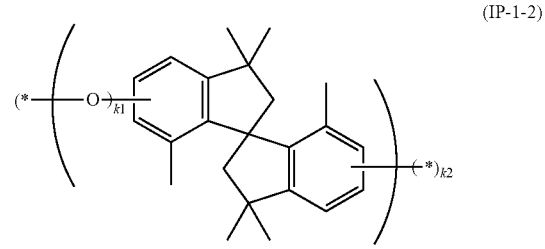

(IP-1-3)

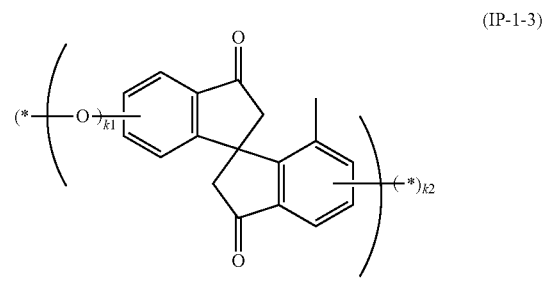

(IP-1-4)

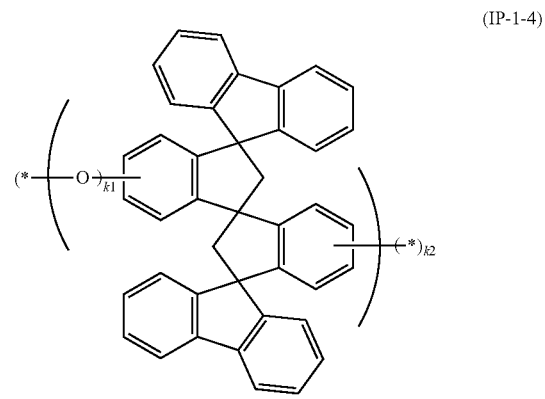

(IP-1-5)

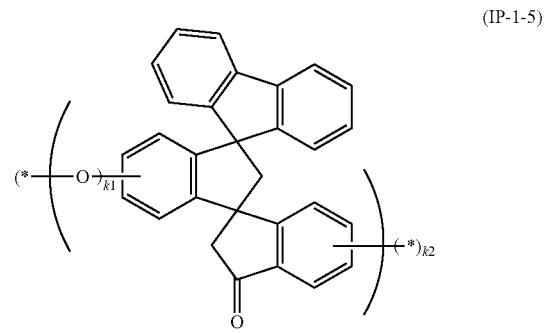

(IP-1-6)
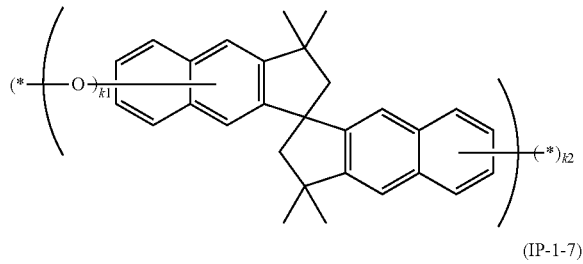

(IP-1-7)
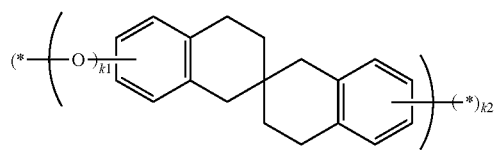

(IP-1-8)
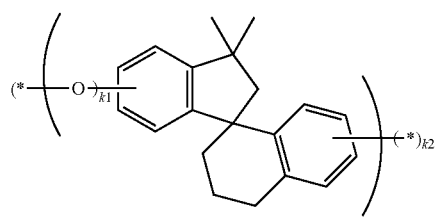

(IP-1-9)
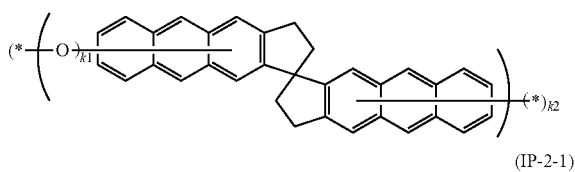

(IP-2-1)
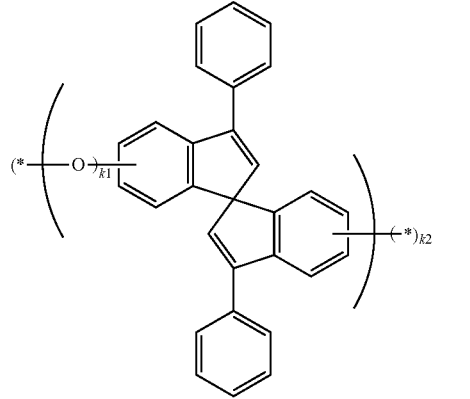

(IP-2-2)
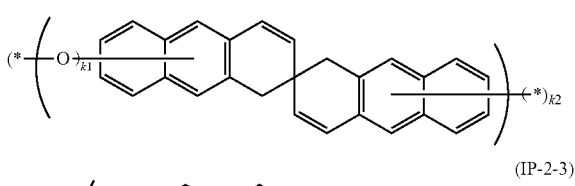

(IP-2-3)
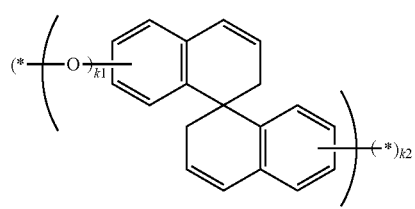

(IP-3-1)
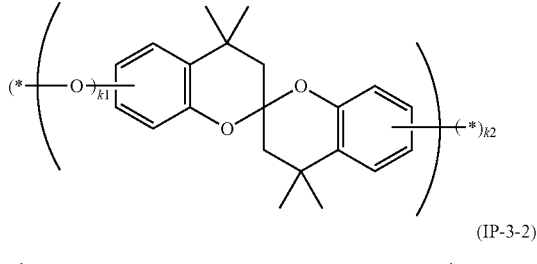

(IP-3-2)
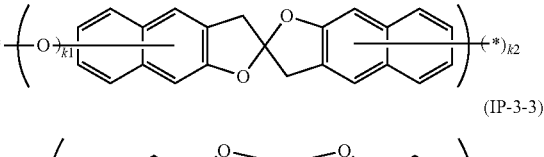

(IP-3-3)
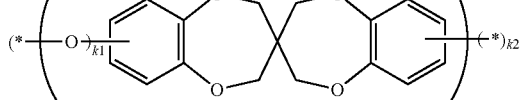

In the above formulae (1P-1-1) to (1P-3-3), k1 and k2 are each as defined in the above formula (1); and * denotes a binding site to a moiety other than the partial structure (I).

Of these, the repeating unit (1P-1-1) and the repeating unit (1P-3-1) are preferred. The repeating unit (1P-1-1) in which the sum of k1 and k2 is no less than 3 and no greater than 6 and the repeating unit (1P-3-1) in which the sum of k1 and k2 is no less than 3 and no greater than 6 are more preferred, and the repeating unit (1P-1-1) in which the sum of k1 and k2 is 4 or 6 and the repeating unit (1P-3-1) in which the sum of k1 and k2 is 4 are still more preferred.

The proportion of the repeating unit (I) contained with respect to the total repeating units constructing the polymer (A2) is preferably 0.1 mol % to 20 mol %, more preferably 0.2 mol % to 10 mol %, still more preferably 0.5 mol % to 7 mol %, and particularly preferably 1 mol % to 5 mol %. When the proportion of the repeating unit (I) contained falls within the above range, the heat resistance and flatness of the film can be further improved.

Although the polymer (A) may have the repeating unit (I) in any of the main chain and the side chain thereof, the repeating unit (I) is preferably included in the main chain. When the polymer (A) has the repeating unit (I) in the main chain, the heat resistance and flatness of the film can be more superior. The term "main chain" as referred to herein means the longest chain among chains formed through binding of a plurality of atoms constructing the polymer (A). The term "side chain" as referred to herein means any chain other than the main chain among the chains in the polymer (A).

In a case where each of k1 and k2 is 1, the structure including the the repeating unit (I) is preferably represented by the following formula (X).

$$—Ar^1—Z—O—Ar^2— \quad (X)$$

In the above formula (X), Z is the partial structure (I); and $Ar^1$ and $Ar^2$ each independently represent a substituted or unsubstituted arenediyl group having 6 to 40 carbon atoms.

Examples of the arenediyl group having 6 to 40 carbon atoms represented by $Ar^1$ and $Ar^2$ include a benzenediyl group, a naphthalenediyl group, an anthracenediyl group, a phenanthrenediyl group, and the like.

Repeating Unit (II)

The repeating unit (II) is represented by the following formula (5-1) or formula (5-2). The repeating unit (II) has an intermolecular bond-forming group $Y^3$ or $Y^4$. When the polymer (A2) has the repeating unit (II), the composition for film formation has a further improved hardening property, and as a result, the heat resistance of the film is further enhanced.

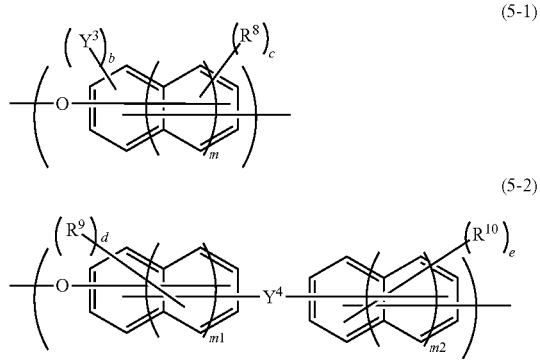

(5-1)

(5-2)

In the above formula (5-1), $Y^3$ represents a monovalent intermolecular bond-forming group having 1 to 20 carbon atoms; b is an integer of 1 to 8; $R^8$ represents a halogen atom, a hydroxy group, a nitro group or a monovalent organic group; c is an integer of 0 to 8, wherein the sum of b and c is no greater than 8, and wherein in a case where $Y^3$ and $R^8$ are present in a plurality of number, a plurality of $Y^3$s may be identical or different and a plurality of $R^8$s may be identical or different; m is an integer of 0 to 2, wherein in a case where m is 1 or 2, $Y^3$ and $R^8$ may bond to any ring. In the above formula (5-2), $Y^4$ represents a divalent intermolecular bond-forming group having 1 to 20 carbon atoms; $R^9$ and $R^{10}$ each independently represent a halogen atom, a hydroxy group, a nitro group or a monovalent organic group; d and e are each independently an integer of 0 to 8, wherein in a case where $R^9$ is present in a plurality of number, a plurality of $R^9$s may be identical or different, and wherein in a case where $R^{10}$ is present in a plurality of number, a plurality of $R^{10}$s may be identical or different; and m1 and m2 are each independently an integer of 0 to 2.

The monovalent intermolecular bond-forming group having 1 to 20 carbon atoms represented by $Y^3$ is exemplified by groups similar to the monovalent groups among those presented as examples of the intermolecular bond-forming group (a), and the like, as long as the group has 1 to 20 carbon atoms.

Of these, a carbon-carbon double bond-containing group and a carbon-carbon triple bond-containing group are preferred, and the group (3-1), the group (3-2) and the group (3-3) are more preferred as long as the group has no greater than 20 carbon atoms.

The divalent intermolecular bond-forming group having 1 to 20 carbon atoms represented by $Y^4$ is exemplified by groups similar to the divalent groups among those presented as examples of the intermolecular bond-forming group (a), and the like, as long as the group has 1 to 20 carbon atoms.

Of these, a hydroxymethanediyl group, a 1-hydroxy-1,1-ethanediyl group and a 1-hydroxy-1,1-propanediyl group are preferred, and a hydroxymethanediyl group and a 1-hydroxy-1,1-ethanediyl group are more preferred.

Examples of the halogen atom which may be represented by $R^8$ to $R^{10}$ include a fluorine atom, a chlorine atom, a bromine atom, an iodine atom, and the like. Of these, a fluorine atom and a chlorine atom are preferred, and a chlorine atom is more preferred.

The monovalent organic group which may be represented by $R^8$ to $R^{10}$ is exemplified by groups similar to the monovalent organic groups exemplified for $R^1$ and $R^2$ in the above formula (1), and the like. Of these, a cyano group and a formyl group are preferred.

$R^8$ to $R^{10}$ are each preferably a halogen atom, a nitro group and a cyano group, more preferably a chlorine atom, a nitro group and a cyano group, and still more preferably a cyano group. When $R^8$ to $R^{10}$ each represent an electron-withdrawing group, the polymerization reaction for synthesizing the polymer (A2) can be accelerated.

In the above formula, b is preferably an integer of 1 to 3, more preferably 1 and 2, and still more preferably 1.

In the above formula, c is preferably an integer of 0 to 2, more preferably 0 and 1, and still more preferably 0.

In the above formula, m is preferably 0 and 1, and more preferably 0.

In the above formula, d is preferably an integer of 0 to 2, more preferably 0 and 1, and still more preferably 0.

In the above formula, e is preferably an integer of 0 to 2, more preferably 0 and 1, and still more preferably 0.

In the above formula, m1 is preferably 0 and 1, and more preferably 0.

In the above formula, m2 is preferably 0 and 1, and more preferably 0.

In a case where m is 0 in the repeating unit (II), two atomic bondings of the aromatic ring are preferably situated at the meta position. When the atomic bondings in the repeating unit (II) are situated at the meta position, the linearity of the main chain of the polymer (A2) can be reduced, and consequently, the flatness of the film can be further improved.

Examples of the repeating unit (II) include repeating units represented by the following formulae (3-1) to (3-12) (hereinafter, may be also referred to as "repeating units (II-1) to (II-12)"), and the like.

(3-1)

(3-2)

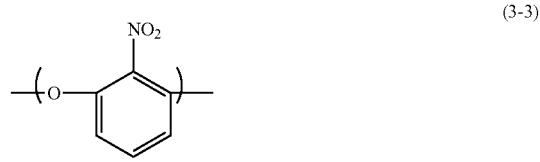

(3-3)

(3-4)

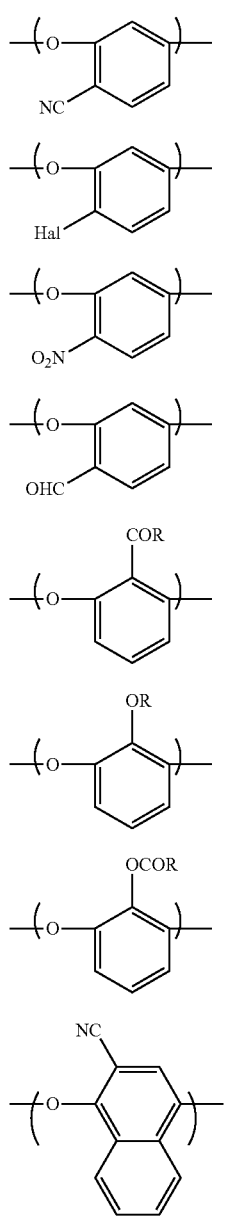

(3-5)

(3-6)

(3-7)

(3-8)

(3-9)

(3-10)

(3-11)

(3-12)

In the above formulae (3-2) and (3-6), Hal represents a halogen atom.

In the above formulae (3-9) to (3-11), R represents a monovalent hydrocarbon group.

Of these, the repeating unit (II) is preferably the repeating units (II-1) to (II-8), (II-12) and (II-13), more preferably the repeating units (II-1) to (II-4) and (II-13), and still more preferably the repeating units (II-1) and (II-13).

The proportion of the repeating unit (II) contained with respect to the total repeating units constructing the polymer (A2) is preferably 5 mol % to 95 mol %, more preferably 20 mol % to 80 mol %, and still more preferably 30 mol % to 75 mol %. When the proportion of the repeating unit (II) contained falls within the above range, the coating properties of the polymer (A2) can be further improved.

Repeating Unit (III)

The repeating unit (III) is represented by the following formula (4). When the polymer (A2) has the repeating unit (III), the heat resistance of the film can be further increased.

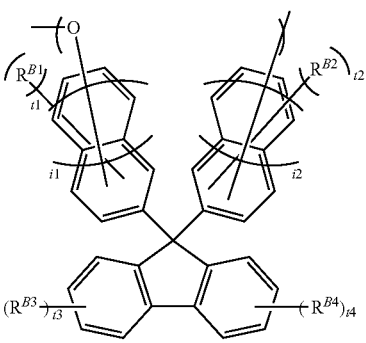

(4)

In the above formula (4), $R^{B1}$ to $R^{B4}$ each independently represent a halogen atom, a nitro group or a monovalent organic group; t1 and t2 are each independently an integer of 0 to 6; t3 and t4 are each independently an integer of 0 to 4; and i1 and i2 are an integer of 0 to 2.

Examples of the halogen atom which may be represented by $R^{B1}$ to $R^{B4}$ include a fluorine atom, a chlorine atom, a bromine atom, an iodine atom, and the like.

The monovalent organic group which may be represented by $R^{B1}$ to $R^{B4}$ is exemplified by groups similar to the monovalent organic groups exemplified for $R^1$ and $R^2$ in the above formula (1), and the like.

$R^{B1}$ to $R^{B4}$ are each preferably a monovalent hydrocarbon group, a halogen atom and a cyano group, and more preferably a monovalent hydrocarbon group.

In the above formula, t1 and t2 are each preferably an integer of 0 to 2, more preferably 0 and 1, and still more preferably 0.

In the above formula, t3 and t4 are each preferably an integer of 0 to 2, more preferably 0 and 1, and still more preferably 0.

In the above formula, i1 and i2 are each preferably 0 and 1, and more preferably 1. It is preferred that i1 and i2 are each 1, in other words, a naphthalene ring is provided, since the extinction coefficient of the film can be increased.

Examples of the repeating unit (III) include repeating units represented by the following formulae (4-1) to (4-6) (hereinafter, may be also referred to as "repeating units (III-1) to (III-6)"), and the like.

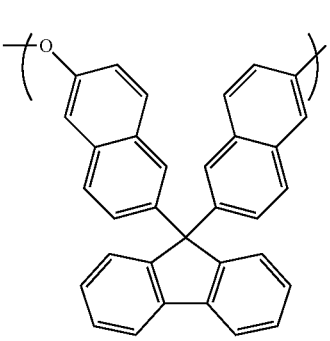

(4-1)

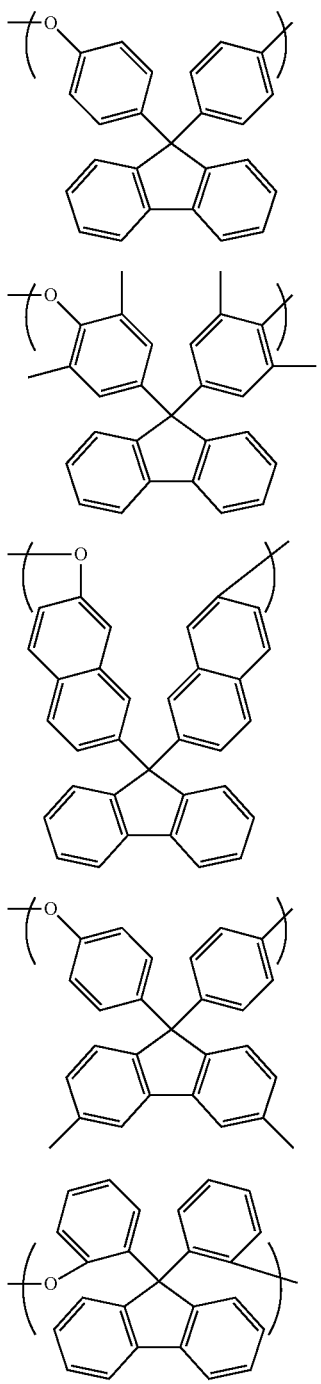

(4-2)

(4-3)

(4-4)

(4-5)

(4-6)

Of these, the repeating unit (III) is preferably the repeating unit (III-1) and the repeating unit (III-2).

The proportion of the repeating unit (III) contained with respect to the total repeating units constructing the polymer (A2) is, in a case where the sum of k1 and k2 is no less than 3, preferably 5 mol % to 95 mol %, more preferably 10 mol % to 70 mol %, and still more preferably 15 mol % to 50 mol %. Alternatively, in a case where each of k1 and k2 is 1, the proportion of the repeating unit (III) contained with respect to the total repeating units constructing the polymer (A2) is preferably 5 mol % to 95 mol %, more preferably 10 mol % to 55 mol %, and still more preferably 15 mol % to 35 mol %. When the proportion of the repeating unit (III) contained falls within the above range, the heat resistance and the solubility in a solvent such as PGMEA of the polymer (A2) can be further increased, and as a result, the coating properties of the composition for film formation and the heat resistance of the film obtained can be further improved.

Other Repeating Unit

The polymer (A2) may also have other repeating unit except for the repeating units (I) to (III) described above. Examples of the other repeating unit include repeating units represented by the following formulae (5-1) to (5-6) (hereinafter, may be also referred to as "repeating units (IV-1) to (IV-6)"), and the like.

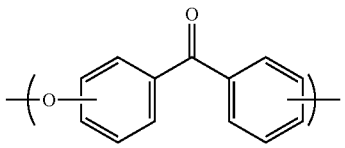

(5-1)

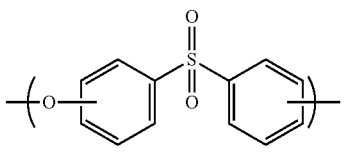

(5-2)

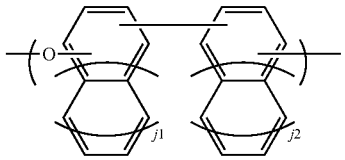

(5-3)

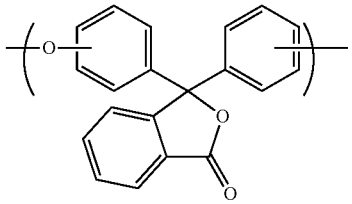

(5-4)

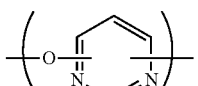

(5-5)

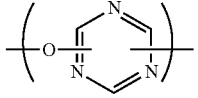

(5-6)

In the above formula (5-3), j1 and j2 are each independently an integer of 0 to 2.

Of these, preferred other repeating unit include the repeating units (IV-1) to (IV-4).

The polymer (A2) may also have a repeating unit except for the repeating units (IV-1) to (IV-6) aforementioned as the other repeating unit. This repeating unit may be either one free from an aromatic ring, or one free from an ether group.

The proportion of the other repeating unit contained with respect to the total repeating units constructing the polymer (A2) is preferably no greater than 60 mol %, more preferably no greater than 40 mol %, and still more preferably no greater than 10 mol %.

The amount of the polymer (A2) contained with respect to the total solid content of the composition for film formation is preferably no less than 70% by mass, more preferably no less than 80% by mass, and still more preferably no less than 85% by mass.

Synthesis Method of Polymer (A2)

For example, in a case where the intermolecular bond-forming group (a) is included in the repeating unit (II), when k1 and k2 in the above formula (1) are both 1, the polymer (A2) can be synthesized by allowing the polyol component (A) that includes a polyol compound represented by the following formula (1-m) (hereinafter, may be also referred to as "polyol (1-m)") to react with a dihalo component (B) that includes an aromatic dihalide having an intermolecular bond-forming group (a), in the presence of an alkali metal or alkali metal compound in an organic solvent. The polymer (A2) may be obtained not only by the reaction process described above but also by allowing the polyol component (A) to react with an alkali metal or an alkali metal compound in an organic solvent to obtain an alkali metal salt of the polyol component (A) and thereafter allowing the resulting metal salt to react with the dihalo component (B). Alternatively, a component that includes an aromatic dihalide having a group that can be converted into the intermolecular bond-forming group (a) may be used in place of the dihalo component (B), and the group that can be converted into the intermolecular bond-forming group (a) may be converted into the intermolecular bond-forming group (a) after the completion of the reaction with the polyol component (A). The polyol component (A) may also include as needed, for example, a diol compound represented by the following formula (4-m), other diol compound, etc., in addition to the polyol (1-m). The dihalo component (B) is exemplified by a compound represented by the following formula (3-m), and the like.

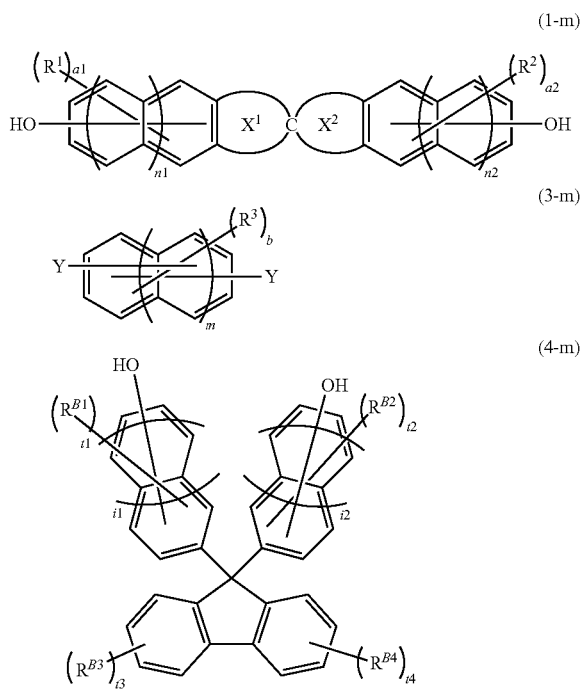

In the above formula (1-m), $X^1$, $X^2$, $R^1$, $R^2$, a1, a2, n1, and n2 are each as defined in the above formula (1).

In the above formula (3-m), $R^3$ represents the intermolecular bond-forming group (a); b is an integer of 1 to 8; m is an integer of 0 to 2; and Y represents a halogen atom.

In the above formula (4-m), $R^{B1}$ to $R^{B4}$, t1 to t4, and i1 and i2 are each as defined in the above formula (4).

Examples of the halogen atom represented by Y include a fluorine atom, a chlorine atom, a bromine atom, an iodine atom, and the like. Of these, a fluorine atom and a chlorine atom are preferred, and a fluorine atom is more preferred.

Examples of the alkali metal include lithium, sodium, potassium, and the like.

Examples of the alkali metal compound include:

alkali metal carbonates such as lithium carbonate, sodium carbonate and potassium carbonate;

alkali metal hydrogencarbonates such as lithium hydrogencarbonate, sodium hydrogencarbonate and potassium hydrogencarbonate;

alkali metal hydroxides such as lithium hydroxide, sodium hydroxide and potassium hydroxide;

alkali metal hydrides such as lithium hydride, sodium hydride and potassium hydride; and the like.

Of these, alkali metal carbonates are preferred, and potassium carbonate is more preferred. These alkali metal and alkali metal compounds may be used either alone of one type, or in combination of two or more types thereof.

It is preferred that an electron-withdrawing group is bound to the aromatic ring of the aromatic dihalide in the dihalo component (B) (for example, $R^3$ in the above formula (3-m) being an electron-withdrawing group) since the reaction of the component (A) with the component (B) can be accelerated. Examples of the electron-withdrawing group include a cyano group, a nitro group, and the like.

The amount of the alkali metal or alkali metal compound is, with respect to the —OH group included in the diol component (A), preferably 1-fold equivalents to 3-fold equivalents, more preferably 1-fold equivalents to 2-fold equivalents, and still more preferably 1-fold equivalents to 1.5-fold equivalents.

Examples of the organic solvent for use in the reaction include dimethylacetamide, dimethylformamide, N-methyl-2-pyrrolidone, 1,3-dimethyl-2-imidazolidinone, γ-butyrolactone, sulfolane, dimethyl sulfoxide, diethyl sulfoxide, dimethyl sulfone, diethyl sulfone, diisopropyl sulfone, diphenyl sulfone, diphenyl ether, benzophenone, dialkoxybenzenes in which the alkoxy group has 1 to 4 carbon atoms, and trialkoxybenzenes in which the alkoxy group has 1 to 4 carbon atoms, and the like. Among these solvents, polar organic solvents having a high relative permittivity such as N-methyl-2-pyrrolidone, dimethylacetamide, sulfolane, diphenyl sulfone and dimethyl sulfoxide are preferred. The organic solvents may be used either alone, or in combination of two or more types thereof.

In the reaction, a solvent that forms an azeotropic mixture with water such as benzene, toluene, xylene, hexane, cyclohexane, octane, chlorobenzene, dioxane, tetrahydrofuran, anisole and phenetole may be further used. These solvents may be used either alone, or in combination of two or more types thereof.

In a case where the sum of k1 and k2 is no less than 3, the amount of the polyol component (A) used is, with respect to 100 mol % in total of the polyol component (A) and the dihalo component (B), preferably no less than 45 mol % and no greater than 70 mol %, more preferably no less than 48 mol % and no greater than 65 mol %, and still more preferably no less than 53 mol % and less than 65 mol %. The amount of the dihalo component (B) used is preferably no less than 30 mol % and no greater than 55 mol %, more preferably no less than 35 mol % and no greater than 52 mol %, and still more preferably greater than 35 mol % and no greater than 47 mol %. Furthermore, in a case where each of k1 and k2 is 1, the amount of the polyol (A) used is, with respect to 100 mol % in total of the polyol component (A) and the dihalo component (B), preferably no less than 45 mol % and no greater than 75 mol %, more preferably no less than 48 mol % and no greater than 70 mol %, and still more preferably no less than 60 mol % and less than 70 mol %. The amount of the dihalo component (B) used is preferably no less than 25 mol % and no greater than 55 mol %, more preferably no less than 30 mol % and no greater than 52 mol %, and still more preferably greater than 30 mol % and no greater than 40 mol %.

The reaction temperature falls within a range of preferably 60° C. to 250° C., and more preferably 80° C. to 200° C. The reaction time falls within a range of preferably 15 min to 100 hrs, and more preferably 1 hour to 24 hours.

The polymer synthesized may be recovered from the reaction mixture by a reprecipitation technique or the like and then purified. The solvent employed in the reprecipitation is exemplified by alcohol solvents and the like, and of these, methanol is preferred.

The lower limit of the weight average molecular weight (Mw) of the polymer (A2) is preferably 600, more preferably 1,500, still more preferably 2,500, and particularly preferably 3,000. The upper limit of the Mw of the polymer (A2) is preferably 100,000, more preferably 50,000, still more preferably 15,000, and particularly preferably 6,000. When the Mw of the polymer (A2) is between the lower limit and the upper limit, the heat resistance of the film can be further increased.

The ratio (Mw/Mn) of the weight average molecular weight to the number average molecular weight of the polymer (A2) is preferably no less than 1 and no greater than 5, more preferably no less than 1 and no greater than 3, and still more preferably no less than 1 and no greater than 2.5. When the Mw/Mw ratio of the polymer (A2) falls within the above range, the flatness of the film can be further increased.

The polymer (A2) is preferably obtained by using at least two types of polyol compounds as the polyol component (A). The polymer (A2) obtained in this manner has decreased linearity of the main chain, and consequently, the solubility in a solvent such as PGMEA can be further increased. The at least two types of the polyol compounds are preferably a combination of a compound that gives the repeating unit (I), and a compound that gives a repeating unit other than the repeating unit (I). When such a combination is employed, the linearity of the main chain of the polymer (A2) can be further decreased. In a case where two types of the polyol compounds are used, a combination of a compound that gives the repeating unit (I), and a compound that gives the repeating unit (III) is preferred.

Moreover, in such a polymer (A2), it is preferred that repeating units derived from at least two types of polyol compounds are arranged at random. In other words, it is preferred that the polymerization reaction for synthesizing the polymer (A2) is random copolymerization. When two types of the repeating units are randomly arranged in the polymer (A2), the linearity of the main chain is further decreased, and consequently, the solubility in a solvent such as PGMEA can be further increased.

(B) Solvent

The composition for film formation contains the solvent (B). The solvent (B) is not particularly limited as long as the solvent (B) can dissolve or disperse therein the compound (A) and the optional component contained as needed.

The solvent (B) is exemplified by an alcohol solvent, a ketone solvent, an amide solvent, an ether solvent, an ester solvent, and the like. The solvent (B) may be used either alone of one type, or in combination of two or more types thereof.

Examples of the alcohol solvent include:

monohydric alcohol solvents such as methanol, ethanol, n-propanol, iso-propanol, n-butanol, iso-butanol, sec-butanol, t-butanol, n-pentanol, iso-pentanol, sec-pentanol and t-pentanol;

polyhydric alcohol solvents such as ethylene glycol, 1,2-propylene glycol, 1,3-butylene glycol, 2,4-pentanediol, 2-methyl-2,4-pentanediol, 2,5-hexanediol and 2,4-heptanediol; and the like.

Examples of the ketone solvent include:

aliphatic ketone solvents such as acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione; acetonylacetone; diacetone alcohol; acetophenone; methyl n-amyl ketone; and the like.

Examples of the amide solvent include:

cyclic amide solvents such as 1,3-dimethyl-2-imidazolidinone and N-methyl-2-pyrrolidone;

chain amide solvents such as formamide, N-methylformamide, N,N-dimethylformamide, N,N-diethylformamide, acetamide, N-methylacetamide, N,N-dimethylacetamide and N-methylpropionamide; and the like.

Examples of the ether solvent include:

polyhydric alcohol partial ether solvents such as ethylene glycol monomethyl ether, ethylene glycol monoethyl ether and ethylene glycol dimethyl ether;

polyhydric alcohol partial ether acetate solvents such as ethylene glycol monomethyl ether acetate, ethylene glycol monoethyl ether acetate, propylene glycol monomethyl ether acetate (PGMEA) and propylene glycol monoethyl ether acetate;

dialiphatic ether solvents such as diethyl ether, dipropyl ether, dibutyl ether, butyl methyl ether, butyl ethyl ether and diisoamyl ether;

aliphatic-aromatic ether solvents such as anisole and phenyl ethyl ether;

cyclic ether solvents such as tetrahydrofuran, tetrahydropyran and dioxane; and the like.

Examples of the ester solvent include, carboxylic acid ester solvents such as methyl lactate, ethyl lactate, methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate and ethyl acetoacetate;

lactone solvents such as γ-butyrolactone and γ-valerolactone;

carbonic acid ester solvents such as diethyl carbonate and propylene carbonate; and the like.

Of these, ether solvents, ketone solvents and ester solvents are preferred, and ether solvents are more preferred. As the ether solvent, polyhydric alcohol partial ether acetate solvents and dialiphatic ether solvents are preferred, polyhydric alcohol partial ether acetate solvents are more preferred, propylene glycol monoalkyl ether acetate is still more preferred, and PGMEA is particularly preferred. As the ketone solvent, methyl n-pentyl ketone and a cyclic ketone solvent are preferred, cyclohexanone and cyclopentanone are more preferred, and cyclohexanone is still more preferred. As the ester solvent, a carboxylic acid ester solvent and a lactone solvent are preferred, a carboxylic acid ester solvent is more preferred, and ethyl lactate is still more preferred.

Of these, the polyhydric alcohol partial ether acetate solvents are preferred, and among them, propylene glycol monoalkyl ether acetate, particularly PGMEA, is preferably included in the solvent (B) since the coating properties of the composition for film formation onto a substrate such as a silicon wafer can be improved. Since the compound (A) contained in the composition for film formation has a greater solubility in a solvent such as PGMEA, as a result of including the polyhydric alcohol partial ether acetate solvent in the solvent (B), the composition for film formation can achieve superior coating properties. The percentage content of the polyhydric alcohol partial ether acetate solvent in the solvent (B) is preferably no less than 20% by mass, and more preferably no less than 40% by mass.

In a case where each of k1 and k2 is 1, when the polymer (A2) has an Mw of, for example, no less than about 2,000, the solvent (B) is preferably a mixed solvent containing a polyhydric alcohol partial ether acetate solvent, and a ketone solvent and/or an ester solvent in light of an increase of the solubility of the polymer (A2) in the solvent (B), and an improvement of the coating properties and the like of the composition for film formation. In this instance, the total of the percentage contents of the ketone solvent and the ester solvent in the solvent (B) is preferably no less than 20% by mass, more preferably no less than 40% by mass, and still more preferably no less than 70% by mass.

(C) Acid Generating Agent

The acid generating agent (C) is a component that generates an acid therefrom by an action of heat and/or light and facilitates crosslinking of molecules of the compound (A). When the composition for film formation contains the acid generating agent (C), the crosslinking reaction of the compound (A) may be facilitated and the hardness of the formed film can be further enhanced. The acid generating agent (C) may be used either alone of one type, or in combination of two or more types thereof.

The acid generating agent (C) is exemplified by onium salt compounds, N-sulfonyloxyimide compounds, and the like.

Examples of the onium salt compound include sulfonium salts, tetrahydrothiophenium salts, iodonium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, and the like.

Of these, the acid generating agent (C) is preferably an onium salt compound, more preferably an iodonium salt, and still more preferably bis(4-t-butylphenyl)iodonium nonafluoro-n-butanesulfonate.

The amount of the acid generating agent (C) contained with respect to 100 parts by mass of the compound (A) is preferably 0 parts by mass to 20 parts by mass, more preferably 1 part by mass to 15 parts by mass, and still more preferably 3 parts by mass to 10 parts by mass. When the amount of the acid generating agent (C) contained falls within the above range, the crosslinking reaction of the compound (A) may be more effectively facilitated.

(D) Crosslinking Agent

The crosslinking agent (D) forms a crosslinking bond between molecules of the component such as the compound (A) in the composition for film formation by an action of heat and/or an acid. When the composition for film formation contains the crosslinking agent (D), the hardness of the formed film can be increased. The crosslinking agent (D) may be used either alone of one type, or in combination of two or more types thereof.

Examples of the crosslinking agent (D) include polyfunctional (meth)acrylate compounds, epoxy compounds, hydroxymethyl group-substituted phenol compounds, alkoxyalkyl group-containing phenol compounds, compounds having an alkoxyalkylated amino group, random copolymers of acenaphthylene with hydroxymethylacenaphthylene represented by the following formula (6-P), compounds represented by the following formulae (6-1) to (6-12), and the like.

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl)isocyanurate di(meth)acrylate, and the like.

Examples of the epoxy compound include novolak epoxy resins, bisphenol epoxy resins, alicyclic epoxy resins, aliphatic epoxy resins, and the like.

Examples of the hydroxymethyl group-substituted phenol compound include 2-hydroxymethyl-4,6-dimethylphenol, 1,3,5-trihydroxymethylbenzene, 3,5-dihydroxymethyl-4-methoxytoluene (2,6-bis(hydroxymethyl)-p-cresol), and the like.

Examples of the alkoxyalkyl group-containing phenol compound include methoxymethyl group-containing phenol compounds, ethoxymethyl group-containing phenol compounds, and the like.

Examples of the compound having an alkoxyalkylated amino group include nitrogen-containing compounds having a plurality of active methylol groups in a molecule thereof wherein the hydrogen atom of the hydroxyl group of at least one of the methylol groups is substituted with an alkyl group such as a methyl group or a butyl group, and the like; examples thereof include (poly)methylolated melamines, (poly)methylolated glycolurils, (poly)methylolated benzoguanamines, (poly)methylolated ureas, and the like. It is to be noted that a mixture constituted with a plurality of substituted compounds described above may be used as the compound having an alkoxyalkylated amino group, and the compound having an alkoxyalkylated amino group may contain an oligomer component formed through partial self-condensation thereof.

(6-P)

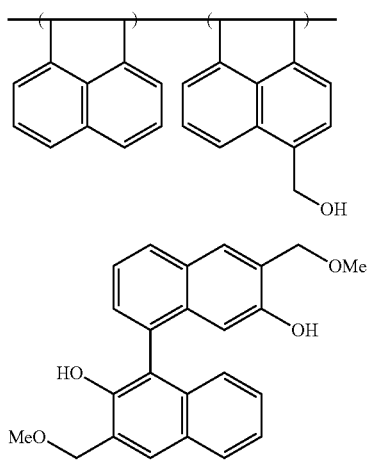

(6-1)

(6-2)
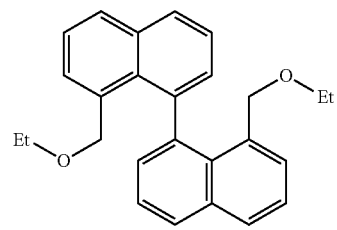

(6-3)
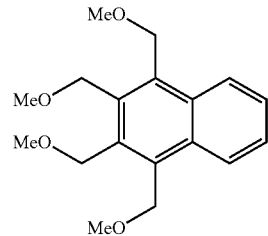

(6-4)
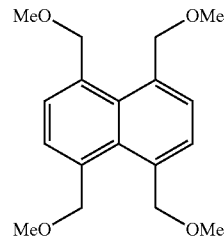

(6-5)
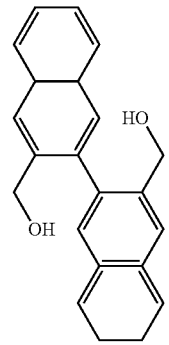

(6-6)
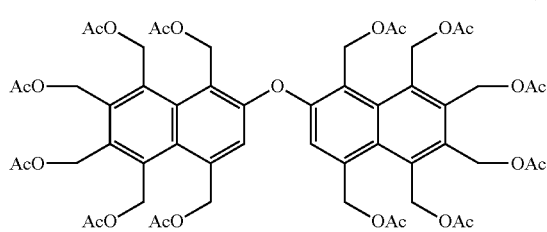

(6-7)
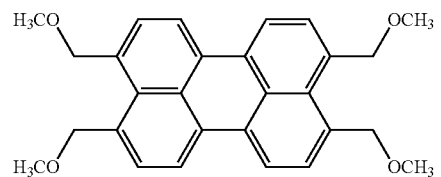

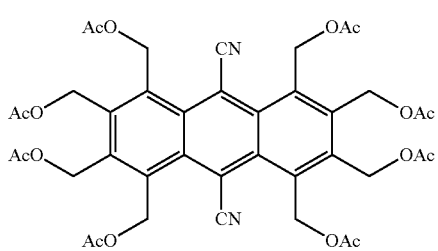

(6-8)

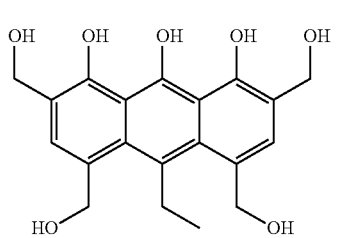

(6-9)

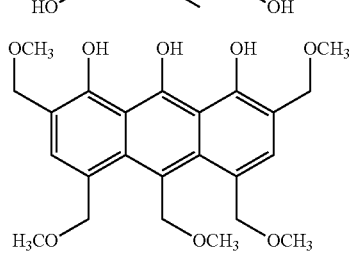

(6-10)

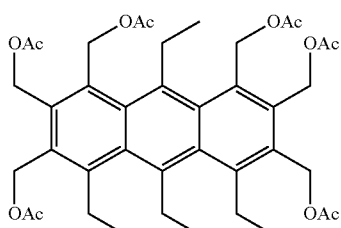

(6-11)

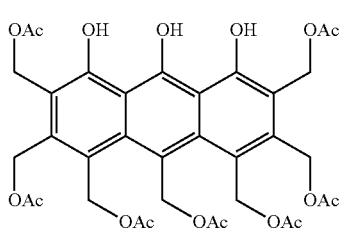

(6-12)

In the above formulae (6-6), (6-8), (6-11) and (6-12), Ac represents an acetyl group.

It is to be noted that the compounds represented by the above formulae (6-1) to (6-12) each may be synthesized with reference to the following documents.

The compound represented by the formula (6-1):
Guo, Qun-Sheng; Lu, Yong-Na; Liu, Bing; Xiao, Jian; and Li, Jin-Shan, Journal of Organometallic Chemistry, 2006, vol. 691, #6, p. 1282-1287.

The compound represented by the formula (6-2):
Badar, Y. et al., Journal of the Chemical Society, 1965, p. 1412-1418.

The compound represented by the formula (6-3):
Hsieh, Jen-Chieh; and Cheng, Chien-Hong, Chemical Communications (Cambridge, United Kingdom), 2008, #2, p. 2992-2994.

The compound represented by the formula (6-4):
Japanese Unexamined Patent Application, Publication No. H5-238990.

The compound represented by the formula (6-5):
Bacon, R. G. R.; and Bankhead, R., Journal of the Chemical Society, 1963, p. 839-845.

The compounds represented by the formulae (6-6), (6-8), (6-11) and (6-12):
Macromolecules, 2010, vol. 43, p. 2832-2839.

The compounds represented by the formulae (6-7), (6-9) and (6-10): Polymer Journal, 2008, vol. 40, No. 7, p. 645-650; and Journal of Polymer Science: Part A, Polymer Chemistry, Vol. 46, p. 4949-4958.

Among these crosslinking agents (D), a methoxymethyl group-containing phenol compound, a compound having an alkoxyalkylated amino group, and a random copolymer of acenaphthylene with hydroxymethylacenaphthylene are preferred, a compound having an alkoxyalkylated amino group is more preferred, and 1,3,4,6-tetra(methoxymethyl)glycoluril is still more preferred.

The amount of the crosslinking agent (D) contained with respect to 100 parts by mass of the compound (A) is preferably 0 to 100 parts by mass, more preferably 0.5 parts by mass to 50 parts by mass, still more preferably 1 part by mass to 30 parts by mass, and particularly preferably 3 parts by mass to 20 parts by mass or less. When the amount of the crosslinking agent (D) contained falls within the above range, the crosslinking reaction of the compound (A) may be allowed to cause more effectively.

Other Optional Component

The other optional component is exemplified by other resin, a surfactant, an adhesion aid, and the like.

Other Resin

The composition for film formation may also contain other resin.

The other resin is exemplified by a naphthol novolak resin, a carbon-carbon triple bond-containing naphthol novolak resin, an acenaphthylene resin, a vinylnaphthalene resin, and the like may be exemplified.

Examples of the naphthol novolak resin include resins having a structural unit represented by the following formula, and the like.

Resins having a repeating unit represented by the following formula (7-1) as an essential constituent unit, and further having at least one repeating unit selected from the group consisting of a repeating unit represented by the following formula (7-2), a repeating unit represented by the following formula (7-3) and a repeating unit represented by the following formula (7-4).

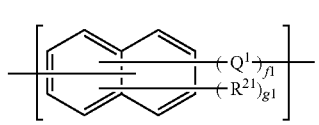

(7-1)

In the above formula (7-1), $R^{21}$ represents a hydroxyl group or hydrogen; g1 is an integer of 0 to 6, wherein in a case where g1 is 2 to 6, a plurality of $R^{21}$s may be identical or different; $Q^1$ represents a substitutable alkylene group having 1 to 20 carbon atoms, or a substitutable arylene group having 6 to 14 carbon atoms; f1 is an integer of 1 to 8, wherein in a case where f1 is 2 to 8, a plurality of $Q^1$s may be identical or different; and the sum of g1 and f1 is an integer of 1 to 8.

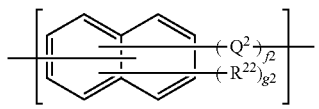
(7-2)

In the above formula (7-2), $R^{22}$ represents a substitutable alkyl group having 1 to 6 carbon atoms, a substitutable alkenyl group having 1 to 6 carbon atoms, a substitutable alkoxy group having 1 to 6 carbon atoms, a substitutable alkoxycarbonyl group having 2 to 10 carbon atoms, a substitutable aryl group having 6 to 14 carbon atoms, or a glycidyl ether group; g2 is an integer of 0 to 6, wherein in a case where g2 is 2 to 6, a plurality of $R^{22}$s may be identical or different; $Q^2$ represents a substitutable alkylene group having 1 to 20 carbon atoms, or a substitutable arylene group having 6 to 14 carbon atoms; f2 is an integer of 1 to 8, wherein in a case where f2 is 2 to 8, a plurality of $Q^2$s may be identical or different; and the sum of g2 and f2 is an integer of 1 to 8.

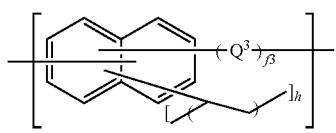
(7-3)

In the above formula (7-3), $Q^3$ represents a substitutable alkylene group having 1 to 20 carbon atoms, or a substitutable arylene group having 6 to 14 carbon atoms; f3 is an integer of 1 to 8, wherein in a case where f3 is 2 to 8, a plurality of $Q^3$s may be identical or different; h is an integer of 0 to 2; and the sum of f3 and h is an integer of 1 to 8.

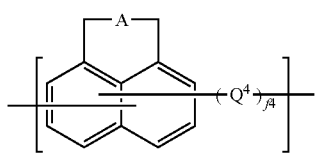
(7-4)

In the above formula (7-4), A represents a single bond or a double bond; $Q^4$ represents a substitutable alkylene group having 1 to 20 carbon atoms, or a substitutable arylene group having 6 to 14 carbon atoms; and f4 is an integer of 1 to 6.

In addition, examples of the naphthol novolak resin also include resins having a structural unit represented by the following formula (8), and the like.

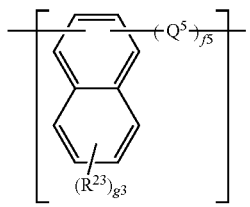
(8)

In the above formula (8), $R^{23}$ represents a hydroxyl group, a substitutable alkyl group having 1 to 6 carbon atoms, a substitutable alkoxy group having 1 to 6 carbon atoms, a substitutable alkoxycarbonyl group having 2 to 10 carbon atoms, a substitutable aryl group having 6 to 14 carbon atoms, or a substitutable glycidyl ether group having 2 to 6 carbon atoms; g3 is an integer of 0 to 6, wherein in a case where g3 is 2 to 6, a plurality of $R^{23}$s may be identical or different; $Q^5$ represents a methylene group, a substitutable alkylene group having 2 to 20 carbon atoms, a substitutable arylene group having 6 to 14 carbon atoms, or an alkylene ether group; f5 is an integer of 1 to 8, wherein in a case where f5 is 2 to 8, a plurality of $Q^5$s may be identical or different; and the sum of g3 and f5 is an integer of 1 to 8.

Examples of the carbon-carbon triple bond-containing naphthol novolak resin include resins having a structural unit represented by the following formula (9), and the like.

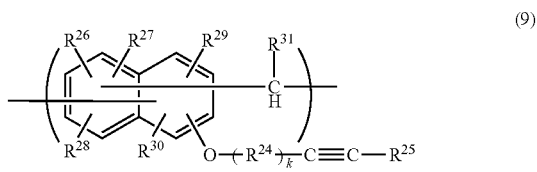
(9)

In the formula (9), k is 0 or 1; $R^{24}$ represents a methylene group which may be substituted, an alkylene group which may be substituted having 2 to 20 carbon atoms, or an arylene group which may be substituted having 6 to 20 carbon atoms; $R^{25}$ represents a hydrogen atom, an alkyl group which may be substituted having 1 to 20 carbon atoms, or an aryl group which may be substituted having 6 to 20 carbon atoms; $R^{26}$ to $R^{30}$ represent a hydroxyl group, an alkyl group which may be substituted having 1 to 6 carbon atoms, an alkoxy group which may be substituted having 1 to 6 carbon atoms, an alkoxycarbonyl group which may be substituted, having 6 to 14 carbon atoms, an aryl group which may be substituted having 2 to 10 carbon atoms, or a glycidyl ether group which may be substituted having 2 to 6 carbon atoms; and $R^{31}$ represents a hydrogen atom, a linear, branched or cyclic alkyl group having 1 to 10 carbon atoms, a linear, branched or cyclic alkyl ether group having 1 to 10 carbon atoms, or an aryl group having 6 to 10 carbon atoms.

Examples of the acenaphthylene resin include resins having a structural unit represented by the following formula (10), and the like.

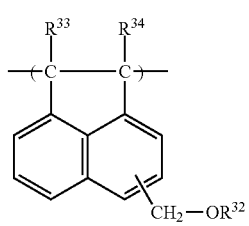
(10)

In the above formula (10), $R^{32}$ represents a hydrogen atom or a monovalent organic group; and $R^{33}$ and $R^{34}$ each independently represent a monovalent atom or a monovalent organic group.

Examples of the vinylnaphthalene resin include resins which have structural units represented by the following formula (11-1) and formula (11-2), and which may further have a structural unit derived from acenaphthylene which may have a substituent, a structural unit derived from a (meth)acrylic acid ester, etc., and the like.

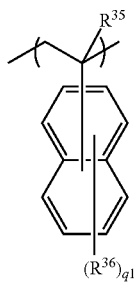

(11-1)

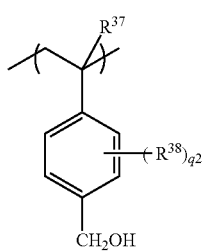

(11-2)

In the above formula (11-1) and formula (11-2), $R^{35}$ and $R^{37}$ each independently represent a hydrogen atom, a fluorine atom, a methyl group or a trifluoromethyl group; $R^{36}$ and $R^{38}$ each independently represent an alkyl group; and q1 and q2 are each independently an integer of 0 to 7.

The other resin may have one of, or two or more of these structural units in combination.

The lower limit of the other resin contained with respect to 100 parts by mass of the amount of the compound (A) is preferably 1 part by mass, more preferably 5 parts by mass, and still more preferably 10 parts by mass. The upper limit of the amount is preferably 500 parts by mass, more preferably 200 parts by mass, and still more preferably 100 parts by mass. The other resin may be used either alone of one type, or two or more types thereof may be used in combination.

Surfactant

When the composition for film formation contains a surfactant, the coating properties can be improved, and as a result, uniformity of the surface of the film provided may be improved, and occurrence of the unevenness of coating can be inhibited. The surfactant may be used either alone of one type, or in combination of two or more types thereof.

Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonylphenyl ether, polyethylene glycol dilaurate, polyethylene glycol distearate, and the like. Also, examples of commercially available products include KP341 (Shin-Etsu Chemical Co., Ltd.), Polyflow No. 75 and No. 95 (each available from Kyoeisha Chemical Co., Ltd.), F-top EF101, EF204, EF303 and EF352 (each available from Tochem Products Co. Ltd.), Megaface F171, F172 and F173 (each available from Dainippon Ink And Chemicals, Incorporated), Fluorad FC430, FC431, FC135 and FC93 (each available from Sumitomo 3M Limited), ASAHI GUARD AG710, Surflon S382, SC101, SC102, SC103, SC104, SC105 and SC106 (each available from Asahi Glass Co., Ltd.), and the like.

The amount of the surfactant contained with respect to 100 parts by mass of the compound (A) is preferably 0 parts by mass to 10 parts by mass, more preferably 0.001 parts by mass to 5 parts by mass, and still more preferably 0.005 parts by mass to 1 part by mass. When the amount of the surfactant contained falls within the above range, the coating properties of the composition for film formation can be further improved.

Adhesion Aid

The adhesion aid is a component that improves adhesiveness to an underlying material. When the composition for film formation contains the adhesion aid, the adhesiveness of the formed film to a substrate, etc., as an underlying material can be improved. The adhesion aid may be used either alone of one type, or in combination of two or more types thereof.

Well-known adhesion aids may be used as the adhesion aid.

The amount of the adhesion aid contained with respect to 100 parts by mass of the compound (A) is preferably 0 parts by mass to 10 parts by mass, more preferably 0.01 parts by mass to 10 parts by mass, and still more preferably 0.01 parts by mass to 5 parts by mass.

Preparation Method of Composition for Film Formation

The composition for film formation may be prepared by mixing the compound (A) and the solvent (B), and as needed, the acid generating agent (C), the crosslinking agent (D) and other optional component(s) in a predetermined ratio. The solid content concentration of the composition is preferably 0.1% by mass to 50% by mass, more preferably 1% by mass to 30% by mass, still more preferably 3% by mass to 20% by mass, and particularly preferably 5% by mass to 15% by mass.

The composition for film formation enables a film that is superior in heat resistance and flatness to be formed as described above, and is thus suitable for film formation. Among compositions for use in film formation, the aforementioned composition for film formation can be particularly suitably used for resist underlayer film formation in multilayer resist processes and the like for which these characteristics are demanded at a high level.

Method for Producing Patterned Substrate

The method for producing a patterned substrate according to the present invention includes:

the resist underlayer film-forming step, the resist pattern-forming step, and the substrate pattern-forming step. The resist underlayer film is formed from the composition for film formation.

According to the method for producing a patterned substrate, a resist underlayer film that is superior in the heat resistance and flatness can be readily formed, and formation of a favorable pattern is enabled through the use of the resist underlayer film having such superior characteristics.

Resist Underlayer Film-Forming Step

In this step, a resist underlayer film is formed on the upper face side of a substrate from the composition for film formation. The formation of the resist underlayer film is typically carried out by applying the composition for film formation on the upper face side of the substrate to provide a coating film, and heating the coating film.

Examples of the substrate include a silicon wafer, a wafer coated with aluminum, and the like. Moreover, the method for coating the composition for film formation on the substrate is not particularly limited, and for example, an appropriate process such as a spin-coating process, a cast coating process and a roll coating process may be employed.

Heating of the coating film is typically carried out in an ambient air. The heating temperature falls within a range of typically 150° C. to 500° C., and preferably 200° C. to 450° C. When the heating temperature is less than 150° C., the oxidative crosslinking may not sufficiently proceed, and characteristics necessary for use in the resist underlayer film may not be exhibited. The heating time falls within a range of typically 30 sec to 1,200 sec, and preferably 60 sec to 600 sec.

An oxygen concentration in the heating is preferably no less than 5 vol %. When the oxygen concentration in the heating is low, the oxidative crosslinking of the resist underlayer film may not sufficiently proceed, and characteristics necessary for use in the resist underlayer film may not be exhibited.

The coating film may be preheated at a temperature of 60° C. to 250° C. before being heated at a temperature of 150° C. to 500° C. Although the preheating time in the preheating is not particularly limited, the preheating time is preferably 10 sec to 300 sec, and more preferably 30 sec to 180 sec. When the preheating is carried out to preliminarily evaporate a solvent and make the film dense, dehydrogenation reaction may efficiently proceed.

It is to be noted that in the resist underlayer film formation method, the resist underlayer film is typically formed through the heating of the coating film; however, in a case where the composition for forming a resist underlayer film contains a photo acid generating agent, the resist underlayer film may also be formed by hardening the coating film through a combination of an exposure and heating. Radioactive ray used for the exposure may be appropriately selected from visible rays, ultraviolet rays, far ultraviolet rays, X-rays, electron beams, γ radiations, molecular beams, ion beams, and the like depending on the type of the photo acid generating agent.

The film thickness of the resist underlayer film formed is preferably 0.05 μm to 5 μm, and more preferably 0.1 μm to 3 μm.

After the resist underlayer film-forming step, the method may further include as needed, the step of forming an intermediate layer (intermediate film) on the resist underlayer film. The intermediate layer as referred to means a layer having a function that is exhibited or not exhibited by the resist underlayer film and/or the resist film in resist pattern formation in order to further enhance the function exhibited by the resist underlayer film and/or the resist film, or to impart to the resist underlayer film and/or the resist film a function not exhibited thereby. For example, when an antireflective film is provided as the intermediate layer, an antireflecting function of the resist underlayer film may be further enhanced.

The intermediate layer may be formed from an organic compound and/or an inorganic oxide. Examples of the organic compound include commercially available products such as "DUV-42", "DUV-44", "ARC-28" and "ARC-29" (each available from Brewer Science); "AR-3" and "AR-19" (each available from Lohm and Haas Company); and the like. Examples of the inorganic oxide include commercially available products such as "NFC SOG01", "NFC SOG04", "NFC SOG080" (each available from JSR), and the like. Moreover, polysiloxanes, titanium oxides, alumina oxides, tungsten oxides, and the like that are provided through a CVD process may be used.

The method for providing the intermediate layer is not particularly limited, and for example, a coating method, a CVD technique, or the like may be employed. Of these, a coating method is preferred. In a case where the coating method is employed, the intermediate layer may be successively provided after the resist underlayer film is provided. Moreover, the film thickness of the intermediate layer is not particularly limited and may be appropriately selected depending on the function required for the intermediate layer, and the film thickness of the intermediate layer falls within a range of preferably 10 nm to 3,000 nm, and more preferably 20 nm to 300 nm.

Resist Pattern-Forming Step

In this step, a resist pattern is formed directly or indirectly on the resist underlayer film. This step may be carried out by, for example, using a resist composition.

When the resist composition is used, specifically, the resist film is formed by coating the resist composition such that a resultant resist film has a predetermined film thickness and thereafter subjecting the resist composition to prebaking to evaporate the solvent in the coating film.

Examples of the resist composition include a positive or negative chemically amplified resist composition that contains a photo acid generating agent; a positive type resist composition that is constituted with an alkali-soluble resin and a quinone diazide based photosensitizing agent; a negative type resist that is constituted with an alkali-soluble resin and a crosslinking agent; and the like.

The total solid content concentration in the resist composition typically falls within a range of 1% by mass to 50% by mass. Moreover, the resist composition is generally used for providing a resist film, for example, after being filtered through a filter with a pore size of about 0.2 μm. It is to be noted that a commercially available resist composition may be used as is in this step.

The method for coating the resist composition is not particularly limited, and examples thereof include a spin-coating method, and the like. Moreover, the temperature of the prebaking may be appropriately adjusted depending on the type of the resist composition used and the like, and the temperature of the prebaking falls within a range of generally 30° C. to 200° C., and preferably 50° C. to 150° C.

Next, the resist film formed is exposed by selective irradiation with a radioactive ray. The radioactive ray for use in the exposure may be appropriately selected from visible rays, ultraviolet rays, far ultraviolet rays, X-rays, electron beams, γ radiations, molecular beams, ion beams and the like, depending on the type of the photo acid generating agent used in the resist composition. Among these, far ultraviolet rays are preferred, and a KrF excimer laser beam (248 nm), an ArF excimer laser beam (193 nm), an $F_2$ excimer laser beam (wavelength: 157 nm), a $Kr_2$ excimer laser beam (wavelength: 147 nm), an ArKr excimer laser beam (wavelength: 134 nm) and extreme-ultraviolet rays (wavelength: 13 nm, etc.) are more preferred.

Post-baking may be carried out after the exposure for the purpose of improving a resolution, a pattern profile, developability, and the like. The temperature of the post-baking may be appropriately adjusted depending on the type of the resist composition used and the like, and the temperature of the post-baking falls within a range of typically 50° C. to 200° C., and preferably 70° C. to 150° C.

Next, the exposed resist film is developed with a developer solution to form a resist pattern. The developer solution may be appropriately selected depending on the type of the resist composition used. In the case of a development with an alkali, examples of the developer solution include an alkaline aqueous solution that contains sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like. An appropriate amount of a water soluble organic solvent, e.g., an alcohol such as methanol and ethanol, a surfactant, and the like may be added to the alkaline aqueous solution. Alternatively, in the case of a development with an organic solvent, examples of the developer solution include a variety of organic solvents exemplified as the solvent (B) described above, and the like.

A predetermined resist pattern is formed by the development with the developer solution, followed by washing and drying.

In carrying out the resist pattern-forming step, without using the resist composition as described above, other process may be employed, for example, a nanoimprint method may be adopted, or a directed self-assembling composition may be used.

Substrate Pattern-Forming Step

In this step, at least the resist underlayer film and the substrate are etched using the resist pattern as a mask such that the substrate has a pattern. In a case where the intermediate layer is not provided, the resist underlayer film and the substrate are subjected to etching sequentially in this order, whereas in a case where the intermediate layer is provided, the intermediate layer, the resist underlayer film and the substrate are subjected to etching sequentially in this order. The etching procedure may be exemplified by dry etching, wet etching, and the like. Of these, dry etching is preferred. For example, gas plasma such as oxygen plasma and the like may be used in the dry etching. After the etching, the substrate having a predetermined pattern can be obtained.

Film

The film according to the present invention is formed from the composition for film formation. Since the film is formed from the composition for film formation described above, formation of a film that is superior in heat resistance and flatness is enabled while general characteristics such as etching resistance are maintained. Since the film has the aforementioned characteristics, it can be suitably used as a resist underlayer film, and the like.

Compound

The compound according to the present invention has the partial structure (I), and has the intermolecular bond-forming group.

The compound can be suitably used as a component of the composition for film formation, and according to this composition for film formation, formation of a film that is superior in heat resistance and flatness is enabled while general characteristics such as etching resistance are maintained. The compound corresponds to the compound (A) contained in the aforementioned composition for film formation, and the description has been presented as in the foregoing.

EXAMPLES

Hereinafter, the embodiments of the present invention will be described in more detail by way of Examples, but the present invention is not in any way limited to the Examples. Each physical property value was determined according to the method described below.

Mw and Mn

The Mw and the Mn of the polymer were determined by gel permeation chromatography (detector: differential refractometer) using GPC columns ("G2000HXL"×2 and "G3000HXL"×1) available from Tosoh Corporation and monodisperse polystyrenes as a standard under analytical conditions involving the flow rate of 1.0 mL/min, the elution solvent of tetrahydrofuran and the column temperature of 40° C.

Film Thickness

The film thickness was determined by using a spectroscopic ellipsometer ("M2000D", available from J. A. WOOLLAM Co.).

Synthesis of Compound (A)

Synthesis of Compound (A1)

Example 1

Synthesis of Compound (A1-1)

Into a separable flask equipped with a thermometer, 15 parts by mass of the following compound (M-1) and 17 parts by mass of the compound (M-2), 2 parts by mass of sodium hydride as the basic compound, and 50 parts by mass of THF as the solvent were charged in a nitrogen atmosphere, and the reaction was carried out with stirring at 0° C. for 3 hrs to obtain a reaction mixture. This reaction mixture was added to a mixture of methanol and water to permit reprecipitation, and the resultant precipitates were dried to obtain the following compound (M-4). Next, the resultant compound (M-4), 17 parts by mass of the following compound (M-3), 17 parts by mass of potassium carbonate as the basic compound, and 80 parts by mass of dimethylacetamide as the solvent were mixed, and the condensation reaction was carried out with stirring at 140° C. for 4 hrs to obtain a reaction mixture. After this reaction mixture was filtered, methanol was added to the reaction mixture to permit reprecipitation, and the resultant precipitates were dried to obtain the following compound (M-5). Then, the resultant compound (M-5), 33 parts by mass of propargyl bromide, 19 parts by mass of potassium carbonate as the basic compound, and 80 parts by mass of dimethylacetamide as the solvent were mixed, and the reaction was carried out with stirring at 60° C. for 4 hrs to obtain a reaction mixture. After this reaction mixture was filtered, methanol was added to the reaction mixture to permit reprecipitation, and the resultant precipitates were dried to obtain 60 parts by mass of the following compound (A1-1).

(M-1)
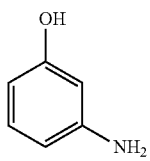
(M-2)
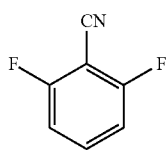
(M-3)
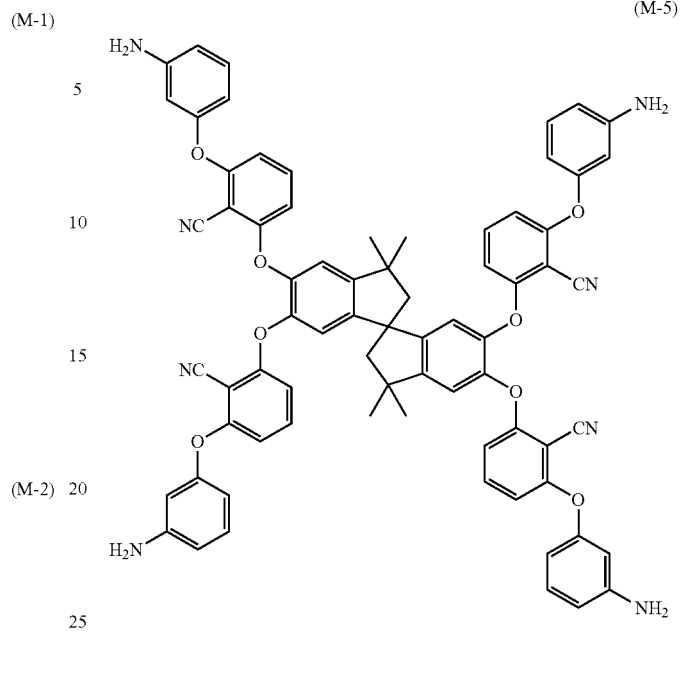
(M-4)
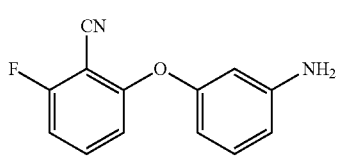
(M-5)
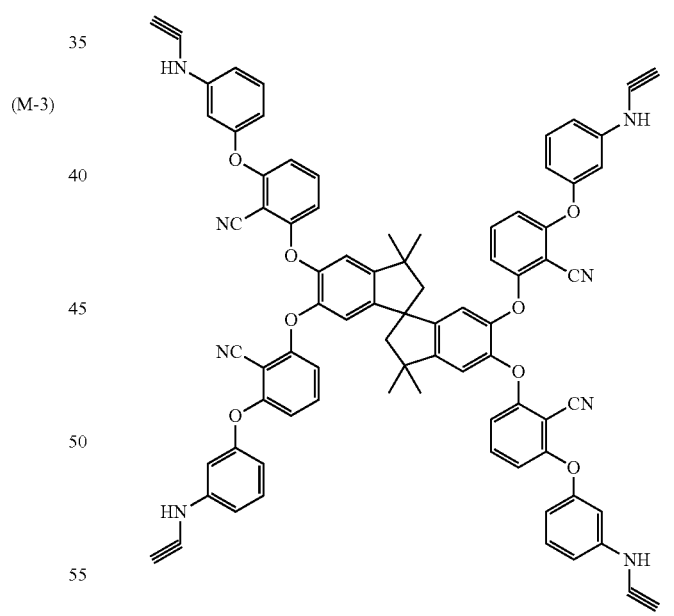
(A1-1)
Examples 2 to 4
Synthesis of Compounds (A1-2) to (A1-4)
The following compounds (A1-2) to (A1-4) were synthesized according to the same reaction scheme as that in Example 1 except that the materials were changed in Example 1.

(A1-2)
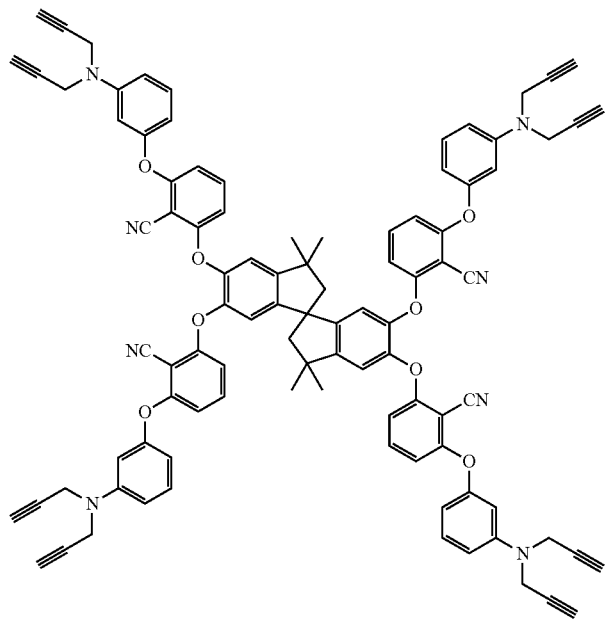
(A1-3)
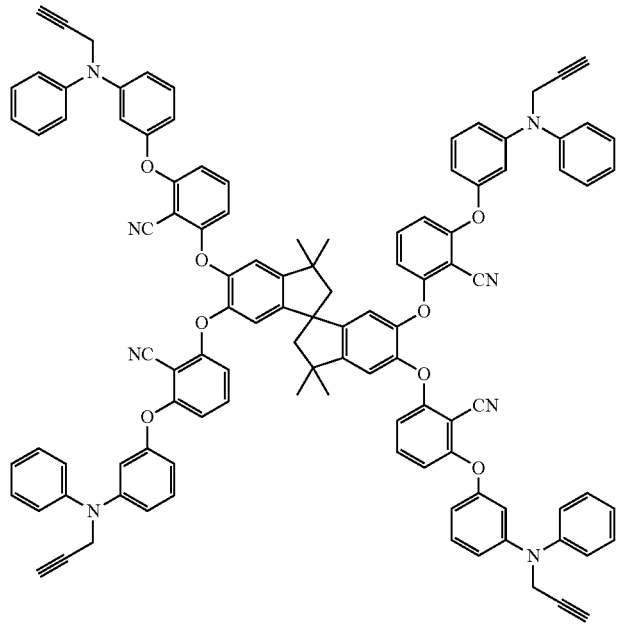

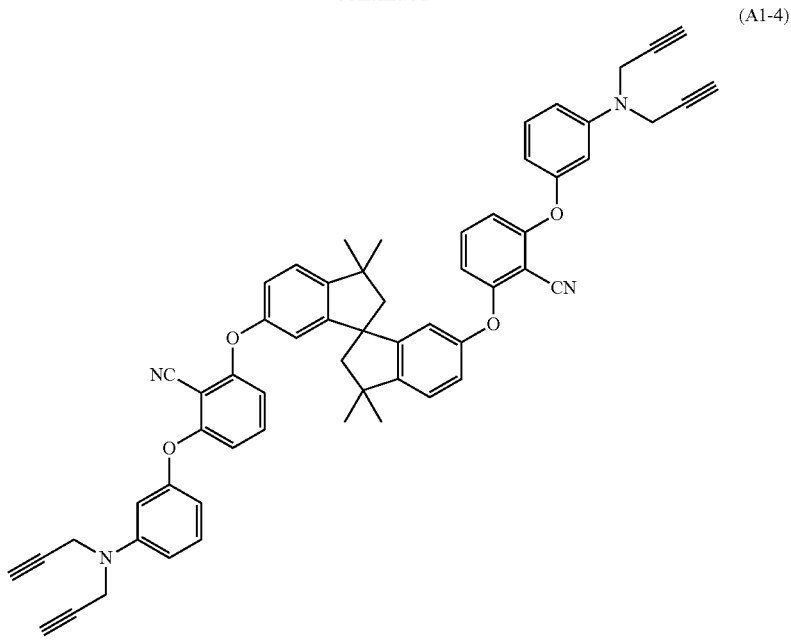 [SMILES: C#CCN(CC#C)c1cccc(Oc2cccc(Oc3ccc4c(c3)C3(CC4(C)C)CC(C)(C)c4ccc(Oc5cccc(Oc6cccc(N(CC#C)CC#C)c6)c5C#N)cc43)c2C#N)c1]

(A1-4)

Example 5

Synthesis of Compound (A1-5)

Into a separable flask equipped with a thermometer, 15 parts by mass of the following compound (M-6) and 17 parts by mass of the compound (M-7), 2 parts by mass of sodium hydride as the basic compound, and 50 parts by mass of THF as the solvent were charged in a nitrogen atmosphere, and the reaction was carried out with stirring at 0° C. for 3 hrs to obtain a reaction mixture. A mixture of methanol and water was added to this reaction mixture to permit reprecipitation, and the resultant precipitates were dried to obtain the following compound (M-9). The resultant compound (M-9), 17 parts by mass of the following compound (M-8), 17 parts by mass of potassium carbonate as the basic compound, and 80 parts by mass of dimethylacetamide as the solvent were mixed, and the condensation reaction was carried out with stirring at 140° C. for 4 hrs to obtain a reaction mixture. After this reaction mixture was filtered, methanol was added to the reaction mixture to permit reprecipitation, and the resultant precipitates were dried to obtain 60 parts by mass of the following compound (A1-5).

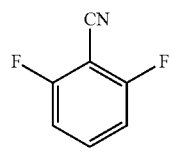

(M-6)

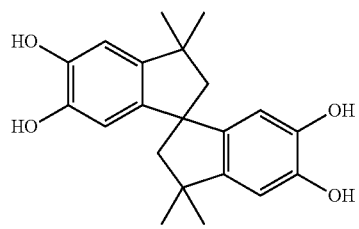

(M-7)

(M-8)

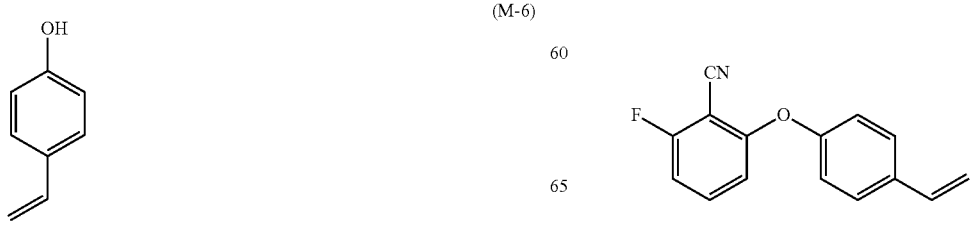

(M-9)

(A1-5)

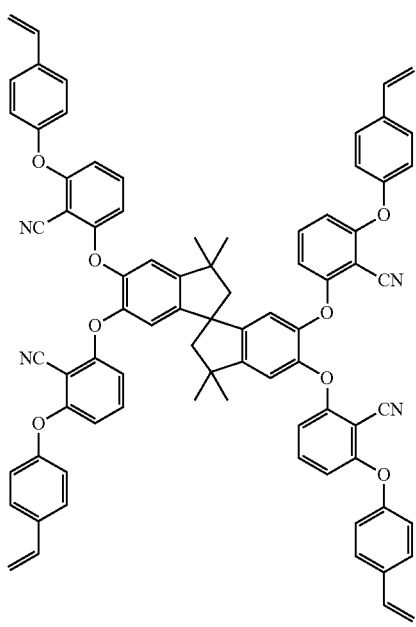

(A1-7)

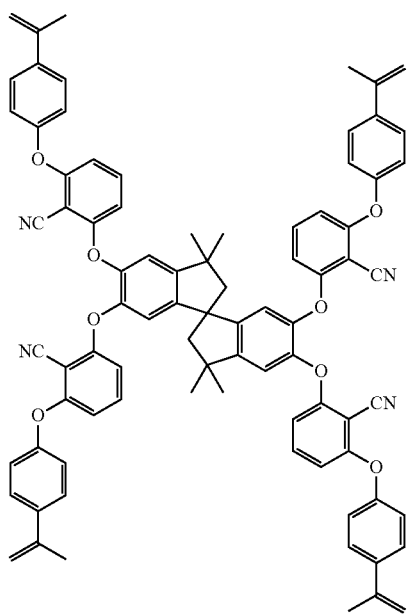

(A1-8)

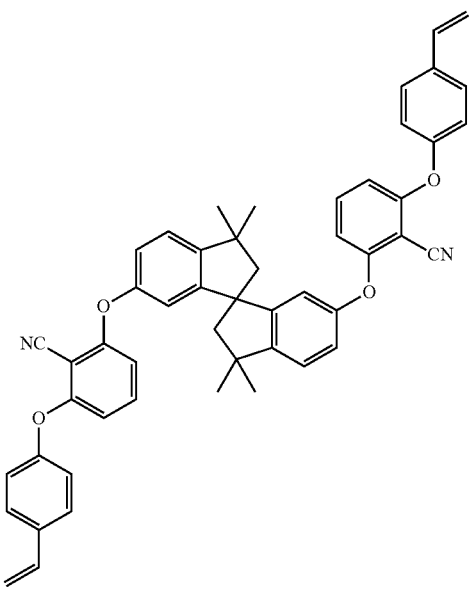

Examples 6 to 8

Synthesis of Compounds (A1-6) to (A1-8)

The following compounds (A1-6) to (A1-8) were synthesized according to the same reaction scheme as that in Example 5 except that the materials were changed in Example 5.

(A1-6)

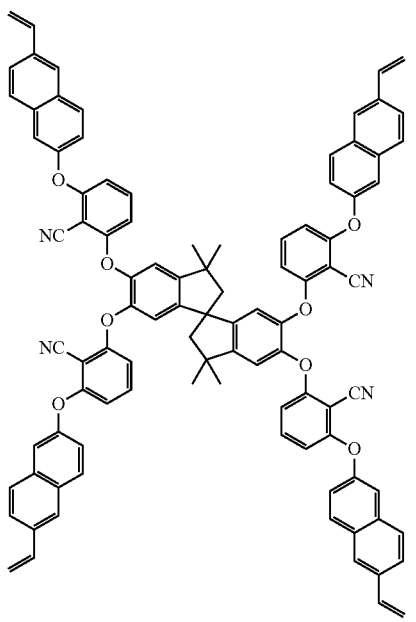

Example 9

Synthesis of Compound (A1-9)

Into a separable flask equipped with a thermometer, 15 parts by mass of the following compound (M-10) and 17 parts by mass of the compound (M-11), 2 parts by mass of sodium hydride as the basic compound, and 50 parts by mass of THF as the solvent were charged in a nitrogen atmosphere, and the reaction was carried out with stirring at 0° C. for 3 hrs to obtain a reaction mixture. A mixture of methanol and water was added to this reaction mixture to permit reprecipitation, and the resultant precipitates were dried to obtain the following compound (M-13). The resultant compound (M-13), 17 parts by mass of the following compound (M-12), 17 parts by mass of potassium carbonate as the basic compound, and 80 parts by mass of dimethylacetamide as the solvent were mixed, and the condensation reaction was carried out with stirring at 140° C. for 4 hrs to obtain a reaction mixture. After this reaction mixture was filtered, methanol was added to the reaction mixture to permit reprecipitation, and the resultant precipitates were dried to obtain 60 parts by mass of the following compound (A1-9).

Examples 10 to 13

Synthesis of Compounds (A1-10) to (A1-13)

The following compounds (A1-10) to (A1-13) were synthesized according to the same reaction scheme as that in Example 9 except that the materials were changed in Example 9.

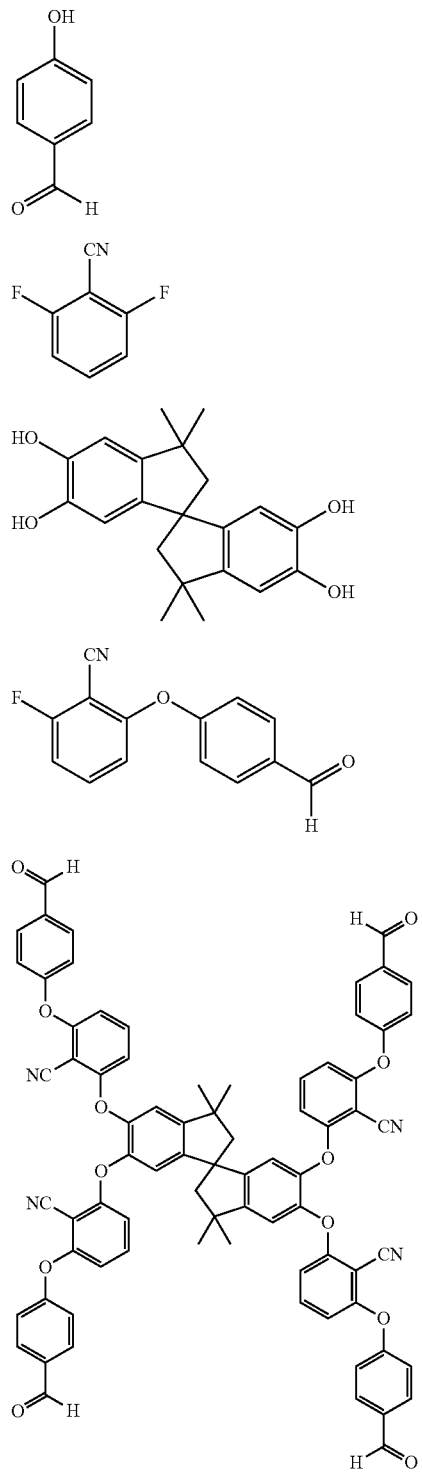

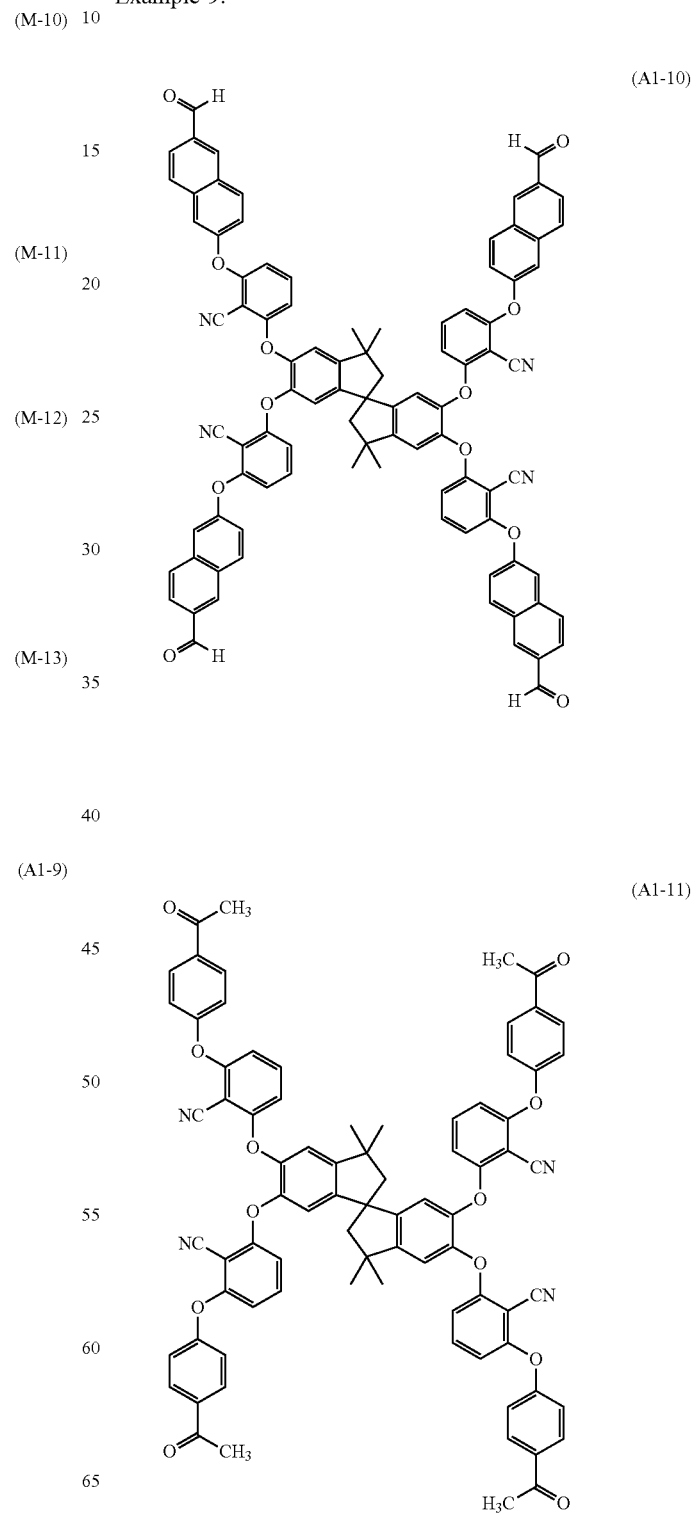

-continued (A1-12)

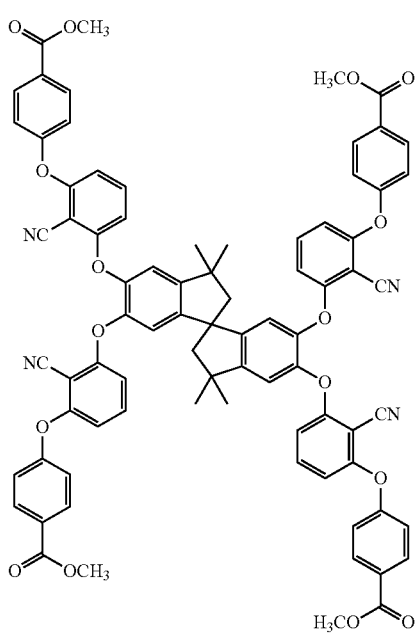

(A1-13)

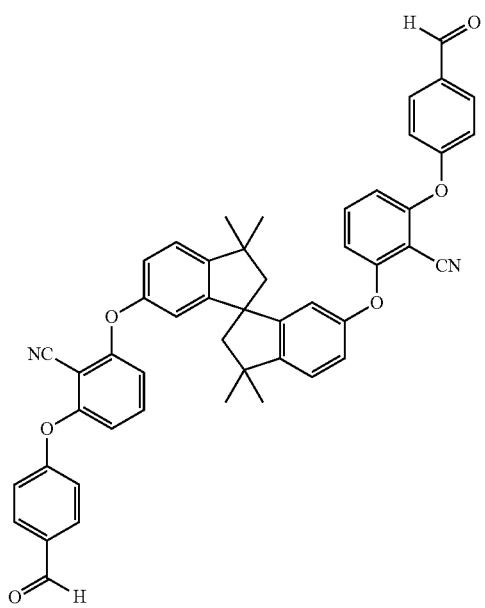

Example 14

Synthesis of Compound (A1-14)

Into a separable flask equipped with a thermometer, in a nitrogen atmosphere, 10 parts by mass of the compound (A1-9) synthesized above, 37 parts by mass of a methylmagnesium bromide solution in THF (concentration: 1 M) and 40 parts by mass of THF as the solvent were charged, and the reaction was carried out with stirring at 65° C. for 3 hrs to obtain a reaction mixture. Methanol was added to this reaction mixture to permit reprecipitation, and the resultant precipitates were dried to obtain the following compound (A1-14).

(A1-14)

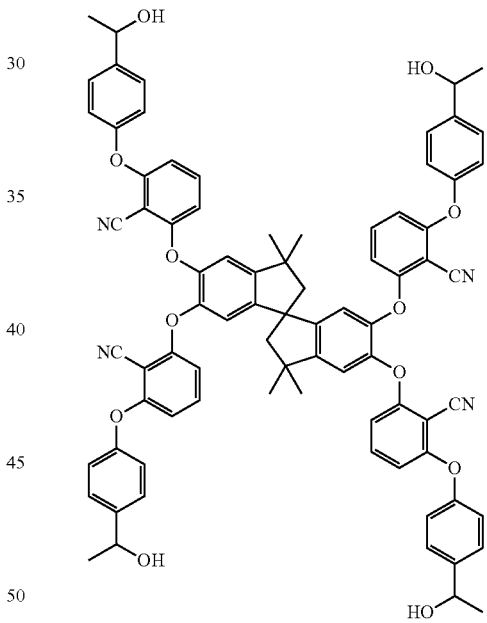

Examples 15 to 20

Synthesis of Compounds (A1-15) to (A1-20)

The following compounds (A1-15) to (A1-20) were synthesized according to the same reaction scheme as that in Example 14 except that the materials were changed in Example 14.

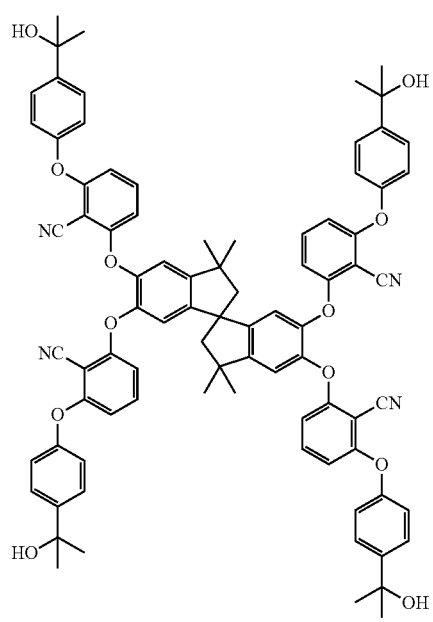
(A1-15)
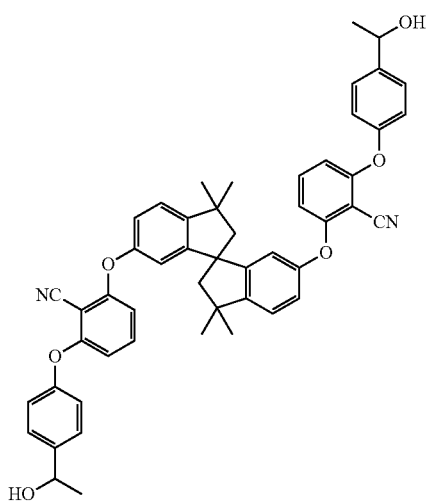
(A1-16)
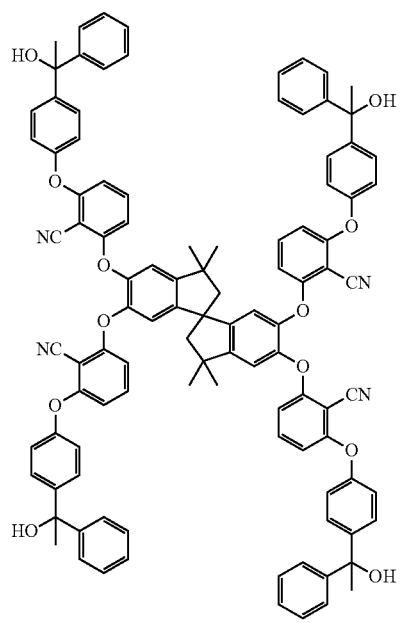
(A1-17)

(A1-18)

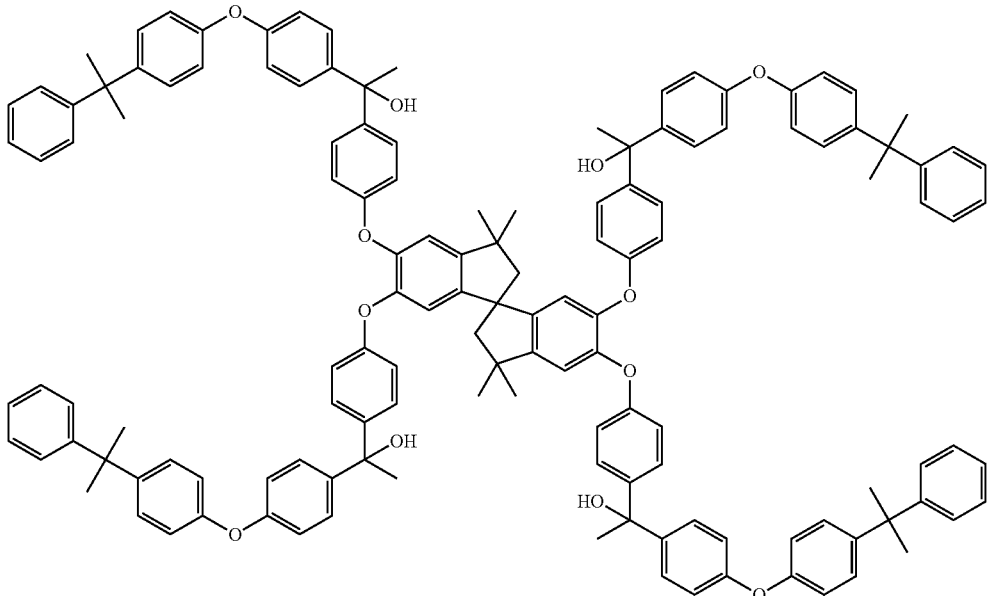

(A1-19) (A1-20)

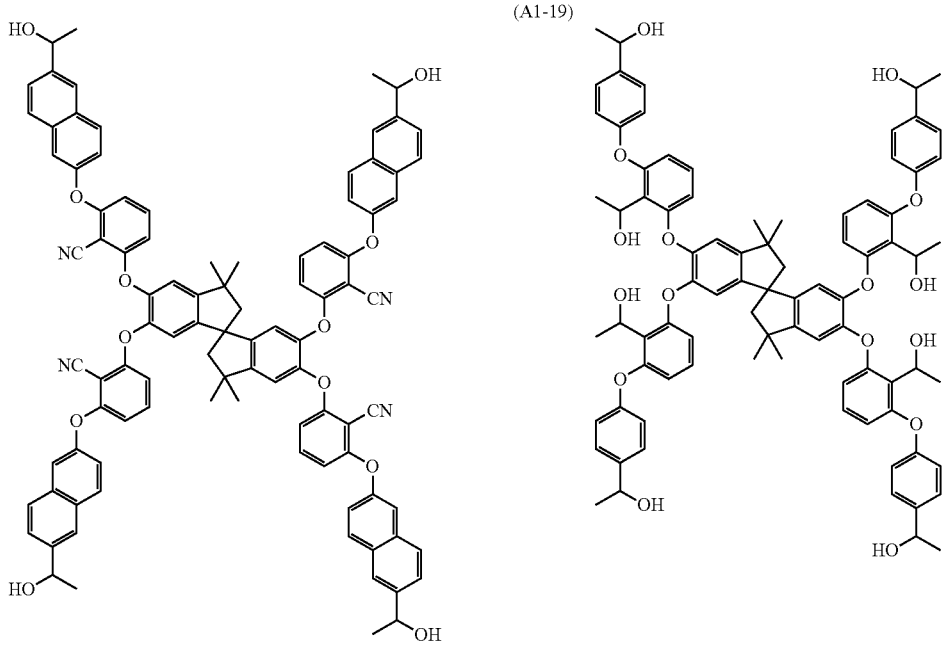

Example 21

Synthesis of Compound (A1-21)

Into a separable flask equipped with a thermometer, 15 parts by mass of the following compound (M-14), 16 parts by mass of propargyl bromide, 11 parts by mass of potassium carbonate as the basic compound, and 80 parts by mass of dimethylacetamide as the solvent were charged in a nitrogen atmosphere, and the reaction was carried out with stirring at 30° C. for 4 hrs to obtain a reaction mixture. A mixture of methanol and water was added to this reaction mixture to permit reprecipitation, and the resultant precipitates were dried to obtain the following compound (M-15). The resultant compound (M-15), 19 parts by mass of the following compound (M-16), 11 parts by mass of potassium carbonate as the basic compound, and 80 parts by mass of dimethylacetamide as the solvent were mixed, and the condensation reaction was carried out with stirring at 120° C. for 4 hrs to obtain a reaction mixture. After this reaction mixture was filtered, methanol was added thereto to permit reprecipitation, and the resultant precipitates were dried to obtain the following compound (M-17). The resultant compound (M-17), 10 parts by mass of the following compound (M-18), 11 parts by mass of potassium carbonate as the basic compound, and 80 parts by mass of dimethylacetamide as the solvent were mixed, and the condensation reaction was carried out with stirring at 140° C. for 4 hrs to obtain a reaction mixture. After this reaction mixture was filtered, methanol was added thereto to permit reprecipitation, and the resultant precipitates were dried to obtain 30 parts by mass of the following compound (A1-21).

(M-14)
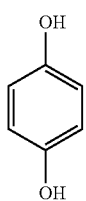
(M-18)
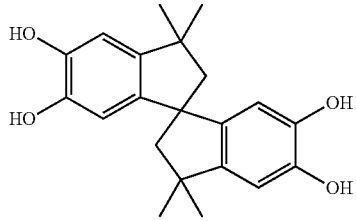
(M-15)
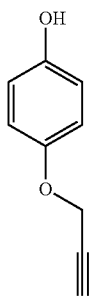
(A1-21)
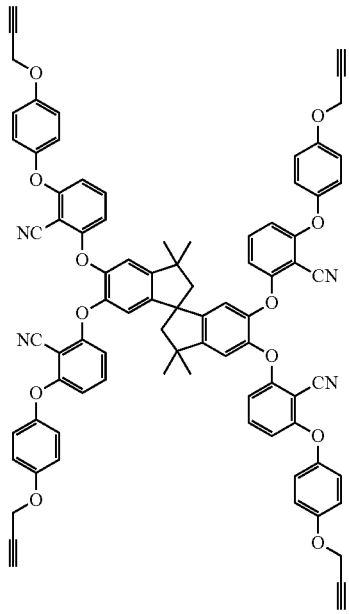
(M-16)
(M-17)
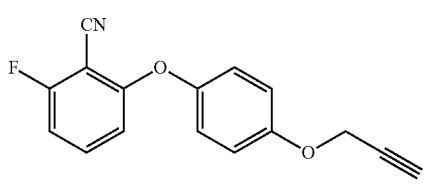
Examples 22 to 29
Synthesis of Compounds (A1-22) to (A1-29)
The following compound (A1-22) to (A1-29) were synthesized according to the same reaction scheme as that in Example 21 except that the materials were changed in Example 21.

(A1-22)
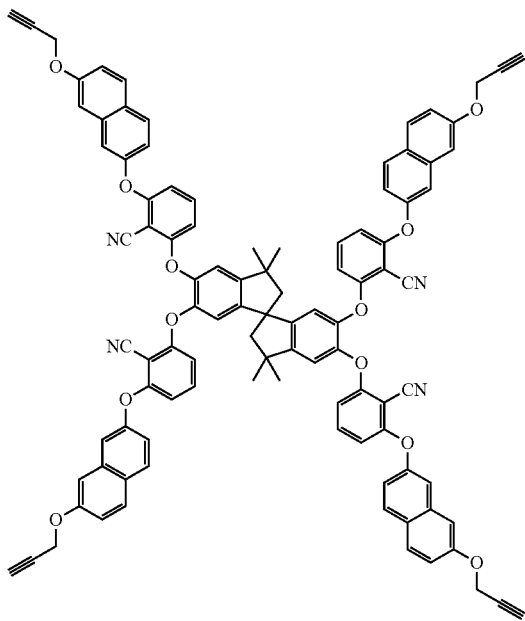
(A1-23)
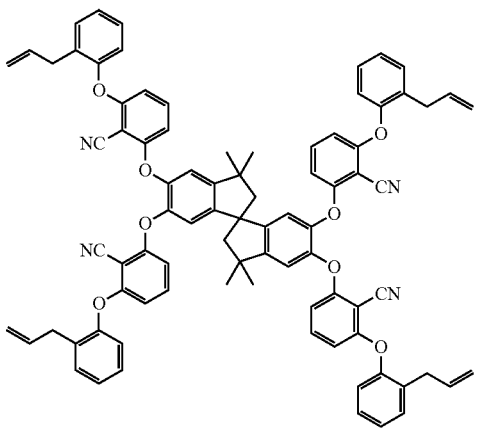
(A1-24)
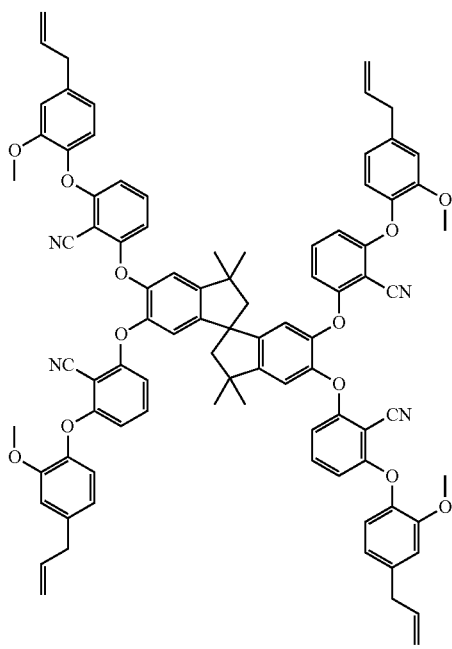

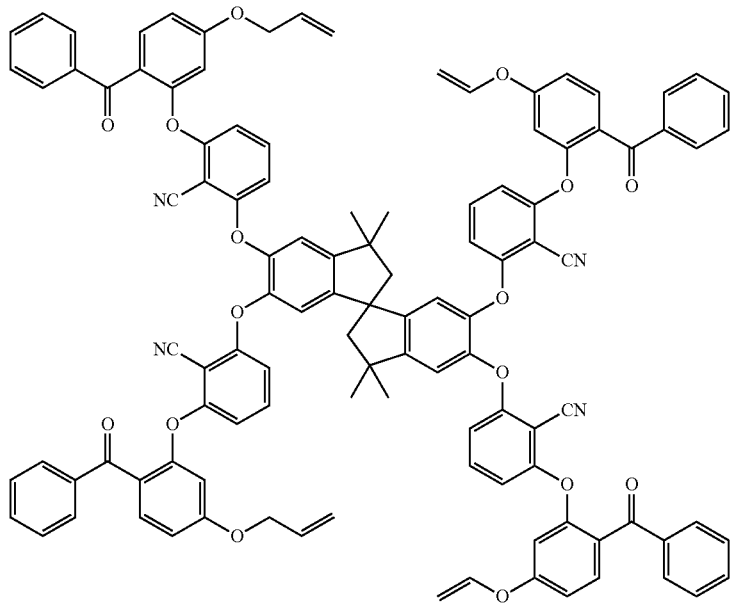
(A1-25)
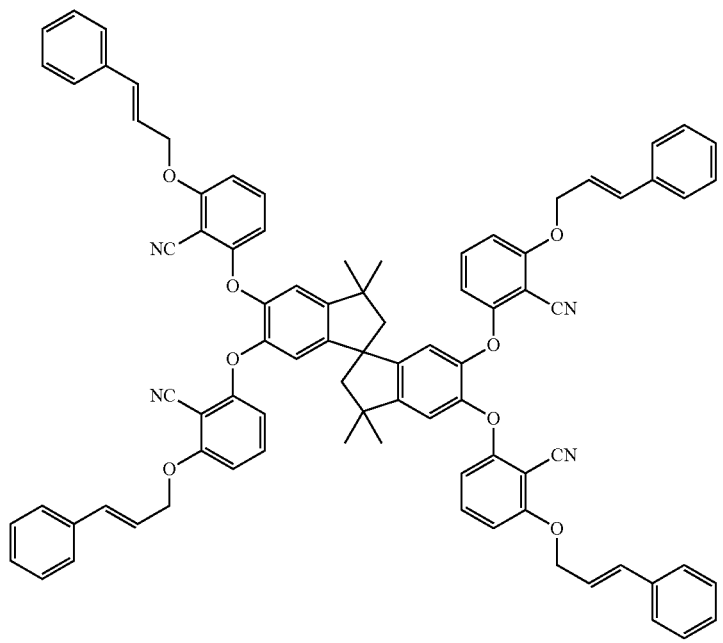
(A1-26)

(A1-27)
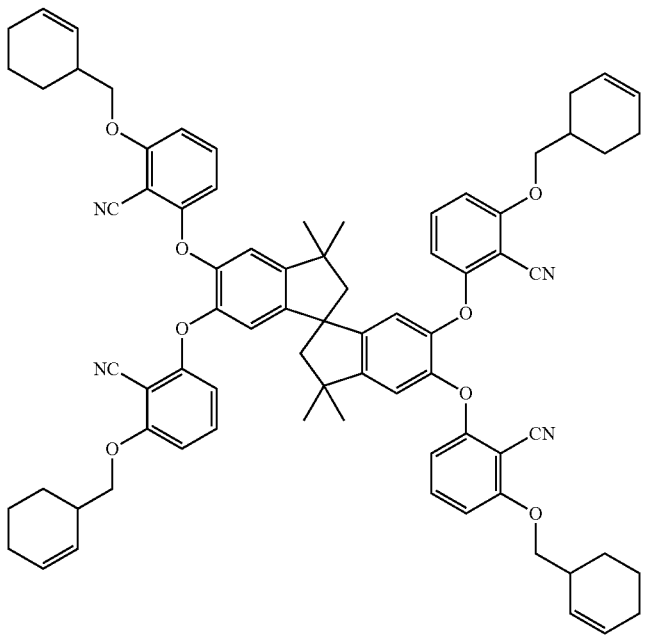
(A1-28)
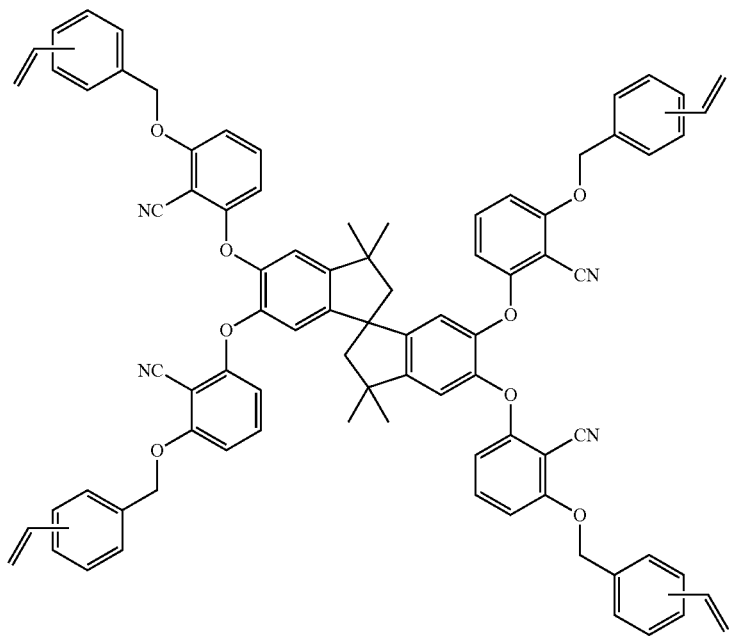

(A1-29)

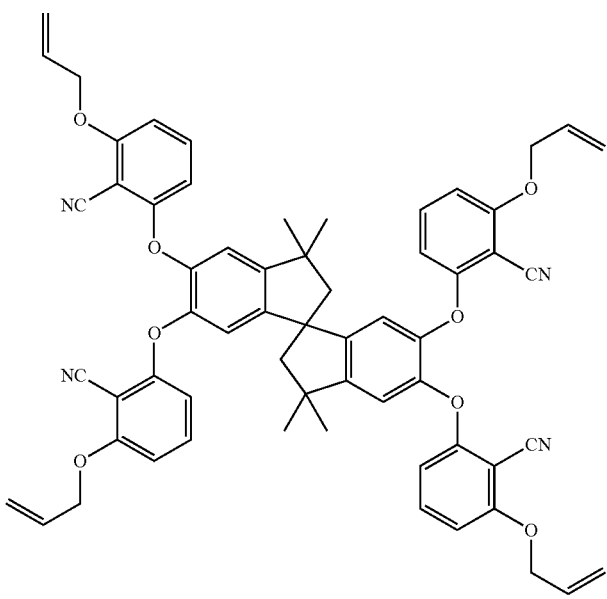

Example 30

Synthesis of Compound (A1-30)

The following compound (A1-30) was synthesized according to the same reaction scheme as that in Example 1 except that the materials were changed in Example 1.

(A1-30)

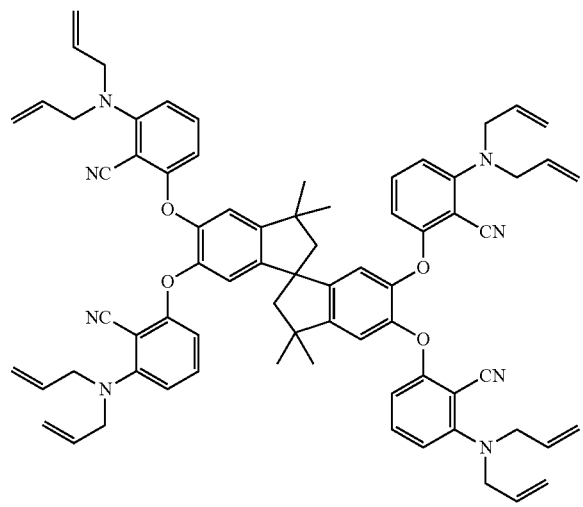

Synthesis of Polymer (A2)

Example 31

Synthesis of Polymer (A2-1)

Into a separable flask equipped with a thermometer, 15 parts by mass of the following compound (M-19) and 8 parts by mass of the following compound (M-20), 4 parts by mass of potassium carbonate as the basic compound, and 80 parts by mass of dimethylacetamide as the solvent were charged in a nitrogen atmosphere, and the condensation reaction was carried out with stirring at 140° C. for 4 hrs to obtain a reaction mixture. After this reaction mixture was filtered, methanol was added thereto to permit reprecipitation, and the resultant precipitates were dried to obtain a polymer having a structural unit represented by the following formula (M-21). The resultant polymer, 35 parts by mass of a methylmagnesium bromide solution in THF (concentration: 1 M), and 40 parts by mass of THF as the solvent were mixed, and the reaction was carried out with stirring at 65° C. for 3 hrs to obtain a reaction mixture. Methanol was added to this reaction mixture to permit reprecipitation, and the resultant precipitates were dried to obtain a polymer (A2-1) having a structural unit represented by the following formula (A2-1). The polymer (A2-1) had the Mw of 4,000.

(M-19)

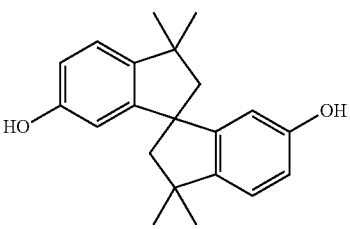

(M-20)

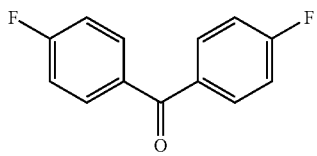

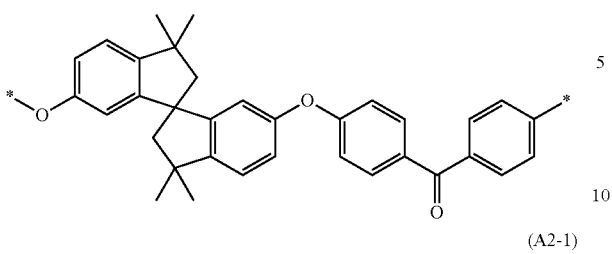

(M-21)

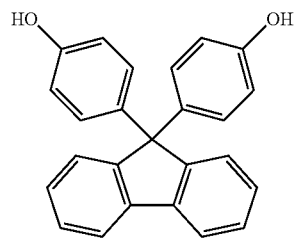

(M-22)

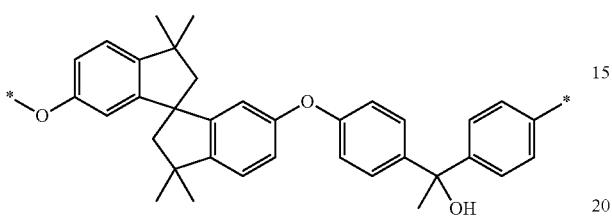

(A2-1)

(M-23)

Synthesis Example 1

Synthesis of Polymer (a2-1)

Into a separable flask equipped with a thermometer, 140 parts by mass of the following compound (M-22) and 100 parts by mass of the following compound (M-23), 140 parts by mass of potassium carbonate as the basic compound, and 500 parts by mass of dimethylacetamide as the solvent were charged in a nitrogen atmosphere, and the condensation polymerization reaction was carried out with stirring at 140° C. for 4 hrs to obtain a reaction mixture. After this reaction mixture was filtered, methanol was added thereto to permit reprecipitation, and the resultant precipitates were dried to obtain a polymer (a2-1) having a structural unit represented by the following formula (a-1). The polymer (a2-1) had the Mw of 4,000.

Synthesis Example 2

Synthesis of Polymer (a2-2)

Into a separable flask equipped with a thermometer, 100 parts by mass of 2,7-dihydroxynaphthalene, 30 parts by mass of formalin, 1 part by mass of p-toluenesulfonic acid, and 150 parts by mass of propylene glycol monomethyl ether as the solvent were charged in a nitrogen atmosphere, and the polymerization reaction was carried out with stirring at 80° C. for 6 hrs to obtain a reaction mixture. Then, the reaction mixture was diluted in 100 parts by mass of n-butyl acetate, and the resulting organic layer was washed with a large quantity of a mixture containing water and methanol at a mass ratio of 1:2. Thereafter, the solvent was distilled off to obtain a polymer (a2-2) having a structural unit represented by the following formula (a-2). The polymer (a2-2) had the Mw of 1,800.

(a-1)

(a-2)

Preparation of Compositions for Film Formation

Each component other than the component (A) used in the preparation of the compositions for film formation is shown below.

(B) Solvent

B-1: propylene glycol methyl ether acetate

B-2: cyclohexanone (C) Acid Generating Agent

C-1: bis(4-t-butylphenyl)iodonium nonafluoro-n-butane-sulfonate (a compound represented by the following formula (C-1))

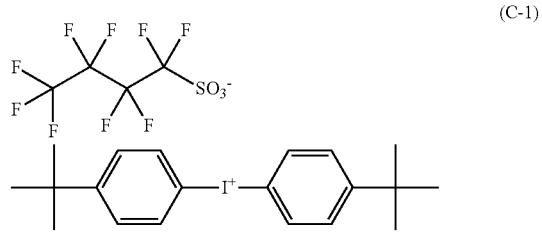

(C-1)

(D) Crosslinking Agent

D-1: "Nikalac N-2702" available from Sanwa Chemical Co., Ltd (a compound represented by the following formula (D-1))

D-2: 4,4'-(1-(4-(1-(4-hydroxy-3,5-bis(methoxymethyl)phenyl)-1-methylethyl)phenyl)ethylidene)bis(2,6-bis(methoxymethyl)phenol) (a compound represented by the following formula (D-2))

(D-1)

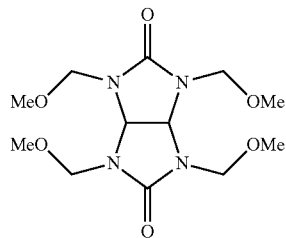

(D-2)

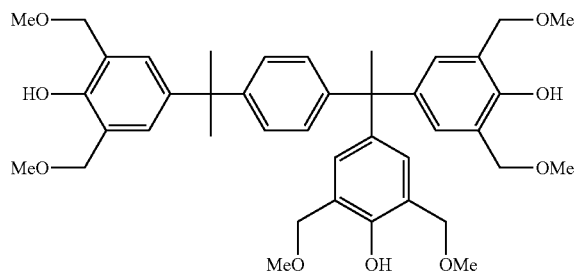

Example 32

Preparation of Composition for Film Formation (J-1)

A solution was obtained by mixing 10 parts by mass of (A1-1) as the compound (A) and 100 parts by mass of (B-1) as the solvent (B). Then, this solution was filtered through a membrane filter having a pore size of 0.1 µm to prepare a composition for film formation (J-1).

Examples 33 to 65, and Comparative Examples 1 and 2

Preparation of Compositions for Film Formation (J-2) to (J-34), and (CJ-1) and (CJ-2)

Each composition for film formation was prepared in a similar manner to Example 32 except that each component of the type and the amount shown in Table 1 below was used. It is to be noted that in Table 1, "—" indicates that the corresponding component was not used.

TABLE 1

|  | Composition for film formation | (A) Component type | amount (parts by mass) | (B) Solvent type | amount (parts by mass) | (C) Acid generating agent type | amount (parts by mass) | (D) Crosslinking agent type | amount (parts by mass) |
|---|---|---|---|---|---|---|---|---|---|
| Example 32 | J-1 | A1-1 | 10 | B-1 | 100 | — | — | — | — |
| Example 33 | J-2 | A1-2 | 10 | B-1 | 100 | — | — | — | — |
| Example 34 | J-3 | A1-3 | 10 | B-1 | 100 | — | — | — | — |
| Example 35 | J-4 | A1-4 | 10 | B-1 | 100 | — | — | — | — |
| Example 36 | J-5 | A1-5 | 10 | B-1 | 100 | — | — | — | — |
| Example 37 | J-6 | A1-6 | 10 | B-1 | 100 | — | — | — | — |
| Example 38 | J-7 | A1-7 | 10 | B-1 | 100 | — | — | — | — |
| Example 39 | J-8 | A1-8 | 10 | B-1 | 100 | — | — | — | — |
| Example 40 | J-9 | A1-9 | 10 | B-1 | 100 | — | — | — | — |
| Example 41 | J-10 | A1-10 | 10 | B-1 | 100 | — | — | — | — |
| Example 42 | J-11 | A1-11 | 10 | B-1 | 100 | — | — | — | — |
| Example 43 | J-12 | A1-12 | 10 | B-1 | 100 | — | — | — | — |
| Example 44 | J-13 | A1-13 | 10 | B-1 | 100 | — | — | — | — |
| Example 45 | J-14 | A1-14 | 10 | B-1 | 100 | — | — | — | — |
| Example 46 | J-15 | A1-15 | 10 | B-1 | 100 | — | — | — | — |
| Example 47 | J-16 | A1-16 | 10 | B-1 | 100 | — | — | — | — |
| Example 48 | J-17 | A1-17 | 10 | B-1 | 100 | — | — | — | — |
| Example 49 | J-18 | A1-18 | 10 | B-1 | 100 | — | — | — | — |
| Example 50 | J-19 | A1-19 | 10 | B-1 | 100 | — | — | — | — |
| Example 51 | J-20 | A1-20 | 10 | B-1 | 100 | — | — | — | — |
| Example 52 | J-21 | A1-21 | 10 | B-1 | 100 | — | — | — | — |
| Example 53 | J-22 | A1-22 | 10 | B-1 | 100 | — | — | — | — |
| Example 54 | J-23 | A2-1 | 10 | B-1 | 100 | — | — | — | — |
| Example 55 | J-24 | A1-1 | 10 | B-1 | 100 | C-1 | 0.5 | D-1 | 1 |
| Example 56 | J-25 | A1-1 | 10 | B-1 | 100 | C-1 | 0.5 | D-2 | 1 |
| Example 57 | J-26 | A1-1 | 10 | B-1 | 100 | — | — | — | — |
| Example 58 | J-27 | A1-23 | 10 | B-1 | 100 | — | — | — | — |
| Example 59 | J-28 | A1-24 | 10 | B-1 | 100 | — | — | — | — |
| Example 60 | J-29 | A1-25 | 10 | B-1 | 100 | — | — | — | — |
| Example 61 | J-30 | A1-26 | 10 | B-1 | 100 | — | — | — | — |
| Example 62 | J-31 | A1-27 | 10 | B-1 | 100 | — | — | — | — |
| Example 63 | J-32 | A1-28 | 10 | B-1 | 100 | — | — | — | — |
| Example 64 | J-33 | A1-29 | 10 | B-1 | 100 | — | — | — | — |
| Example 65 | J-34 | A1-30 | 10 | B-1 | 100 | — | — | — | — |
| Comparative Example 1 | CJ-1 | a2-1 | 10 | B-2 | 100 | — | — | — | — |
| Comparative Example 2 | CJ-2 | a2-2 | 10 | B-2 | 100 | — | — | — | — |

Evaluations

Using the composition for film formation obtained as described above, evaluations were made in regard to the items below according to the following methods. The results of the evaluations are shown in Table 2.

Solubility in PGMEA

By adding the composition for film formation obtained as described above to a PGMEA (propylene glycol monomethyl ether acetate) solvent, a solubility test was performed. The solubility in PGMEA was evaluated as being: "A" (favorable) in a case where dissolution in the solution without turbidity and/or precipitation was achieved; and "B" (unfavorable) in a case where the turbidity and/or precipitation was found in the solution.

Optical Characteristics (Refractive Index and Attenuation Coefficient)

The composition for film formation obtained as described above was spin-coated on the surface of a silicon wafer substrate having a diameter of 8 inches, and thereafter heated at 350° C. (however, at 400° C. in only Example 57) for 2 min to form a resist underlayer film having a thickness of 250 nm. Then, a refractive index and an attenuation coefficient at a wavelength of 193 nm of the resist underlayer film thus formed were measured using a spectroscopic ellipsometer ("M2000D", available from J. A. WOOLLAM Co.). The optical characteristics of the resist underlayer film can be evaluated as being favorable in a case where the refractive index falls within a range of no less than 1.3 and no greater than 1.6, and the attenuation coefficient falls within a range of no less than 0.2 and no greater than 0.8.

Etching Resistance

The composition for film formation obtained as described above was spin-coated on a silicon wafer having a diameter of 8 inches to provide a resist underlayer film having a thickness of 300 nm. Then, the resist underlayer film was subjected to an etching treatment under conditions involving: a pressure of 0.03 Torr; high frequency power of 3,000 W; Ar/$CF_4$ being 40/100 sccm; and a substrate temperature: of 20° C., and the thickness of the resist underlayer film after the etching treatment was measured. The etching rate (nm/min) was calculated from the relationship between the treatment time and a decrease of the thickness of the resist underlayer film after the etching treatment, and the proportion of the etching rate of the film according to Examples with respect to that of the film according to Comparative Example 2 was calculated. The smaller value indicates more favorable etching resistance.

Heat Resistance

The composition for film formation obtained as described above was spin-coated on a silicon wafer having a diameter of 8 inches to provide a resist underlayer film, and the film thickness of this resist underlayer film was measured using the spectroscopic ellipsometer (the value of the film thickness acquired in this measurement being designated as X). Next, the resist underlayer film was heated at 350° C. (however, at 400° C. in only Example 57) for 120 sec, and the thickness of the resist underlayer film after the heating was measured using the spectroscopic ellipsometer (the value of the film thickness acquired in this measurement being designated as Y). Then, a percent decrease of the thickness of the resist underlayer film after the heating with respect to the thickness of the film before the heating (100×(X−Y)/X) (%) was calculated, and the calculated value was defined as heat resistance. The smaller heat resistance value indicates that the film is more favorable (i.e., having superior heat resistance) as there are less sublimated matter and film degradation products generated during the heating of the resist underlayer film.

Flatness

The compositions for film formation obtained as described above were each applied on a $SiO_2$ stepped substrate on which trenches having a width of 42 nm, a pitch of 84 nm and a depth of 180 nm (aspect ratio: 4.3), trenches having a width of 100 nm, a pitch of 150 nm and a depth of 180 nm (aspect ratio: 1.8), and trenches having a width of 5 µm and a depth of 180 nm (open spaces; aspect ratio: 0.036) were provided in combination, with the ratio of the maximum value to the minimum value in aspect ratios different from each other being 119. Thereafter, baking was carried out at 250° C. for 60 sec (however, at 400° C. for 120 sec only in Example 57) under an ambient air atmosphere to form a resist underlayer film having a thickness of 200 nm. The shape of the resist underlayer film was observed using a scanning electron microscope ("S-4800" available from Hitachi High-Technologies Corporation), and the difference of the maximum value and the minimum value of the thickness of the resist underlayer film on the trenches or spaces (ΔFT) was determined. The flatness was evaluated as being: "A" (favorable) in a case where the ΔFT was less than 20 nm; and "B" (unfavorable) in a case where the ΔFT was no less than 20 nm.

TABLE 2

| | Composition for film formation | Solubility in PGMEA | Refractive index | Attenuation coefficient | Etching resistance | Heat resistance | Flatness |
|---|---|---|---|---|---|---|---|
| Example 32 | J-1 | A | 1.40 | 0.63 | 0.93 | 12 | A |
| Example 33 | J-2 | A | 1.42 | 0.60 | 0.92 | 11 | A |
| Example 34 | J-3 | A | 1.41 | 0.66 | 0.91 | 12 | A |
| Example 35 | J-4 | A | 1.42 | 0.67 | 0.92 | 13 | A |
| Example 36 | J-5 | A | 1.41 | 0.65 | 0.92 | 12 | A |
| Example 37 | J-6 | A | 1.40 | 0.50 | 0.90 | 11 | A |
| Example 38 | J-7 | A | 1.42 | 0.63 | 0.91 | 12 | A |
| Example 39 | J-8 | A | 1.40 | 0.63 | 0.92 | 13 | A |
| Example 40 | J-9 | A | 1.43 | 0.60 | 0.93 | 11 | A |
| Example 41 | J-10 | A | 1.41 | 0.55 | 0.90 | 10 | A |
| Example 42 | J-11 | A | 1.42 | 0.65 | 0.91 | 14 | A |
| Example 43 | J-12 | A | 1.38 | 0.62 | 0.94 | 15 | A |
| Example 44 | J-13 | A | 1.44 | 0.65 | 0.92 | 13 | A |
| Example 45 | J-14 | A | 1.40 | 0.62 | 0.91 | 12 | A |
| Example 46 | J-15 | A | 1.42 | 0.63 | 0.92 | 13 | A |
| Example 47 | J-16 | A | 1.44 | 0.65 | 0.93 | 14 | A |

TABLE 2-continued

| | Composition for film formation | Solubility in PGMEA | Refractive index | Attenuation coefficient | Etching resistance | Heat resistance | Flatness |
|---|---|---|---|---|---|---|---|
| Example 48 | J-17 | A | 1.40 | 0.70 | 0.92 | 13 | A |
| Example 49 | J-18 | A | 1.41 | 0.75 | 0.90 | 12 | A |
| Example 50 | J-19 | A | 1.38 | 0.56 | 0.89 | 12 | A |
| Example 51 | J-20 | A | 1.43 | 0.60 | 0.93 | 13 | A |
| Example 52 | J-21 | A | 1.42 | 0.65 | 0.91 | 11 | A |
| Example 53 | J-22 | A | 1.40 | 0.54 | 0.89 | 12 | A |
| Example 54 | J-23 | A | 1.40 | 0.64 | 0.90 | 10 | A |
| Example 55 | J-24 | A | 1.42 | 0.61 | 0.93 | 11 | A |
| Example 56 | J-25 | A | 1.41 | 0.65 | 0.92 | 12 | A |
| Example 57 | J-26 | A | 1.42 | 0.61 | 0.92 | 10 | A |
| Example 58 | J-27 | A | 1.35 | 0.54 | 0.92 | 11 | A |
| Example 59 | J-28 | A | 1.34 | 0.55 | 0.92 | 11 | A |
| Example 60 | J-29 | A | 1.47 | 0.56 | 0.93 | 11 | A |
| Example 61 | J-30 | A | 1.40 | 0.61 | 0.92 | 13 | A |
| Example 62 | J-31 | A | 1.37 | 0.49 | 0.90 | 15 | A |
| Example 63 | J-32 | A | 1.40 | 0.62 | 0.92 | 13 | A |
| Example 64 | J-33 | A | 1.37 | 0.44 | 0.92 | 12 | A |
| Example 65 | J-34 | A | 1.37 | 0.44 | 0.91 | 12 | A |
| Comparative Example 1 | CJ-1 | B | 1.40 | 0.71 | 0.92 | 12 | B |
| Comparative Example 2 | CJ-2 | B | 1.40 | 0.40 | 1 | 20 | B |

As is clear from Table 2, according to the compositions for film formation of Examples, use of PGMEA as a solvent was enabled, and the formed resist underlayer film had satisfactory characteristics on the refractive index, the attenuation coefficient and the etching resistance, and as compared with the resist underlayer films formed from the compositions for film formation of Comparative Examples, had superior heat resistance and superior flatness.

INDUSTRIAL APPLICABILITY

The composition for film formation according to the present invention is capable of forming a film having superior solubility in a solvent such as PGMEA, and having superior heat resistance and flatness while general characteristics such as etching resistance are satisfactory since the composition contains a compound having a given partial structure and a given intermolecular bond-forming group. The film is superior in heat resistance and flatness. The method for producing a patterned substrate enables a resist underlayer film that is superior in heat resistance and flatness to be readily formed, and enables a substrate to have a favorable pattern formed using the resist underlayer film having such superior characteristics. The compound can be suitably used as a component of the composition for film formation. Therefore, these can be suitably used for manufacture of semiconductor devices and the like in which further progress of miniaturization is expected in the future.

What is claimed is:

1. A method for producing a patterned substrate, comprising:
applying a composition on an upper face side of a substrate to form a resist underlayer film;
forming a resist pattern directly or indirectly on the resist underlayer film; and
etching the substrate using the resist pattern as a mask such that the substrate has a pattern,
wherein the composition comprises:
a compound represented by formula (2); and
a solvent:

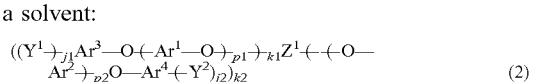

(2)

wherein, in the formula (2), $Z^1$ is a partial structure represented by formula (1); k1 and k2 are each independently an integer of 0 to 8, wherein a sum of k1 and k2 is no less than 1; $Ar^1$ and $Ar^2$ each independently represent a substituted or unsubstituted arenediyl group having 6 to 20 carbon atoms; p1 and p2 are each independently an integer of 0 to 3; $Ar^3$ represents a group obtained by removing (j1+1) hydrogen atoms from an aromatic ring of a substituted or unsubstituted arene having 6 to 20 carbon atoms; $Ar^4$ represents a group obtained by removing (j2+1) hydrogen atoms from an aromatic ring of a substituted or unsubstituted arene having 6 to 20 carbon atoms; j1 and j2 are each independently an integer of 1 to 9; $Y^1$ and $Y^2$ each independently represent a monovalent intermolecular bond-forming group having 1 to 20 carbon atoms, wherein in a case where $Ar^1$ to $Ar^4$, $Y^1$, $Y^2$, p1, p2, j1 and j2 are present in a plurality of number, a plurality of $Ar^1$s are identical or different, a plurality of $Ar^2$s are identical or different, a plurality of $Ar^3$s are identical or different, a plurality of $Ar^4$s are identical or different, a plurality of $Y^1$s are identical or different, a plurality of $Y^2$s are identical or different, a plurality of p1s are identical or different, a plurality of p2s are identical or different, a plurality of j1s are identical or different, and a plurality of j2s are identical or different,

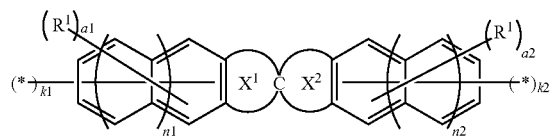

(1)

wherein, in the formula (1), $X^1$ and $X^2$ each independently represent a substituted or unsubstituted ring structure having 4 to 10 ring atoms constituted taken together with a spiro carbon atom and carbon atoms of an aromatic ring; $R^1$ and $R^2$ each independently represent a halogen atom, a hydroxy group, a nitro group or a monovalent organic group; a1 and a2 are each independently an integer of 0 to 8, wherein in a case where $R^1$ and $R^2$ are each present in a plurality of number, a plurality of $R^1$s are each identical or different, and a plurality of $R^2$s are each identical or different; n1 and n2 are each independently an integer of 0 to 2; k1 and k2 are each as defined in the formula (2), and a sum of a1 and k1, and a sum of a2 and k2 are no greater than 8; and * denotes a binding site to a moiety other than the partial structure, and wherein the monovalent intermolecular bond-forming group represented by $Y^1$ or $Y^2$ is a group comprising a carbon-carbon double bond-containing group, a group comprising a carbon-carbon triple bond-containing group, a hydroxy chain hydrocarbon group, an acyl group, a carbonyloxy hydrocarbon group or a combination thereof.

2. The method according to claim 1, wherein a molecular weight of the compound is no less than 300 and no greater than 3,000.

3. The method according to claim 1, wherein the solvent comprises a polyhydric alcohol partial ether acetate solvent, a ketone solvent, a carboxylic acid ester solvent or a combination thereof.

4. The method according to claim 1, wherein the sum of k1 and k2 in the formula (1) is an integer of 2 or 4.

5. The method according to claim 1, wherein in the formula (2), p1 and p2 are each independently an integer of 1 or 2.

6. The method according to claim 1, wherein in the formula (2), p1 and p2 are each an integer of 1.

7. The method according to claim 6, wherein in the formula (2), each of $Ar^1$ and $Ar^2$ is substituted with a cyano group.

8. The method according to claim 1, wherein in the formula (2), at least one of $Ar^1$, $Ar^2$, $Ar^3$, and $Ar^4$ is substituted with a fluorine atom, a chlorine atom, a bromine atom, an iodine atom, a hydroxy group, an amino group, a cyano group, a nitro group, an alkoxy group, an alkoxycarbonyl group, an alkoxycarbonyloxy group, an acyl group, an arylaminocarbonyl group, or an arylamino group.

9. The method according to claim 1, wherein in the formula (2), at least one of $Ar^1$, $Ar^2$, $Ar^3$, and $Ar^4$ is substituted with a cyano group.

10. The method according to claim 1, wherein the monovalent intermolecular bond-forming group represented by $Y^1$ or $Y^2$ is a group comprising a carbon-carbon double bond-containing group, a group comprising a carbon-carbon triple bond-containing group.

11. The method according to claim 1, wherein the monovalent intermolecular bond-forming group represented by $Y^1$ or $Y^2$ is a substituted or unsubstituted ethynyl group, a substituted or unsubstituted propargyl group, a (meth)acryloyl group, an allyl group, an allyloxy group, a phenylallyloxy group, a cyclohexenylmethoxy group, a styrylmethoxy group, a group represented by formula (3-1), a group represented by formula (3-2) or a group represented by formula (3-3):

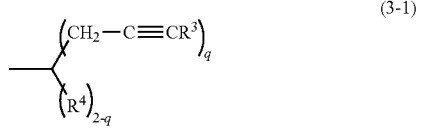

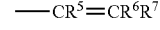

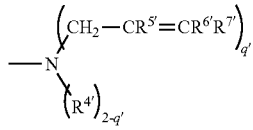

wherein:
in the formula (3-1), $R^3$ and $R^4$ each independently represent a hydrogen atom or a monovalent hydrocarbon group having 1 to 20 carbon atoms; and q is 1 or 2, wherein in a case where q is 2, a plurality of $R^3$s are each identical or different with each other;
in the formula (3-2), $R^5$, $R^6$ and $R^7$ each independently represent a hydrogen atom or a monovalent hydrocarbon group having 1 to 20 carbon atoms; and
in the formula (3-3), $R^{4'}$, $R^{5'}$, $R^{6'}$ and $R^{7'}$ each independently represent a hydrogen atom or a monovalent hydrocarbon group having 1 to 20 carbon atoms; and q' is 1 or 2, wherein in a case where q' is 2, a plurality of $R^{5'}$s, $R^{6'}$s and $R^{7'}$s are each identical or different with each other.

12. The method according to claim 1, wherein the monovalent intermolecular bond-forming group represented by $Y^1$ or $Y^2$ is a group represented by formula (3-1), a group represented by formula (3-2) or a group represented by formula (3-3):

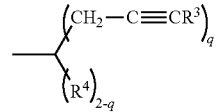

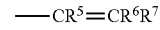

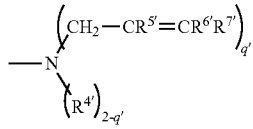

wherein:
in the formula (3-1), $R^3$ and $R^4$ each independently represent a hydrogen atom or a monovalent hydrocarbon group having 1 to 20 carbon atoms; and q is 1 or 2, wherein in a case where q is 2, a plurality of $R^3$s are each identical or different with each other;
in the formula (3-2), $R^5$, $R^6$ and $R^7$ each independently represent a hydrogen atom or a monovalent hydrocarbon group having 1 to 20 carbon atoms; and
in the formula (3-3), $R^{4'}$, $R^{5'}$, $R^{6'}$ and $R^{7'}$ each independently represent a hydrogen atom or a monovalent hydrocarbon group having 1 to 20 carbon atoms; and q' is 1 or 2, wherein in a case where q' is 2, a plurality of $R^{5'}$s, $R^{6'}$s and $R^{7'}$s are each identical or different with each other.

13. The method according to claim 1, wherein the composition further comprises an acid generating agent.

14. The method according to claim 1, wherein the composition further comprises a crosslinking agent.

* * * * *